US010943919B2

(12) United States Patent
Kobayashi et al.

(10) Patent No.: US 10,943,919 B2
(45) Date of Patent: Mar. 9, 2021

(54) SEMICONDUCTOR STORAGE DEVICE

(71) Applicant: TOSHIBA MEMORY CORPORATION, Tokyo (JP)

(72) Inventors: Shigeki Kobayashi, Kuwana Mie (JP); Taro Shiokawa, Nagoya Aichi (JP); Masahisa Sonoda, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 38 days.

(21) Appl. No.: 16/530,221

(22) Filed: Aug. 2, 2019

(65) Prior Publication Data

US 2020/0303402 A1 Sep. 24, 2020

(30) Foreign Application Priority Data

Mar. 20, 2019 (JP) ............................. JP2019-053449

(51) Int. Cl.
| | | |
|---|---|---|
| *H01L 27/11582* | (2017.01) | |
| *G11C 5/06* | (2006.01) | |
| *H01L 27/11524* | (2017.01) | |
| *H01L 27/11565* | (2017.01) | |
| *H01L 27/1157* | (2017.01) | |
| *H01L 27/11519* | (2017.01) | |
| *H01L 27/11556* | (2017.01) | |

(52) U.S. Cl.
CPC ........ *H01L 27/11582* (2013.01); *G11C 5/063* (2013.01); *H01L 27/1157* (2013.01); *H01L 27/11519* (2013.01); *H01L 27/11524* (2013.01); *H01L 27/11556* (2013.01); *H01L 27/11565* (2013.01)

(58) Field of Classification Search
CPC ......... H01L 27/11582; H01L 27/11524; H01L 27/11565; H01L 27/1157; H01L 27/11519; H01L 27/11556; H01L 27/11575; G11C 5/063
See application file for complete search history.

(56) References Cited

U.S. PATENT DOCUMENTS

| | | | |
|---|---|---|---|
| 9,343,358 B1 * | 5/2016 | Xu | ................... H01L 27/11524 |
| 10,020,319 B2 | 7/2018 | Baba | |

(Continued)

FOREIGN PATENT DOCUMENTS

JP 2011-060958 A 3/2011

*Primary Examiner* — Karen Kusumakar
(74) *Attorney, Agent, or Firm* — Foley & Lardner LLP

(57) ABSTRACT

A semiconductor memory device includes a plurality of first conductor layers that are stacked in a first direction; a first pillar including a first semiconductor layer and extending through the first conductor layers in the first direction; a first charge storage layer that is provided between the first conductor layers and the first semiconductor layer; a plurality of second conductor layers that are stacked in the first direction above an uppermost conductor layer of the first conductor layers; a second pillar including a second semiconductor layer and extending through the second conductor layers in the first direction, the second semiconductor layer electrically connected to the first semiconductor layer; and a conductor pillar or film extending in the first direction through the second conductor layers other than a lowermost layer of the second conductor layers and being in contact with a respective upper surface of each of the second conductor layers.

20 Claims, 42 Drawing Sheets

(56) References Cited

U.S. PATENT DOCUMENTS

2010/0013049 A1     1/2010   Tanaka
2016/0079185 A1*   3/2016   Kato .................. H01L 23/5226
                                                                    257/314

\* cited by examiner

SEMICONDUCTOR STORAGE DEVICE

CROSS-REFERENCE TO RELATED APPLICATION(S)

This application claims the benefit of and priority to Japanese Patent Application No. 2019-053449, filed Mar. 20, 2019, the entire contents of which are incorporated herein by reference.

FIELD

Embodiments described herein relate generally to a semiconductor storage device.

BACKGROUND

Some comparative devices include a semiconductor storage device capable of storing data in a nonvolatile manner, such as a NAND flash memory. In such a semiconductor storage device, a three-dimensional memory structure may be adopted for high integration and large capacity. A structure for leading out a contact connected to a stacked wiring layer in this three-dimensional memory structure can be implemented.

DETAILED DESCRIPTION

Figure 1:
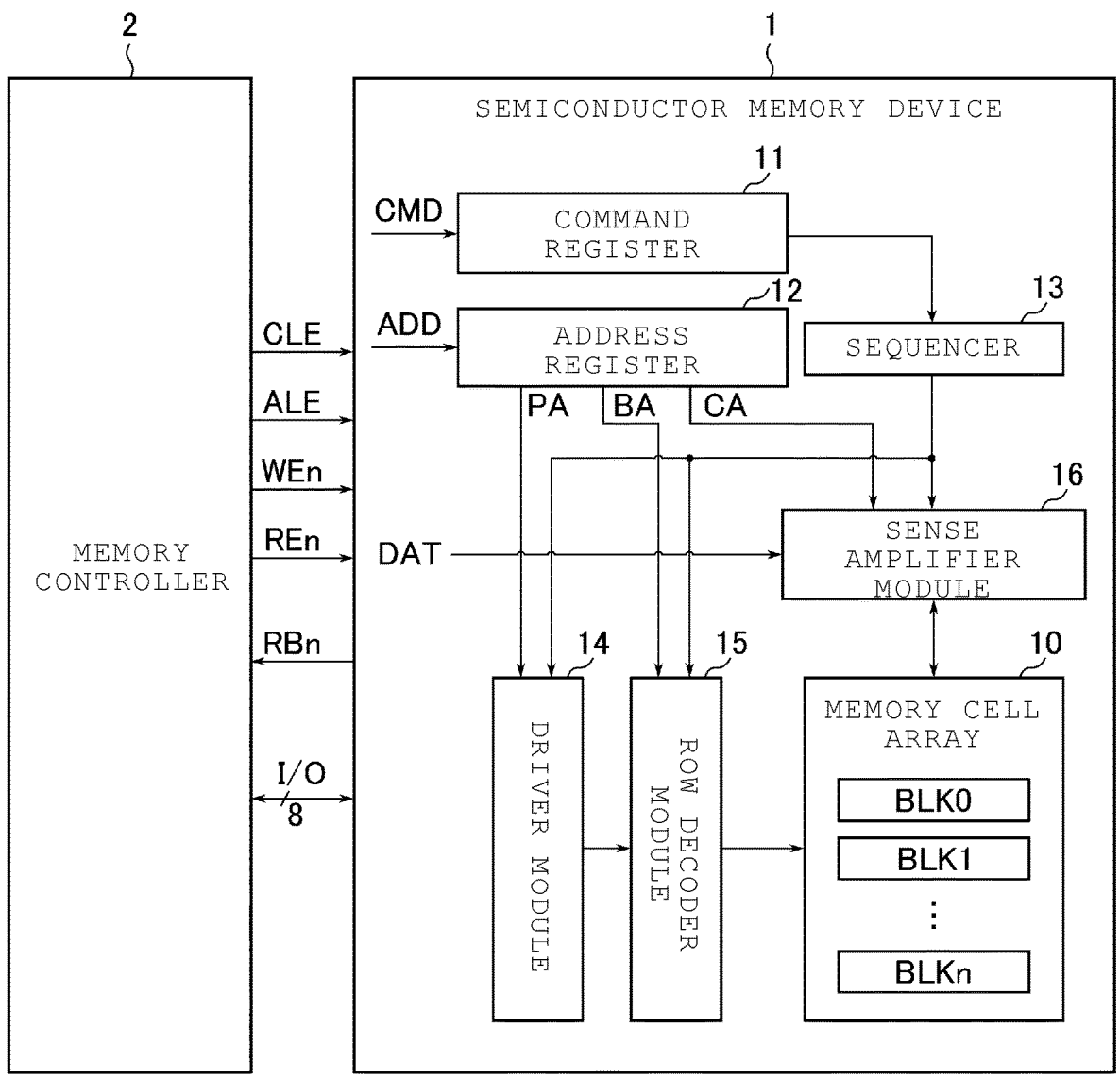
FIG. 1 is a block diagram illustrating an overall configuration of a memory system including a semiconductor storage device according to a first embodiment.

Embodiments described herein provide for semiconductor storage devices capable of improved connection between a select gate line and a contact.

In general, according to one embodiment, a semiconductor memory device includes a plurality of first conductor layers that are stacked in a first direction; a first pillar including a first semiconductor layer and extending through the first conductor layers in the first direction; a first charge storage layer that is provided between the first conductor layers and the first semiconductor layer; a plurality of second conductor layers that are stacked in the first direction above an uppermost conductor layer of the first conductor layers; a second pillar including a second semiconductor layer and extending through the second conductor layers in the first direction, the second semiconductor layer electrically connected to the first semiconductor layer; and a conductor pillar or film extending in the first direction through the second conductor layers other than a lowermost layer of the second conductor layers and being in contact with a respective upper surface of each of the second conductor layers.

Hereinafter, embodiments will be described with reference to the drawings. The description includes an example of a device or a method for practicing the technical aspects of the embodiments. The drawings are schematic or conceptual, and a dimension, a ratio, and the like of each of the drawings are not necessarily the same as the actual ones. The technical aspects of the present disclosure are not necessarily limited to a disclosed shape, a structure, an arrangement, and the like of a component.

In the following description, components having substantially the same functions and configurations are represented by the same reference numerals. A number attached to characters constituting a reference numeral is referred to by a reference numeral including the same characters and is used to distinguish between elements having the same configuration. When it is not necessary to distinguish between elements represented by reference numerals including the same characters, these elements are referred to by reference numerals consisting of only the characters.

In addition, in the following description, "diameter" of a layer refers to an average outer diameter of the layer in a cross-section parallel to a stacked surface of the layer. "Center" of a cross-section of a layer refers to the center of gravity of the cross-section.

1. First Embodiment

A semiconductor storage device according to a first embodiment will be described.

1.1. Configuration

First, a configuration of the semiconductor storage device according to the first embodiment will be described.

1.1.1 Semiconductor Storage Device

FIG. 1 is a block diagram illustrating the configuration of the semiconductor storage device according to the first embodiment. The semiconductor storage device 1 according to the first embodiment is a NAND flash memory capable of storing data in a nonvolatile manner and is controlled by an external memory controller 2. Communication between the semiconductor storage device 1 and the memory controller 2 supports, for example, NAND interface standards.

As illustrated in FIG. 1, the semiconductor storage device 1 includes, for example, a memory cell array 10, a command register 11, an address register 12, a sequencer 13, a driver module 14, a row decoder module 15, and a sense amplifier module 16.

The memory cell array 10 includes a plurality of blocks BLK0 to BLKn (n represents an integer of 1 or more). The block BLK is an aggregation of a plurality of memory cells capable of storing data in a nonvolatile manner and is used, for example, as a unit of data erasure. In the memory cell array 10, a plurality of bit lines and a plurality of word lines are provided. Each of the memory cells is associated with, for example, one bit line and one word line. A detailed configuration of the memory cell array 10 will be described below.

The command register 11 stores a command CMD that is received from the memory controller 2 by the semiconductor storage device 1. The command CMD includes, for example, a command that causes the sequencer 13 to execute a read operation, a write operation, an erasing operation, and the like.

The address register 12 stores address information ADD that is received from the memory controller 2 by the semiconductor storage device 1. The address information ADD includes, for example, a block address BA, a page address PA, and a column address CA. For example, the block address BA, the page address PA, and the column address CA are used for selection of the block BLK, the word line, and the bit line.

The sequencer 13 controls an overall operation of the semiconductor storage device 1. For example, the sequencer 13 controls the driver module 14, the row decoder module 15, the sense amplifier module 16, and the like to execute a read operation, a write operation, an erasing operation, and the like based on the command CMD stored in the command register 11.

The driver module 14 generates a voltage used for the read operation, the write operation, the erasing operation, or the like. The driver module 14 applies the generated voltage to a signal line corresponding to the selected word line based on, for example, the page address PA stored in the address register 12.

The row decoder module 15 selects one block BLK in the corresponding memory cell array 10 based on the block address BA stored in the address register 12. The row decoder module 15 transfers, for example, the voltage applied to the signal line corresponding to the selected word line to the selected word line in the selected block BLK.

In the write operation, the sense amplifier module 16 applies a desired voltage to each of the bit lines according to write data DAT received from the memory controller 2. In the read operation, the sense amplifier module 16 determines data stored in the memory cell based on the voltage of the bit line and transfers the determination result to the memory controller 2 as read data DAT.

A combination of the semiconductor storage device 1 and the memory controller 2 described above may configure at least a portion of one semiconductor device. Examples of the semiconductor device include a memory card such as a SD™ card and an SSD (solid state drive).

1.1.2. Circuit Configuration of Memory Cell Array

Figure 2:
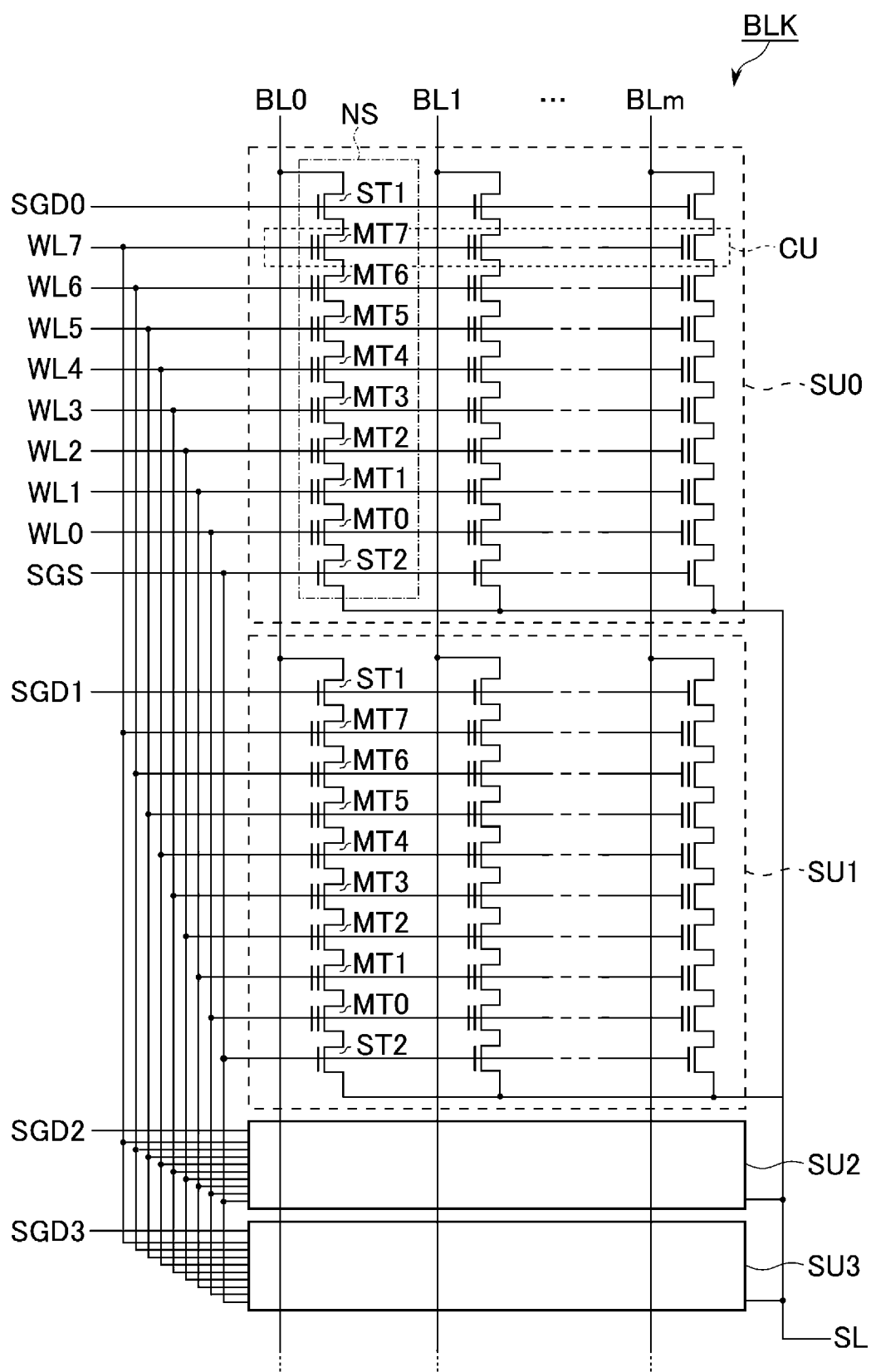
FIG. 2 is a circuit configuration diagram illustrating a portion of a memory cell array of the semiconductor storage device according to the first embodiment.

FIG. 2 is a circuit diagram illustrating a configuration of the memory cell array of the semiconductor storage device according to the first embodiment. FIG. 2 illustrates one block BLK among the blocks BLK in the memory cell array 10.

As illustrated in FIG. 2, the block BLK includes, for example, four string units SU0 to SU3. Each of the string units SU includes a plurality of NAND strings NS that are associated with bit lines BL0 to BLm (m represents an integer of 1 or more), respectively. Each of the NAND strings NS includes memory cell transistors MT0 to MT7 and select transistors ST1 and ST2. The memory cell transistor MT includes a control gate and a charge storage layer and stores data in a nonvolatile manner. Each of the select transistors ST1 and ST2 is used for selection of the string unit SU in various operations.

In each of the NAND strings NS, the memory cell transistors MT0 to MT7 are connected in series to each other. A drain of the select transistor ST1 is connected to the associated bit line BL, and a source of the select transistor ST1 is connected to one end of the memory cell transistors MT0 to MT7 that are connected in series to each other. A drain of the select transistor ST2 is connected to another end of the memory cell transistors MT0 to MT7 that are connected in series to each other. A source of the select transistor ST2 is connected to a source line SL.

Control gates of the memory cell transistors MT0 to MT7 in the same block BLK are connected in common to word lines WL0 to WL7, respectively. Gates of the select transistors ST1 in the string units SU0 to SU3 are connected in common to select gate lines SGD0 to SGD3. Gates of the select transistors ST2 are connected in common to a select gate line SGS.

In the circuit configuration of the memory cell array 10 described above, the bit line BL is shared by the NAND strings NS to which the same column address is assigned in the respective string units SU. The source line SL is shared between, for example, a plurality of blocks BLK.

An assembly including a plurality of memory cell transistors MT that are connected to the common word line WL in one string unit SU will be referred to as, for example, "cell unit CU". For example, the storage capacity of the cell unit CU including the memory cell transistors MT each of which stores 1-bit data is defined as "1-page data". The cell unit Cu may include a storage capacity of 2-page data or more according to the number of bits in data stored in the memory cell transistor MT.

The circuit configuration of the memory cell array 10 in the semiconductor storage device 1 according to the first embodiment is not limited to the above-described configuration. For example, the numbers of the memory cell transistors MT1 and the select transistors ST1 and ST2 in each of the NAND strings NS may be designed to any appropriate numbers, respectively. The number of the string units SU in each block BLK may be any appropriate number.

1.1.3 Structure of Memory Cell Array

Hereinafter, an example of the structure of the memory cell array of the semiconductor storage device according to the first embodiment will be described.

In the drawings that will be referred to below, an X-axis corresponds to an extending direction of the word lines WL. A Y-axis corresponds to an extending direction of the bit line BL. A Z-axis corresponds to a direction perpendicular to a surface of a semiconductor substrate on which the semiconductor storage device 1 is to be formed. In order to easily understand a plan view, the drawing is appropriately hatched. A hatched area in the plan view does not necessarily relate to a material or characteristics of a hatched component. In a cross-sectional view, a component such as an insulator layer (interlayer insulating film), a wiring, or a contact may be omitted from the illustrations in order to better explain the drawing.

1.1.3.1 Planar Layout

Figure 3:
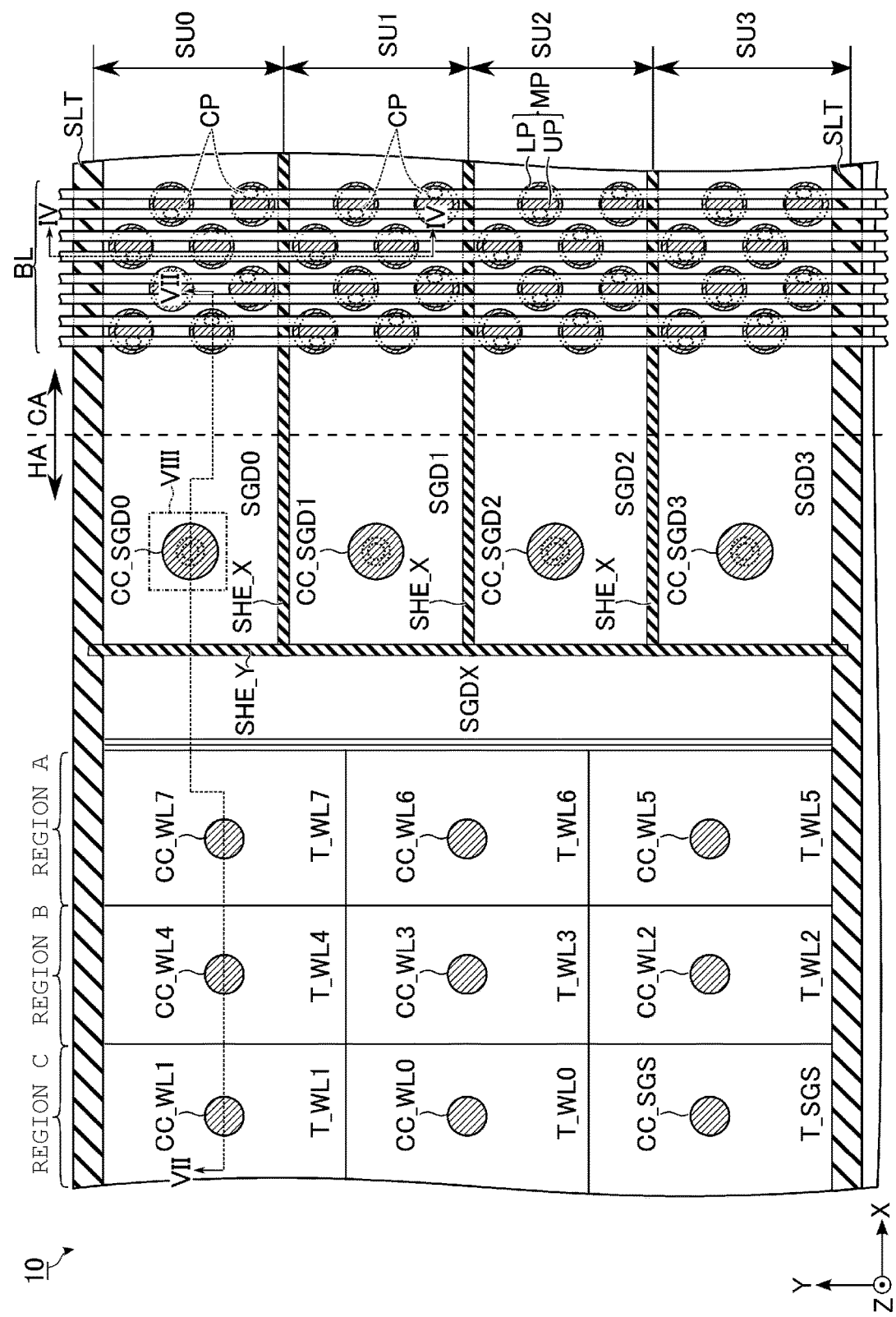
FIG. 3 is a plan view illustrating the memory cell array of the semiconductor storage device according to the first embodiment when seen from the top.

FIG. 3 is a plan view illustrating a planar layout of the memory cell array of the semiconductor storage device according to the first embodiment. For example, FIG. 3 illustrates apart of a cell region CA that includes structures corresponding to the string units SU0 to SU3 in one block BLK and a hookup region HA where a contact CC is led out from a stacked wiring layer in each of the string units SU.

As illustrated in FIG. 3, the memory cell array 10 includes, for example, a slit SHE, a plurality of slits SLT, a memory pillar MP, contacts CP and CC, the bit line BL, and a stacked wiring layer. The slit SHE includes a plurality of slits SHE_X and a slit SHE_Y. A plurality of stacked wiring layers include, for example, three layers of select gate lines SGD (each of which includes SGD0 to SGD3 and SGDX located in the same layer), seven layers of word lines WL0 to WL7, and a single layer of select gate line SGS. A plurality of memory pillars MP, the contact CP, and the bit line BL are provided in the cell region CA, and a plurality of contacts CC are provided in the hookup region HA.

The stacked wiring layers are stacked along the Z-axis in order of the select gate line SGS, the word lines WL0 to WL7, and the select gate lines SGD from the semiconductor substrate side.

Each of the slits SLT extends along a predetermined direction (in FIG. 3, the X-axis) of a memory cell array plane and are arrayed along a direction (in FIG. 3, the Y-axis as a direction perpendicular to the X-axis) perpendicular to the predetermined direction. Each of the slits SHE_X extends along the X-axis and are arrayed along the Y direction between adjacent slits SLT. The slit SHE_Y extends along the Y-axis and between adjacent slits SLT. For example, the width of the slit SLT is wider than the width of the slit SHE. The slits SLT, SHE_X, and SHE_Y include an insulator. The slit SHE_X may be an example of a first insulator layer, and the slit SHE_Y may be an example of a second insulator layer. The slit SHE_X may be connected to the slit SHE_Y. For example, the slit SLT divides the stacked wiring layers corresponding to the word line WL, the select gate line SGD, and the select gate line SGS described below with reference to FIG. 4. That is, the slit SLT insulates and separates the string units SU0 to SU3 from other string units (not illustrated) adjacent to the string units SU0 to SU3. In addition, the slits SHE_X and SHE_Y divides the stacked wiring layers corresponding to the select gate lines SGD into the select gate lines SGD0 to SGD3 that correspond to the string units SU0 to SU3, respectively, and the select gate line SGDX that does not correspond to any string unit SU such that the select gate lines SGD0 to SGD3 and the select gate line SGDX are insulated and separated from each other.

This way, regions divided by the slits SLT, SHE_X, and SHE_Y constitute the string units SU0 to SU3, respectively. In the memory cell array 10, the same layout as illustrated in FIG. 3 is repeatedly arranged along the Y-axis.

In the cell region CA illustrated in FIG. 3, the memory pillars MP are arranged in a region between adjacent slits SLT, for example, in a staggered arrangement of 16 rows. That is, in each of the string units SU0 to SU3, the memory pillars MP are arranged in a staggered arrangement of 4 rows. Each of the memory pillars MP include: a portion (lower pillar LP) that is formed in a memory hole; and a portion (upper pillar UP) that is formed in a SGD hole. The upper pillar UP is higher than the lower pillar LP and, for example, has a smaller diameter than the lower pillar LP.

A set including the upper pillar UP and the lower pillar LP, that is, a memory cell array plane has an overlapping portion in a plan view when seen from the top. In this plan view, a central axis of the upper pillar UP and a central axis of the lower pillar LP may overlap each other or may not overlap each other. Here, the central axis is defined as an axis that passes through the center of each of the upper pillar UP and the lower pillar LP on any XY cross-section along the Z-axis. The XY cross-section refers to, for example, a surface where the upper pillar UP and the lower pillar LP are in contact with each other. In a plan view of FIG. 3, the lower pillar LP is arranged not to overlap the slit SHE_X. In addition, in the memory pillar MP that is arranged in the vicinity of a slit SHE_X or a slit SLT (e.g. nearest the slit SHE_X or the slit SLT, of the memory pillars MP in a given strung unit SU) the central axis of the upper pillar UP is arranged to deviate from the central axis of the lower pillar LP in a direction away from the slit SHE_X or SLT. This way, in the semiconductor storage device 1 according to the first embodiment, a layout for avoiding contact with the memory pillar MP may be designed for the slit SHE_X or SLT.

Each of the bit lines BL extends along the Y-axis and are arrayed along the X-axis. In a plan view, each of the bit lines BL is arranged to overlap at least one upper pillar UP per string unit SU. In each of the upper pillars UP, two bit lines BL overlap each other. The contact CP is provided between one bit line BL among the bit lines BL that overlap the upper pillar UP and the upper pillar UP. The string unit Su is electrically connected to the corresponding bit line BL via the contact CP formed in the upper pillar UP.

In the hookup region HA of FIG. 3, in the three layers of select gate lines SGD, a portion corresponding to the select gate line SGDX forms a staircase shape in a direction away from the cell region CA along the X-axis. That is, in a plan view, three stacked wiring layers constituting the select gate line SGDX have a region in which a lower wiring layer extends longer along the X-axis and does not overlap an upper wiring layer.

A set including the word lines WL5 to WL7, a set including the word lines WL2 to WL4, and a set including the select gate line SGS and the word lines WL0 and WL1 form a staircase shape along the X-axis. That is, in a plan view, the set including the word lines WL5 to WL7 have a region that is longer than the select gate lines SGD along the X-axis and does not overlap the select gate lines SGD. The set including the word lines WL2 to WL4 has a region B that is longer than the set including the word lines WL5 to WL7 along the X-axis and does not overlap the region A of the set including the word lines WL5 to WL7. The set including the select gate line SGS and the word lines WL0 and WL1 has a region C that is longer than the set including the word lines WL2 to WL4 along the X-axis and does not overlap the region B of the set including the word lines WL2 to WL4.

In addition, each of the set including the word lines WL5 to WL7, the set including WL2 to WL4, and the set including the select gate line SGS and the word lines WL0 and WL1 further forms a staircase shape along the Y-axis at an end portion of the staircase shape along the X-axis. That is, in the region A, the word line WL6 has a region T_WL6 that does not overlap a region T_WL7 of the word line WL7, the word line WL5 has a region T_WL5 that does not overlap the regions T_WL6 and T_WL7, and the regions T_WL5 to T_WL7 are aligned along the Y-axis. In the region B, the word line WL3 has a region T_WL3 that does not overlap a region T_WL4 of the word line WL4, the word line WL2 has a region T_WL2 that does not overlap the regions T_WL3 and T_WL4, and the regions T_WL2 to T_WL4 are aligned along the Y-axis. In the region C, the word line WL0 has a region T_WL0 that does not overlap a region T_WL1 of the word line WL1, the select gate line SGS has a region T_SGS that does not overlap the regions T_WL0 and T_WL1, and the regions T_SGS, T_WL0, and T_WL1 are aligned along the Y-axis.

Contacts CC_SGD0 to CC_SGD3, CC_WL0 to CC_WL7, and CC_SGS are provided on the select gate lines SGD0 to SGD3, the regions T_WL0 to T_WL7 of the word lines WL0 to WL7, and the region T_SGS of the select gate line SGS. The contacts CC_SGD0 to CC_SGD3 are in contact with upper surfaces of the three layers of stacked wiring layers of the select gate lines SGD0 to SGD3, respectively. The diameter of the contact CC_SGD on the upper surface of the uppermost layer of the select gate lines SGD is larger than the diameters of the contacts CC_WL and CC_SGS. The diameter of the contact CC_SGD will be described in detail in FIG. 8.

The planar layout of the memory cell array 10 described above is merely an example, and the present disclosure is not limited thereto. For example, the number of the slits SHE or the number of the string units SU arranged between adjacent slits SLT may be designed according to specifications. In addition, the number and arrangement of the memory pillars MP, the bit lines BL connected to the memory pillars MP, and the like may be designed according to specifications. The number of steps in the staircase shape along the Y-axis in the arrangement of the regions T_SGS and T_WL0 to T_WL7 may be designed according to specifications, and the stair along the Y-axis is not necessarily provided.

1.1.3.2 Cell Region

Figure 4:
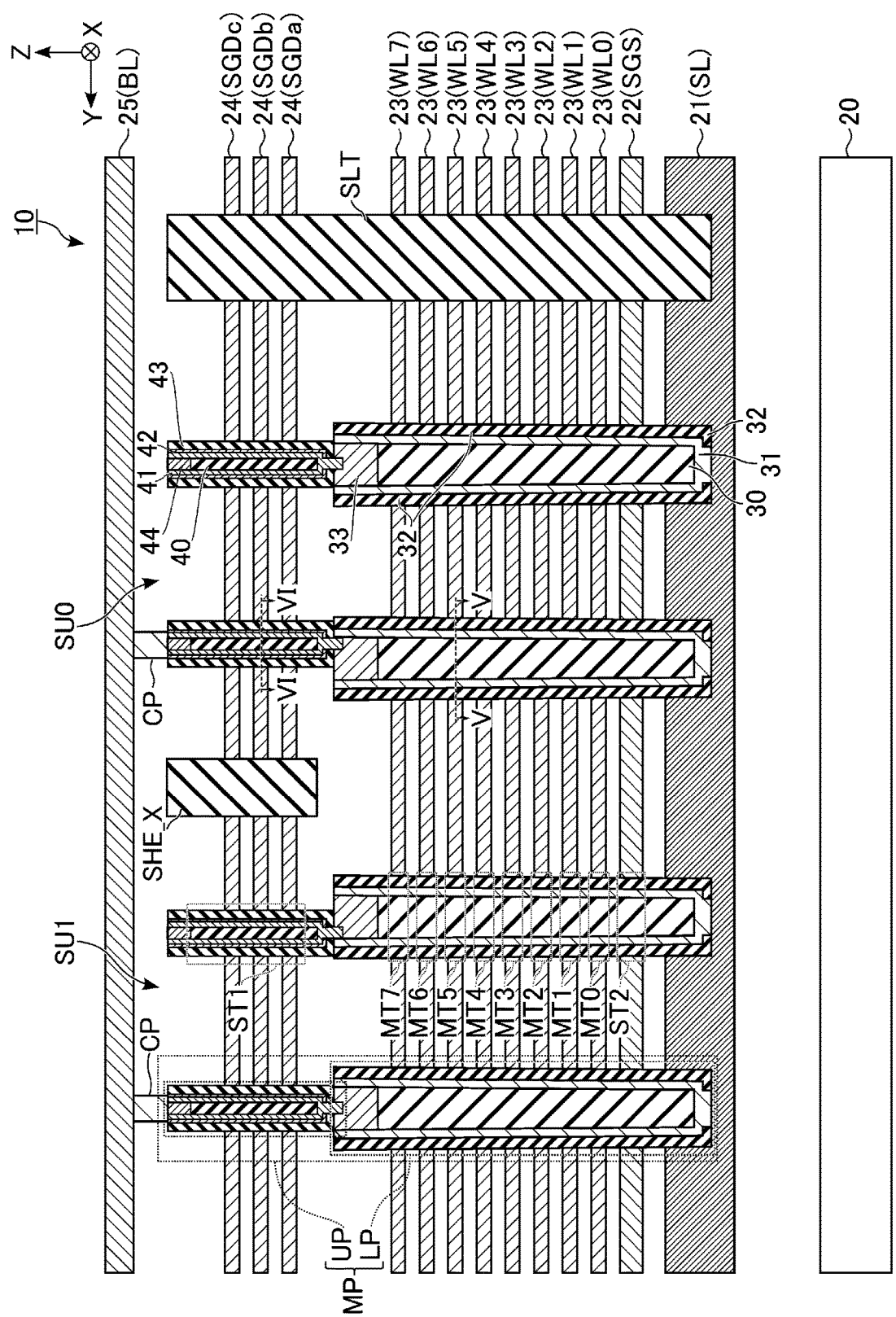
FIG. 4 is a cross-sectional view illustrating a cell region of the memory cell array taken along line IV-IV of FIG. 3.

FIG. 4 illustrates an example of a cross-sectional structure of the memory cell array 10 of the semiconductor storage device according to the first embodiment of FIG. 3 taken along line IV-IV. As illustrated in FIG. 4, a conductor layer 21 is provided above the semiconductor substrate 20 via an insulator layer (not illustrated). In this insulator layer, a circuit such as the sense amplifier module 16 may be provided. The conductor layer 21 is formed, for example, in a plate shape spread along an XY plane and forms the source line SL. The conductor layer 21 includes, for example, silicon (Si).

A conductor layer 22 is provided above the conductor layer 21 via an insulator layer (not illustrated). The conductor layer 22 is used as the select gate line SGS.

A plurality of insulator layers (not illustrated) and a plurality of conductor layers 23 are alternately stacked above the conductor layer 22. For example, the conductor layers 23 are used as the word lines WL0 to WL7 in order from the semiconductor substrate 20 side. The conductor layers 22 and 23 are formed, for example, in a plate shape spread along an XY plane and include, for example, tungsten (W).

A plurality of insulator layers (not illustrated) and a plurality of conductor layers 24 are alternately stacked above the conductor layer 23 stacked as the uppermost layer. The distance between the conductor layer 23 as the uppermost layer and the conductor layer 24 as the lowermost layer in the Z direction is more than the distance between adjacent conductor layers 23 or between adjacent conductor layers 24 in the Z direction. That is, the thickness of the insulator layer (INS, not illustrated) between the conductor layer 23 as the uppermost layer and the conductor layer 24 as the lowermost layer is more than the thickness of the insulator layer between adjacent conductor layers 23 or between adjacent conductor layers 24 (e.g., by a factor of approximately 1.5 or more, approximately 2 or more, approximately 5 or more, or greater). The stacked conductor layers 24 are used as select gate lines SGDa, SGDb, and SGDc in order from the semiconductor substrate 20 side, respectively. The select transistor ST1 is provided in a portion of the upper pillar UP corresponding to the select gate lines SGDa to SGDc. The conductor layer 24 is formed, for example, in a plate shape spread along the XY plane and includes, for example, tungsten (W).

A conductor layer 25 is provided above the conductor layer 24 stacked as the uppermost layer via an insulator layer (not illustrated). For example, a plurality of conductor layer 25 extends along the Y-axis, are linearly arranged along the X-axis, and are used as the bit lines BL, respectively. The conductor layer 25 includes, for example, copper (Cu).

The memory pillar MP extends along the Z-axis. Specifically, the lower pillar LP in the memory pillar MP penetrates the conductor layers 22 and 23, and the bottom portion thereof is in contact with the conductor layer 21. The upper pillar UP in the memory pillar MP penetrates the conductor layers 24 and is in contact with the lower pillar LP.

In addition, in the memory pillar MP, the lower pillar LP includes, for example, a core member 30, a semiconductor layer 31, a stacked film 32, and a semiconductor portion 33, and the upper pillar UP includes, for example, a core member 40, a semiconductor layer 41, a semiconductor layer 42, a stacked film 43, and a semiconductor portion 44. The upper pillar UP is formed such that apart of the semiconductor layer 41 is buried in an upper end of the lower pillar LP. As a result, the upper pillar UP is electrically connected to the lower pillar LP in an improved manner.

The core member 30 of the lower pillar LP extends along the Z-axis, an upper end of the core member 30 is located to be higher than, for example, the conductor layer 23 as the uppermost layer, and a lower end of the core member 30 of the upper pillar UP is located, for example, in the conductor layer 21. The core member 30 includes, for example, an insulator such as silicon oxide ($SiO_2$).

The semiconductor layer 31 covers a bottom surface and a side surface of the core member 30 and includes, for example, a cylindrical portion. A lower end of the semiconductor layer 31 (e.g. a protruding portion) is in contact with the semiconductor layer 21, and an upper end of the semiconductor layer 31 is located to be higher than the conductor layer 23 as the uppermost layer.

The stacked film 32 covers a side surface and a bottom surface of the semiconductor layer 31 other than the portion where the conductor layer 21 and the semiconductor layer 31 are in contact with each other, and includes, for example, a cylindrical portion. A layer structure of the stacked film 32 will be described in detail with reference to FIG. 5.

The semiconductor portion 33 covers an upper surface of the core member 30 and is in contact with an inner wall portion of the semiconductor layer 31 located above the core member 30 and a lower end of the semiconductor layer 41 formed immediately above the semiconductor portion 33. The semiconductor portion 33 is, for example, cylindrical.

The core member 40 extends along the Z-axis. A lower end of the core member 40 is located between the conductor layer 23 as the uppermost layer and the conductor layer 24 as the lowermost layer. An upper end of the core member 40 is located to be higher than a layer where the conductor layer 24 as the uppermost layer is provided.

The semiconductor layer 41 covers a bottom surface and a side surface of the core member 40 and includes, for example, a cylindrical portion. A lower end of the semiconductor layer 41 (e.g. a protruding portion) is in contact with the semiconductor portion 33 such that the semiconductor layer 41 and the lower pillar LP are electrically connected to each other, and an upper end of the semiconductor layer 41 is located to be higher than the conductor layer 24 as the uppermost layer.

The semiconductor layer 42 includes a cylindrical portion of the semiconductor layer 41 that covers at least a side surface of a portion intersecting the conductor layer 24.

The stacked film 43 is a gate insulating film of the select transistor, covers a side surface of the semiconductor layer 42, and includes a cylindrical portion. A layer structure of the stacked film 43 will be described in detail with reference to FIG. 7.

The semiconductor portion 44 covers an upper surface of the core member 40 and is in contact with an inner wall of a portion of the semiconductor layer 41 that is provided above the core member 40. The semiconductor portion 44 is provided, for example, in a cylindrical shape and reaches an upper end of the upper pillar UP.

The columnar contact CP is provided on upper surfaces of the semiconductor layer 41, the semiconductor layer 42, and the semiconductor portion 44 in the memory pillar MP. A cross-sectional view of FIG. 4 illustrates the contacts CP corresponding to two memory pillars MP among four memory pillars MP. Regarding the remaining two memory pillars MP for which the contacts CP are not illustrated, the contacts CP are provided in a cross-section on a depth side or a front side of FIG. 4. An upper surface of each of the contacts CP is in contact with one conductor layer 25 (bit line BL) corresponding thereto and is electrically connected thereto.

The slit SLT extends in a plate shape along, for example, an XZ plane and divides the conductor layers 22 to 24 in the Y direction. An upper end of the slit SLT is located between the conductor layer 24 and the conductor layer 25. A lower end of the slit SLT is located, for example, in a layer where the conductor layer 21 is provided. The slit SLT includes, for example, an insulator such as silicon oxide.

The slit SHE_X extends in a plate shape along, for example, an XZ plane and divides the conductor layers 24 in the Y direction. An upper end of the slit SHE_X is located between the conductor layer 24 and the conductor layer 25. A lower end of the slit SHE_X is located, for example, between a layer where the conductor layer 23 as the uppermost layer is provided and a layer where the conductor layer 24 is provided. The slit SHE_X includes, for example, an insulator such as silicon oxide.

The upper end of the slit SLT, the upper end of the slit SHE_X, and the upper end of the memory pillar MP may be aligned or may not be aligned.

Figure 5:
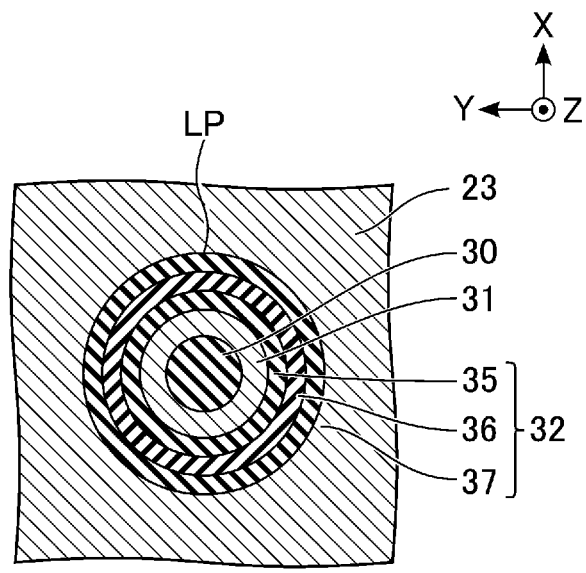
FIG. 5 is a cross-sectional view illustrating a memory pillar lower portion taken along line V-V of FIG. 4.

FIG. 5 is an XY cross-sectional view illustrating the memory pillar MP of FIG. 4 taken along line V-V and illustrates an example of a cross-sectional structure including the lower pillar LP and the conductor layer 23 formed around the lower pillar LP.

As illustrated in FIG. 5, the core member 30 is provided substantially at the center of the lower pillar LP. Further, the semiconductor layer 31 and the stacked film 32 are concentrically provided around the core member 30. That is, the semiconductor layer 31 and the stacked film 32 are formed along the Z direction to surround the entire side surface of the core member 30. The stacked film 32 is a film in which a tunnel insulating film 35, an insulating film 36, and a block insulating film 37 are stacked in this order.

Each of the tunnel insulating film 35 and the block insulating film 37 includes, for example, silicon oxide. The insulating film 36 includes, for example, silicon nitride (SiN).

Figure 6:
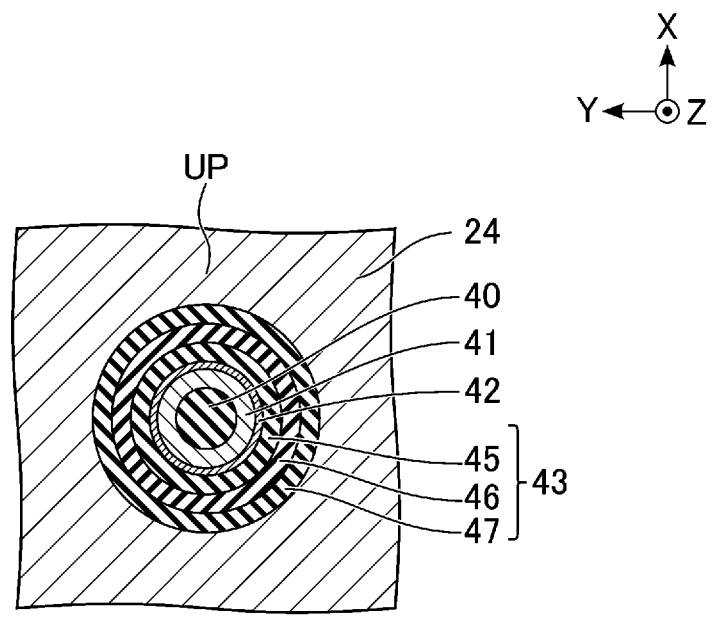
FIG. 6 is a cross-sectional view illustrating a memory pillar upper portion taken along line VI-VI of FIG. 4.

FIG. 6 is an XY cross-sectional view illustrating the memory pillar MP of FIG. 4 taken along line VI-VI and illustrates an example of a cross-sectional structure of the upper pillar UP.

As illustrated in FIG. 6, the core member 40 is provided substantially at the center of the upper pillar UP. Further, the semiconductor layer 41, the semiconductor layer 42, and the stacked film 43 are concentrically provided around the core member 40. That is, the semiconductor layer 41, the semiconductor layer 42, and the stacked film 43 are formed along the Z direction to surround the entire side surface of the core member 40. The stacked film 43 is a film in which a tunnel insulating film 45, an insulating film 46, and a block insulating film 47 are stacked in this order.

Each of the tunnel insulating film 45 and the block insulating film 47 includes, for example, silicon oxide. The insulating film 46 includes, for example, silicon nitride (SiN).

In the structure of the memory pillar MP described above, a portion where the memory pillar MP and the conductor layer 22 intersect each other functions as the select transistor ST2. A portion where the memory pillar MP and the conductor layer 23 intersect each other functions as the memory cell transistor MT. A portion where the memory pillar MP and the conductor layer 24 intersect with each other functions as the select transistor ST1.

That is, the semiconductor layer 31 is used as a channel of each of the memory cell transistor MT and the select transistor ST2. The insulating film 36 is used as a charge storage layer of the memory cell transistor MT and the select transistor ST2. The semiconductor layer 41 is used as a channel of the select transistor ST1 and as an electrical connection portion between the upper pillar UP and the lower pillar LP. The insulating film 46 is used as a charge storage layer of the select transistor ST1. As a result, each of the memory pillars MP functions as, for example, one NAND string NS.

The structure of the memory cell array 10 described above is merely exemplary, and the memory cell array 10 may have another structure. For example, the number of the conductor layers 23 is designed based on the number of the word lines WL. The number of layers of the select gate lines SGD is not limited to three and may be any appropriate number. The conductor layers 22 that are provided in a plurality of layers may be assigned to the select gate line SGS. When the select gate line SGS is provided in a plurality of layers, a conductor different from the conductor layer 22 may also be used. The memory pillar MP and the conductor layer 25 may be electrically connected to each other via two or more contacts or may be electrically connected to each other via another wiring. The inside of the slit SLT may be configured with multiple kinds of insulators.

1.1.3.3. Hookup Region

Figure 7:
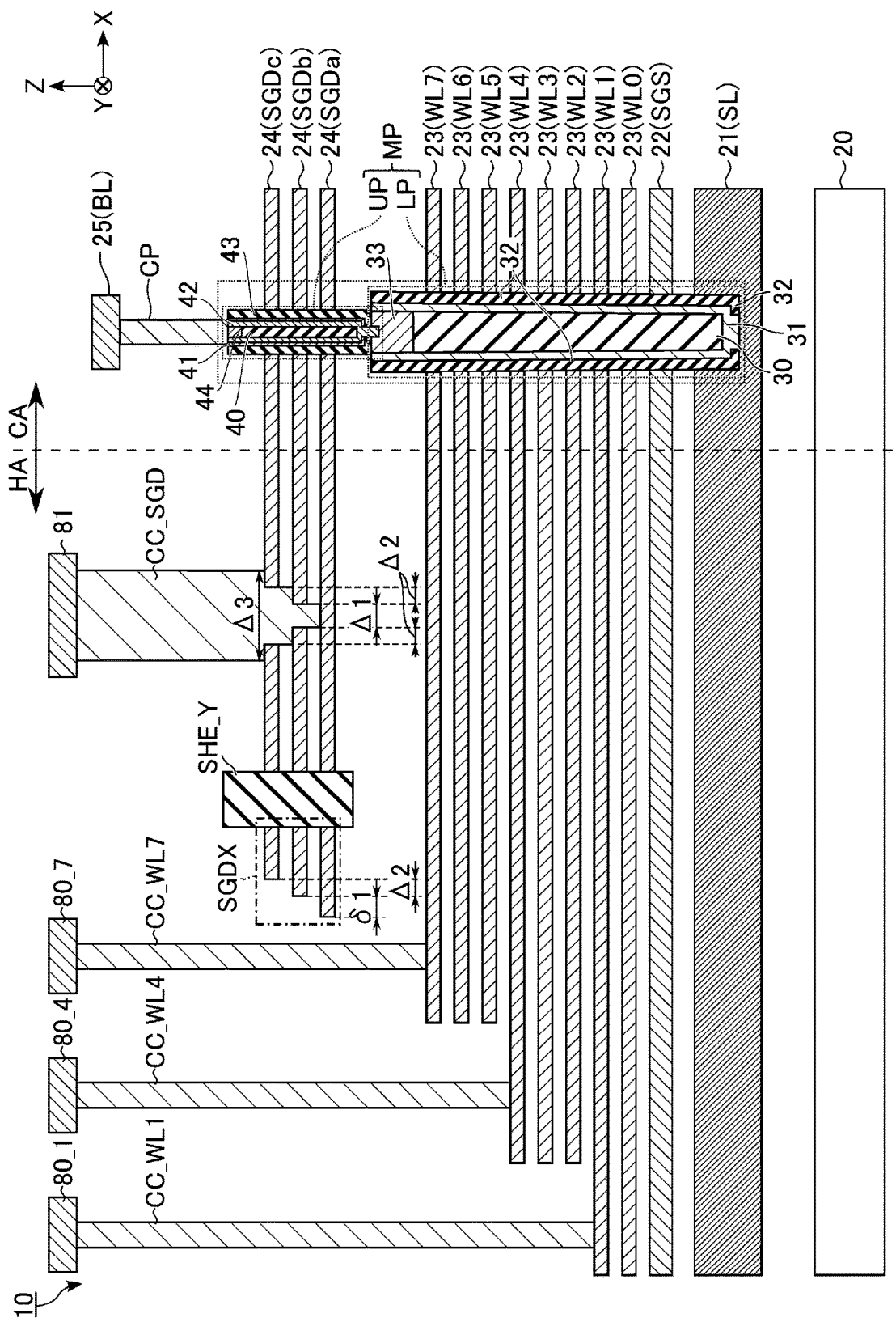
FIG. 7 is a cross-sectional view illustrating a hookup region of the memory cell array taken along line VII-VII of FIG. 3.

FIG. 7 illustrates an example of a cross-sectional structure of the memory cell array 10 of the semiconductor storage device according to the first embodiment of FIG. 3 taken along line VII-VII. As illustrated in FIG. 7, the conductor layers 21 to 24 extend along the X-axis and reach the hookup region HA.

Columnar contacts CC_WL1, CC_WL4, and CC_WL7 are provided on upper surfaces of the conductor layers 23 used as the word lines WL1, WL4, and WL7. Upper surfaces of the contacts CC_WL1, CC_WL4, and CC_WL7 are in contact with one conductor layer 80_1, one conductor layer 80_4, and one conductor layer 80_7 corresponding thereto and are electrically connected thereto. On upper surfaces of the conductor layers 23 that are used as the word lines WL0, WL3, and WL6 among the remaining word lines WL for which the contacts CC_WL are not illustrated, the contacts CC_WL0, CC_WL3, and CC_WL6 are provided in a cross-section on a front side of FIG. 7, respectively. On an upper surface of the conductor layer 22 used as the select gate line SGS and on upper surfaces of the conductor layers 23 that are used as the word lines WL2 and WL5, the contacts CC_SGS, CC_WL2, and CC_WL5 are provided on a front side further than the cross-section where the contacts CC_WL0, CC_WL3, and CC_WL6 are provided, respectively.

The columnar contact CC_SGD is in contact with upper surfaces of the three layers of conductor layers 24 used as the select gate lines SGDa, SGDb, and SGDc, respectively. A cross-sectional view of FIG. 7 illustrates the contact CC_SGD0 corresponding to the string unit SU0 among the four contacts CC_SGD. The remaining three contacts CC_SGD1 to CC_SGD3 (not illustrated) are provided in a cross-section on a front side of FIG. 7. An upper surface of each of the contacts CC_SGD is in contact with one conductor layer 81 corresponding thereto and is electrically connected thereto.

The contact CC_SGD has a cross-section having a diameter $\Delta 1$ along a lower surface of the select gate line SGDb as the second layer from the bottom, has a cross-section having a diameter $\Delta 1 + 2\Delta 2$ more than the diameter $\Delta 1$ along a lower surface of the select gate line SGDc as the third layer (uppermost layer) from the bottom, and has a diameter $\Delta 3$ more than the diameter $\Delta 1 + 2\Delta 2$ along an upper surface of the select gate line SGDc as the uppermost layer. An XY cross-section of the contact CC_SGD on the lower surface of the select gate line SGDb and an XY cross-section of the contact CC_SGD on the lower surface of the select gate line SGDc are similar to each other, and the centers thereof match each other in a plan view.

The slit SHE_Y extends in a plate shape along, for example, an YZ plane and divides the conductor layers 24 in the X direction. The slit SHE_Y includes an upper end and a lower end, for example, at the same height as that of the slit SHE_X and includes an insulator such as silicon oxide as in the slit SHE_X.

The three layers of conductor layers 24 are divided into a portion including the select gate lines SGDa to SGDc and a portion including the select gate line SGDX by the slit SHE_Y. In the portion including the select gate line SGDX, the conductor layer 24 as the lowermost layer is longer than the conductor layer 24 as the second layer from the bottom along the X-axis by a difference δ1, and the conductor layer 24 as the second layer from the bottom is longer than the conductor layer 24 as the uppermost layer by a difference Δ2. This way, the difference Δ2 between the length of the conductor layer 24 as the second layer from the bottom and the length of the conductor layer 24 as the uppermost layer along the X-axis corresponds to the difference (2Δ2) between the diameter of the contact CC_SGD along the lower surface of the conductor layer 24 as the second layer from the bottom and the diameter of the contact CC_SGD along the lower surface of the conductor layer 24 as the uppermost layer. The difference Δ1 may be "0" (that is, the conductor layer 24 as the lowermost layer and the conductor layer 24 as the second layer from the bottom may have the same length along the X-axis).

Figure 8:
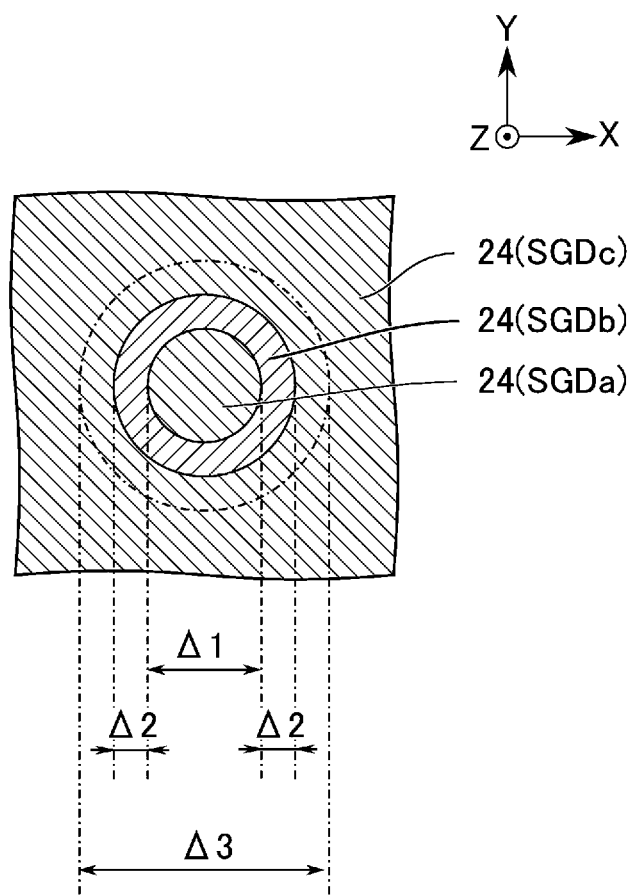
FIG. 8 is an enlarged plan view illustrating a region VIII of select gate lines of FIG. 3 when seen from the top.

FIG. 8 illustrates an example of an enlarged plan view of a region VIII of FIG. 3 in the three layers of select gate lines SGD according to the first embodiment when seen from the top. In FIG. 8, the contact CC_SGD and the interlayer insulator layer are not illustrated, and an outer edge of the surface of the contact CC_SGD having the diameter Δ3 that is in contact with the upper surface of the conductor layer 24 as the uppermost layer is indicated by a chain line.

As illustrated in FIG. 8, a through via hole having the diameter Δ1+2Δ2 is formed in the conductor layer 24 as the uppermost layer used as the select gate line SGDc. A through via hole having the diameter Δ1 is formed in the conductor layer 24 as the second layer from the bottom used as the select gate line SGDb. The shape of the through via hole having the diameter Δ1+2Δ2 is similar to that of the through via hole having the diameter Δ1, and the center of the through via hole having the diameter Δ1+2Δ2 matches the center of the through via hole having the diameter Δ1 in a plan view.

The example of FIG. 8 shows a case where the through via hole having the diameter Δ1 and the through via hole having the diameter Δ1+2Δ2 are circular, but the present disclosure is not limited thereto. For example, the through via hole having the diameter Δ1 and the through via hole having the diameter Δ1+2Δ2 may have any appropriate shape such as a rectangular shape (e.g. in which widths of the rectangles may correspond to the diameters disclosed herein). In FIG. 8, the outer edge of the surface of the contact CC_SGD that is in contact with the upper surface of the conductor layer 24 as the uppermost layer may have any appropriate shape in a range including the through via hole having the diameter Δ1+2Δ2. The outer edge does not necessarily match the shape of the through via hole having the diameter Δ1 and the through via hole having the diameter Δ1+2Δ2 and may not match the centers of the through via holes.

1.2 Method of Manufacturing Semiconductor Storage Device

Hereinafter, an example of a series of manufacturing steps of the semiconductor storage device according to the first embodiment from the formation of a stacked structure corresponding to the word lines WL to a step of the formation of the contact CC_SGD corresponding to the select gate lines SGD will be described. Each of FIGS. 9 to 24 illustrates an example of a cross-sectional structure that includes a structure corresponding to the memory cell array in a manufacturing step of the semiconductor storage device according to the first embodiment. The cross-sectional view of the manufacturing step referred to below includes a cross-section perpendicular to the surface of the semiconductor substrate 20. In addition, a region illustrated in the cross-sectional view of each of the manufacturing steps includes a region where the contacts CC_WL1, CC_WL4, CC_WL7, and CC_SGD0 and the slit SHE_Y in the hookup region HA and one memory pillar MP in the cell region CA are to be formed.

Figure 9:
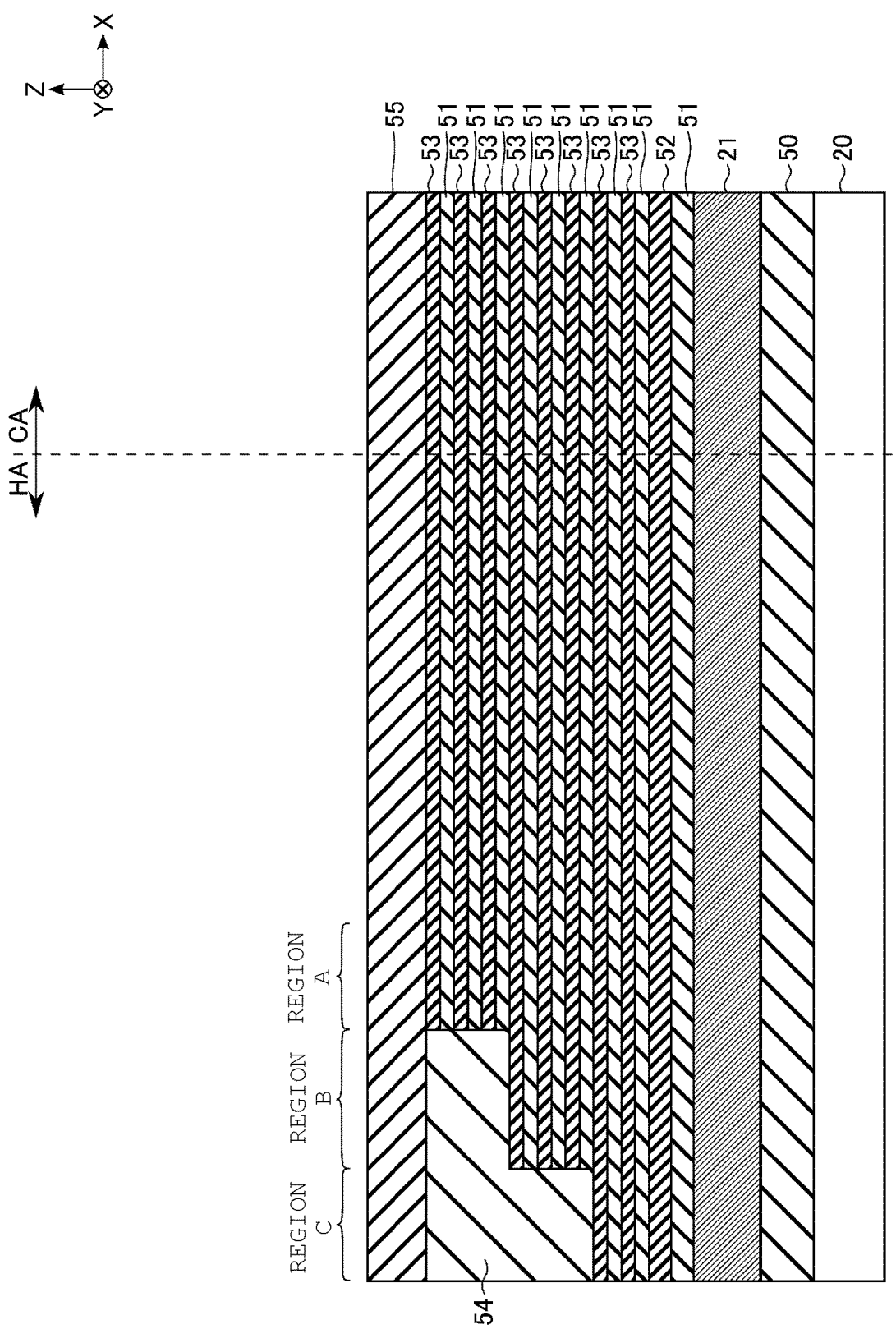
FIG. 9 is a cross-sectional view of the memory cell array illustrating a manufacturing step of the semiconductor storage device according to the first embodiment.

First, as illustrated in FIG. 9, a sacrificial material 52 corresponding to the select gate line SGS and sacrificial materials 53 corresponding to the word lines WL are stacked, and then a staircase structure is formed in a portion corresponding to the regions A to C of the hookup region HA.

Specifically, first, the insulator layer 50 and the conductor layer 21 are sequentially stacked on the semiconductor substrate 20. The insulator layer 51 and the sacrificial material 52 are stacked on the conductor layer 21, and the insulator layer 51 and the sacrificial material 53 are alternately stacked on the sacrificial material 52 multiple times.

Next, a mask (not illustrated) is provided on an upper surface of the sacrificial material 53, and a pattern is formed by lithography in a portion of the mask corresponding to the regions A to C. Next, an operation of performing anisotropic etching on the stacked structure of the sacrificial materials 52 and 53 and the insulator layer 51 based on the obtained pattern and an operation of slimming the mask pattern to remove a portion of the mask pattern are sequentially repeated. As a result, etching can be performed such that the portion of the stacked structure corresponding to the regions A to C form a staircase shape along the X direction and the Y direction. In this step, anisotropic etching is, for example, RIE (Reactive Ion Etching).

Next, the staircase structure is buried up to the position of the sacrificial material 53 as the uppermost layer by an insulator layer 54, and an insulator layer 55 is stacked on the insulator layer 54 and the sacrificial material 53 as the uppermost layer. The insulator layers 51, 54, and 55 include, for example, silicon oxide ($SiO_2$). The number of the sacrificial materials 52 and 53 formed correspond to the number of the select gate line SGS and the word lines WL to be stacked. The sacrificial materials 52 and 53 include, for example, silicon nitride (SiN).

Figure 10:
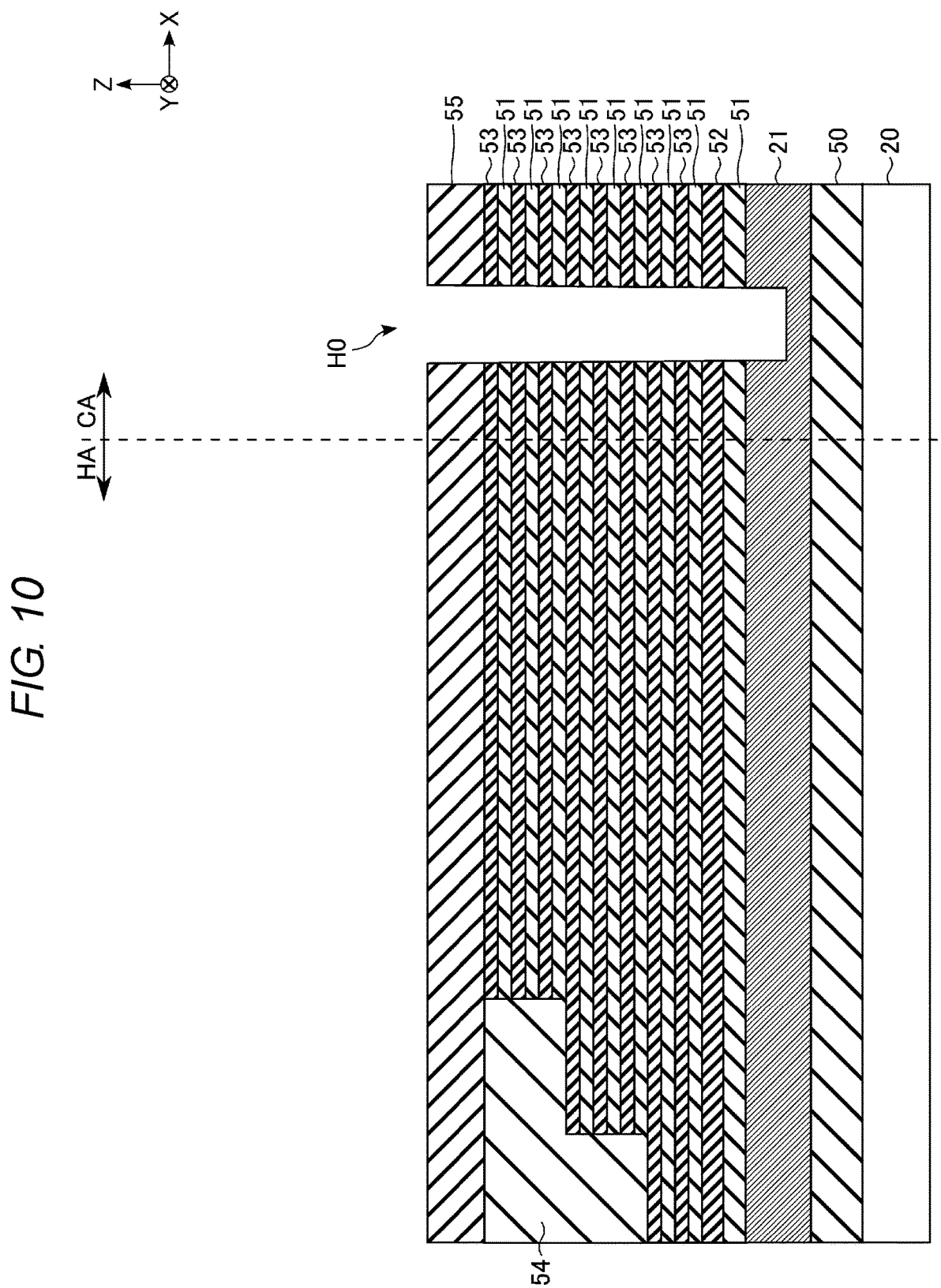
FIG. 10 is a cross-sectional view of the memory cell array illustrating a manufacturing step of the semiconductor storage device according to the first embodiment.

Next, as illustrated in FIG. 10, a memory hole H0 corresponding to the lower pillar LP is formed. Specifically, first, a mask in which a region corresponding to the memory hole H0 is open is formed by lithography. Next, the memory hole H0 is formed by anisotropic etching using the formed mask.

The memory hole H0 formed in this step penetrates the insulator layer 51, the sacrificial materials 52 and 53, and the insulator layer 55 and reaches the conductor layer 21 (and may extend through a portion of the conductor layer 21). In this step, anisotropic etching is, for example, RIE (Reactive Ion Etching).

Figure 11:
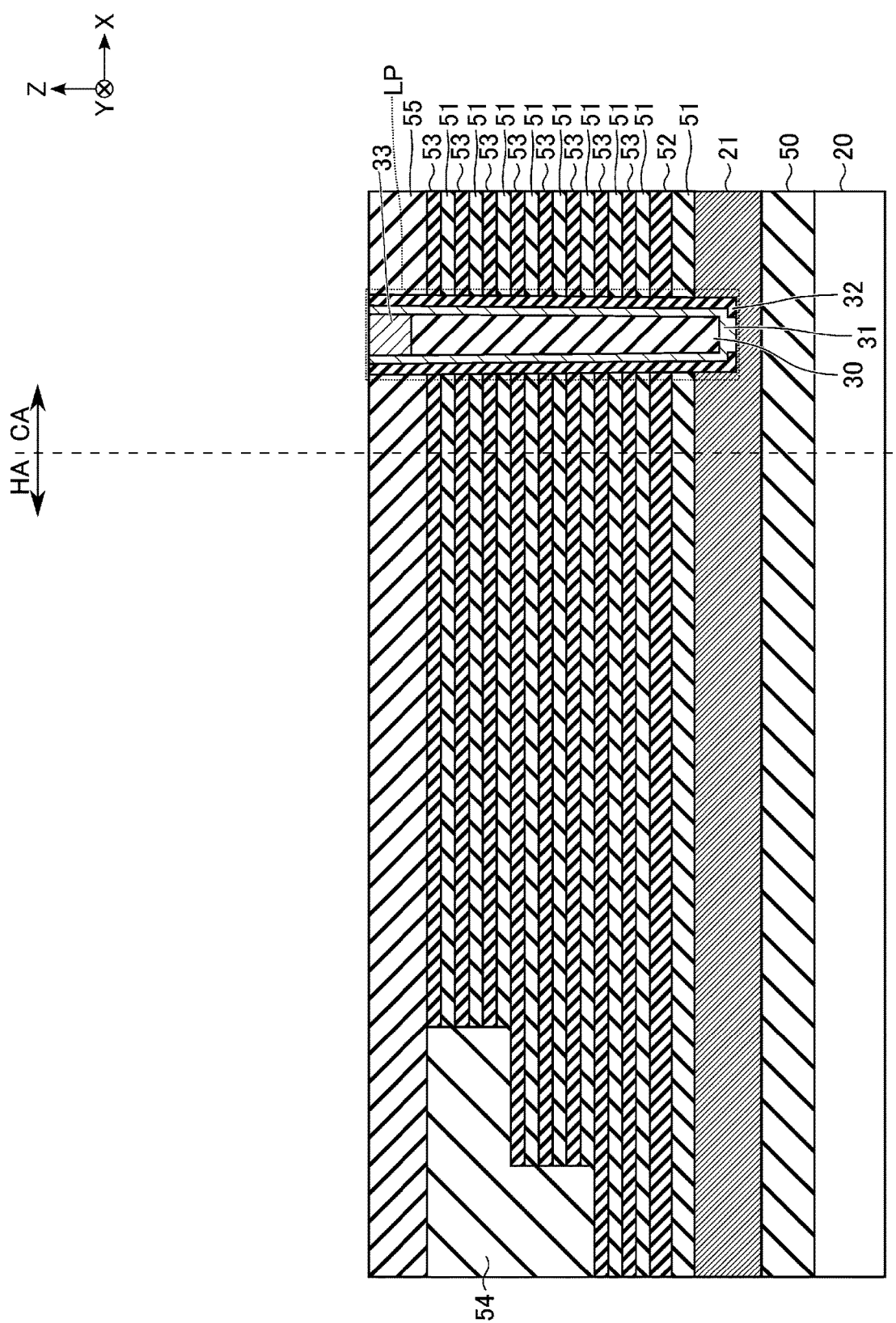
FIG. 11 is a cross-sectional view of the memory cell array illustrating a manufacturing step of the semiconductor storage device according to the first embodiment.

Next, as illustrated in FIG. 11, a stacked structure in the memory hole H0, that is, the lower pillar LP is formed.

Specifically, the block insulating film 37, the insulating film 36, and the tunnel insulating film 35 are sequentially formed on a side surface and a bottom surface of the memory hole H0 and an upper surface of the insulator layer 55 such that the stacked film 32 is formed. After removing the stacked film 32 in the bottom portion of the memory hole H0 (e.g. to expose the conductor 21), the semiconductor layer 31 and the core member 30 are sequentially formed to bury the inside of the memory hole H0. Next, the core member 30 in a range from the upper end of the memory hole H0 to a predetermined depth is removed together with a portion that remains being higher than the insulator layer 54.

Next, the semiconductor portion 33 is formed to bury the inside of the memory hole H0. Next, the semiconductor portion 33, the semiconductor layer 31, and the stacked film 32 that are higher than the insulator layer 54 are removed. As a result, the lower pillar LP is formed.

Figure 12:
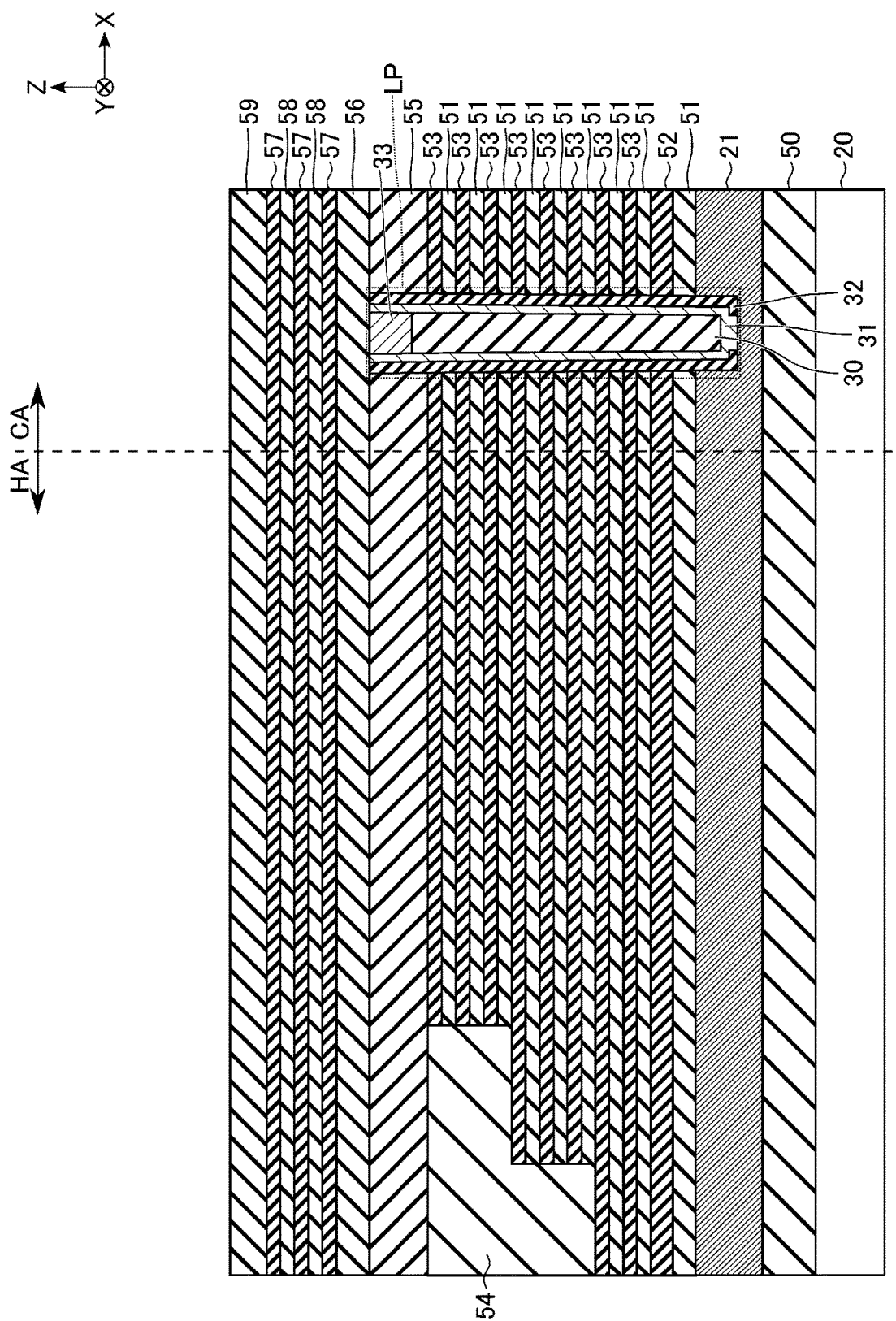
FIG. 12 is a cross-sectional view of the memory cell array illustrating a manufacturing step of the semiconductor storage device according to the first embodiment.

Next, as illustrated in FIG. 12, after forming the insulator layer 56 on the upper surfaces of the lower pillar LP and the insulator layer 55, sacrificial materials 57 corresponding to the select gate lines SGD and insulator layers 58 are alternately stacked. An insulator layer 59 is formed on the sacrificial material 57 as the uppermost layer. The insulator layers 56, 58, and 59 include silicon oxide, and the sacrificial material 57 includes silicon nitride.

Figure 13:
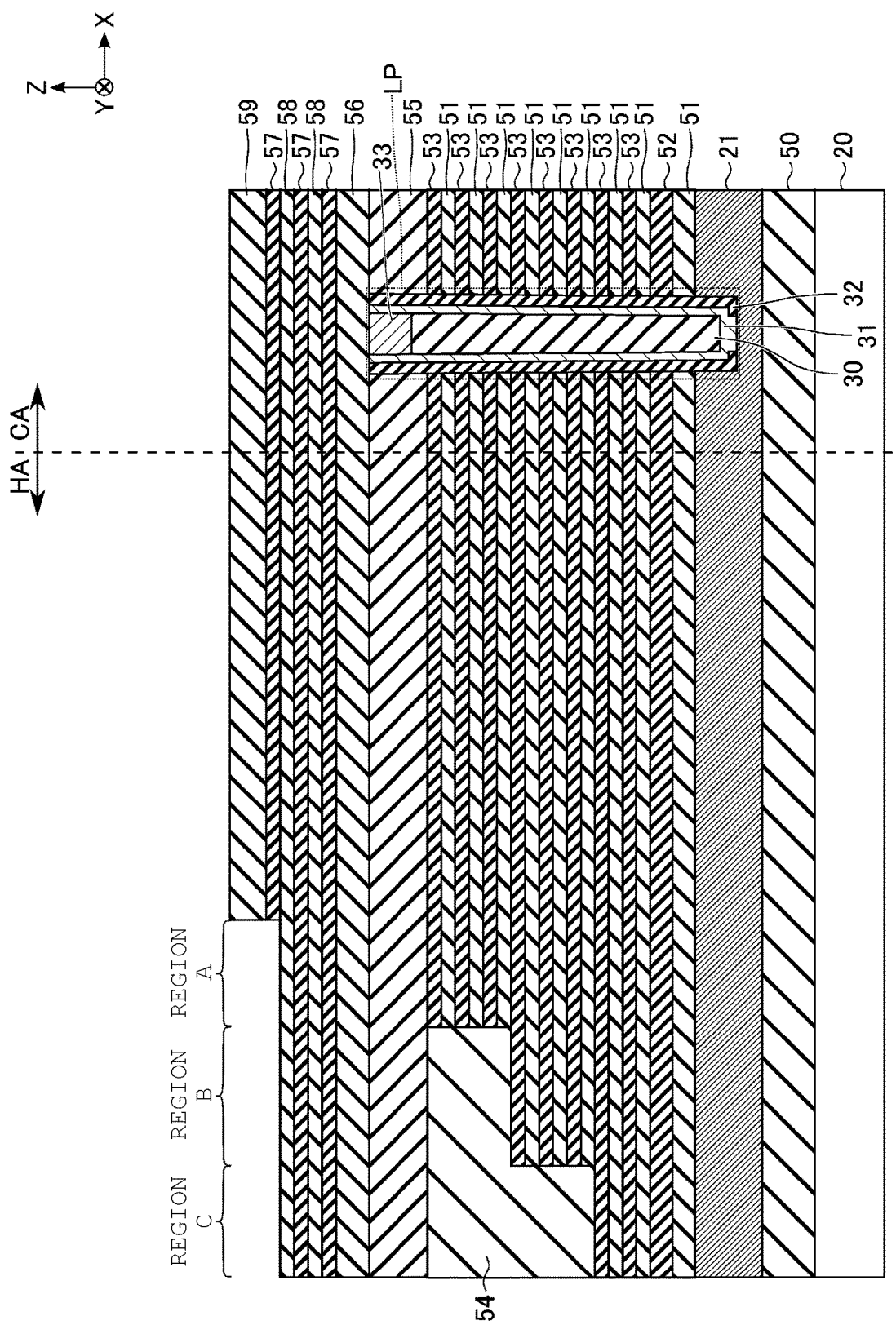
FIG. 13 is a cross-sectional view of the memory cell array illustrating a manufacturing step of the semiconductor storage device according to the first embodiment.

Next, as illustrated in FIG. 13, the insulator layer 59 and the sacrificial material 57 as the uppermost layer corresponding to the regions A to C are removed. Specifically, a mask (not illustrated) is provided on an upper surface of the insulator layer 59, and a portion of the mask corresponding to the regions A to C is removed by lithography. Next, anisotropic etching is performed on the insulator layer 59 and the sacrificial material 57 based on the obtained mask. The position of an end portion of the sacrificial material 57 that is formed in this step and extends along the Y-axis corresponds to the position of an end portion of the conductor layer 24 as the lowermost layer.

Figure 14:
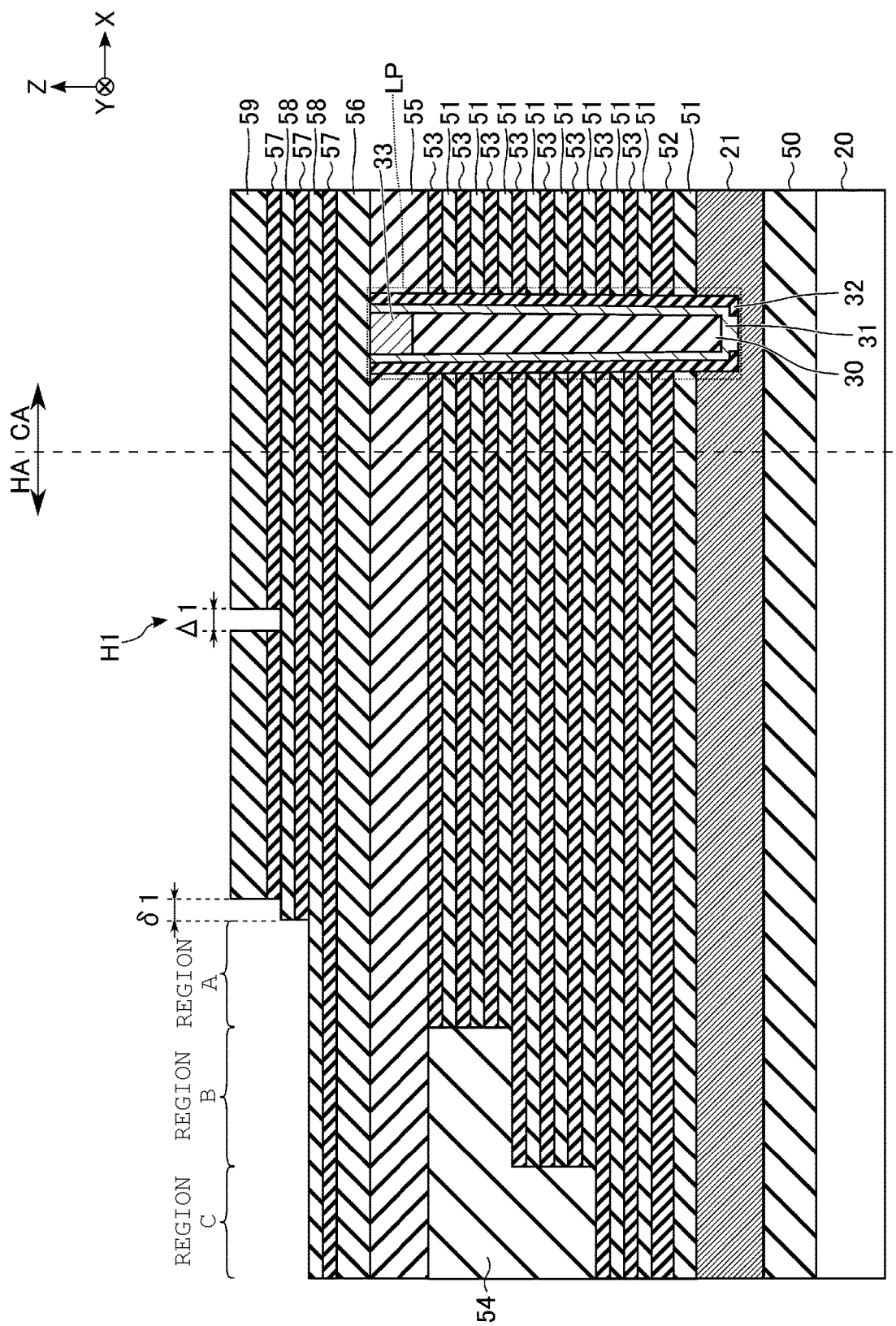
FIG. 14 is a cross-sectional view of the memory cell array illustrating a manufacturing step of the semiconductor storage device according to the first embodiment.
Figure 15:
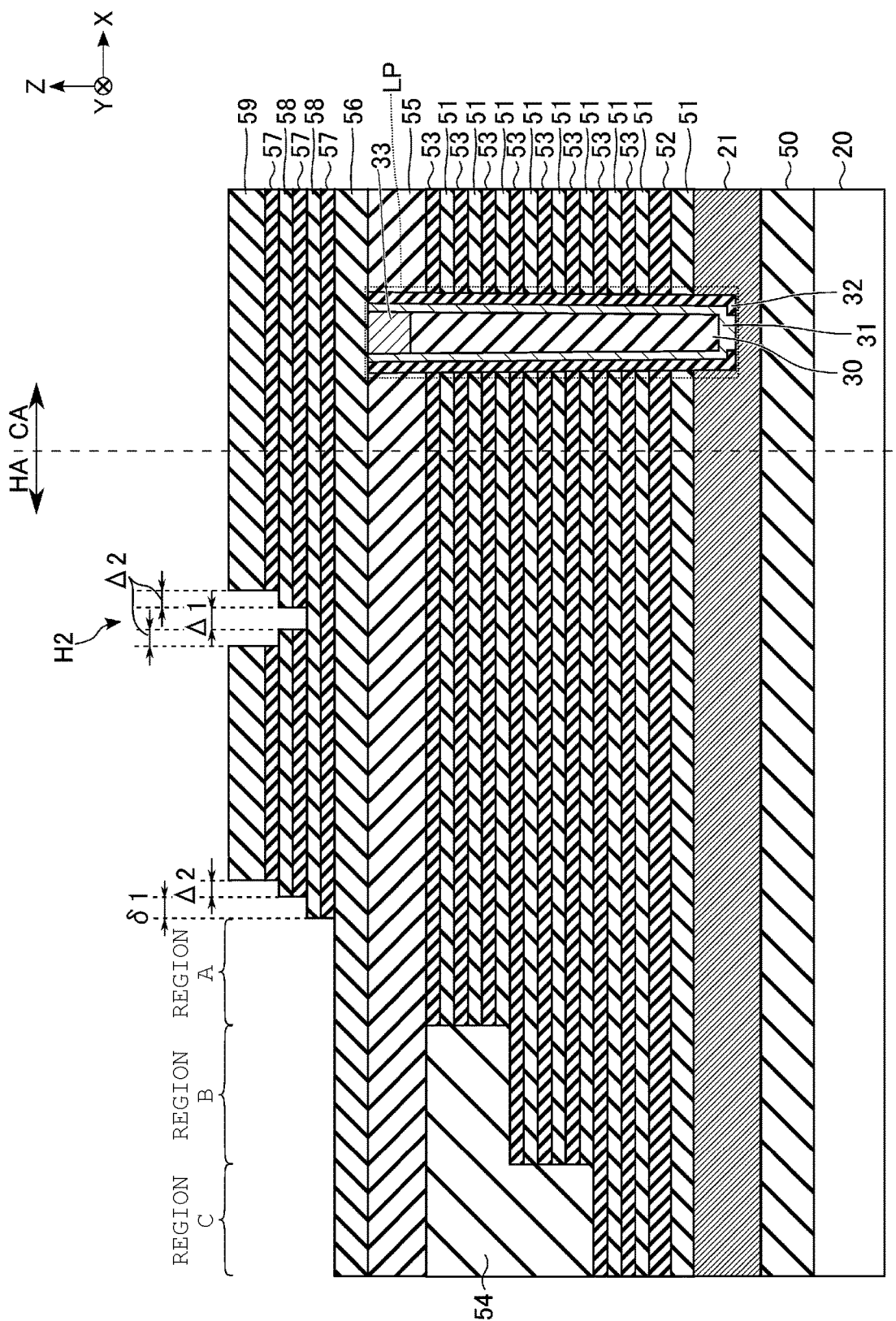
FIG. 15 is a cross-sectional view of the memory cell array illustrating a manufacturing step of the semiconductor storage device according to the first embodiment.
Figure 16:
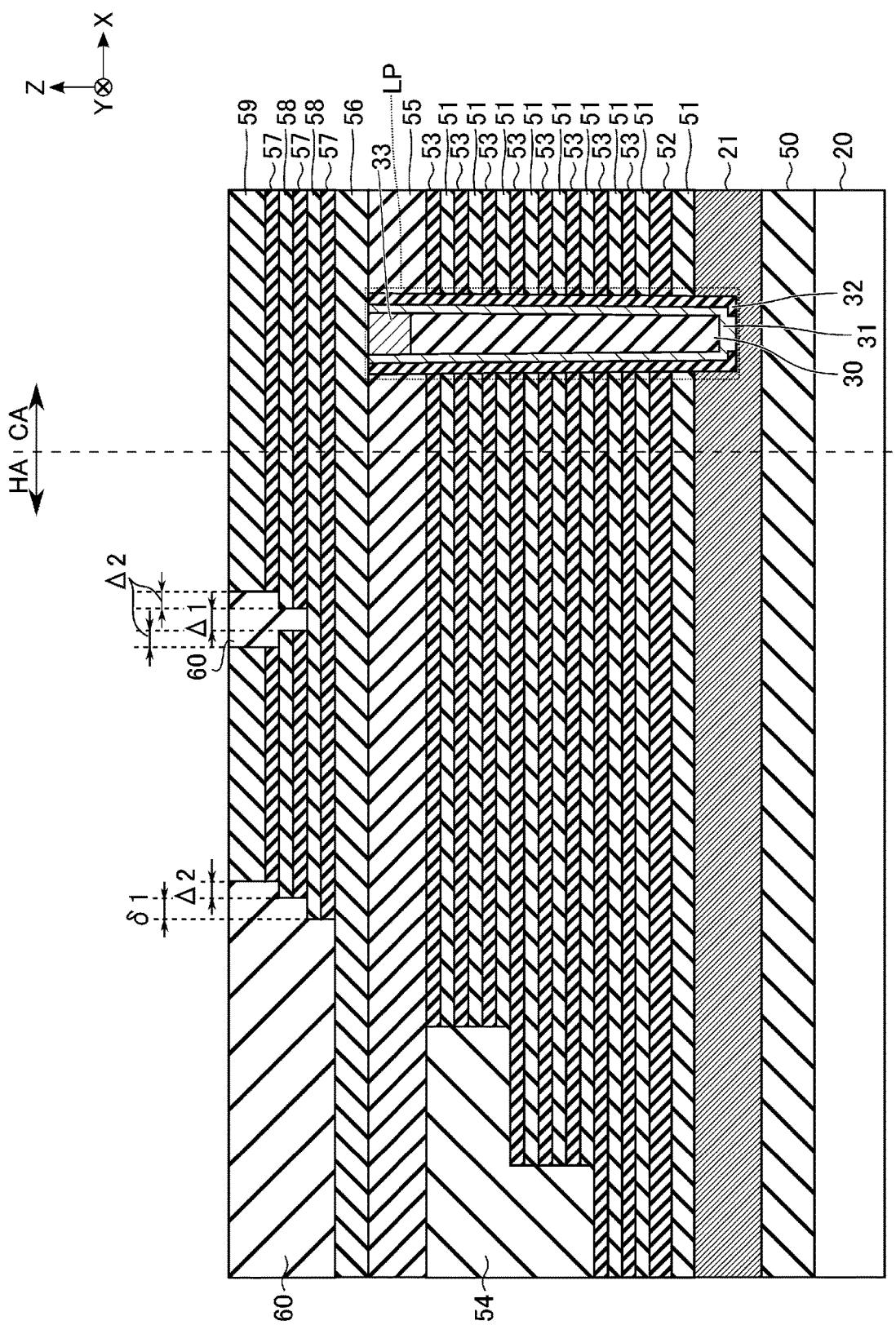
FIG. 16 is a cross-sectional view of the memory cell array illustrating a manufacturing step of the semiconductor storage device according to the first embodiment.

Next, as illustrated in FIGS. 14 to 16, a staircase shape is formed at end portions of the three layers of sacrificial materials 57 in the hookup region HA, and a hole for enabling the contact CC_SGD to reach the conductor layer 24 as the lowermost layer is formed.

Specifically, as illustrated in FIG. 14, in the mask formed in the step described with reference to FIG. 13, a portion corresponding to a region within δ1 from the end portion of the sacrificial material 57 along the X-axis and a portion corresponding to the region having the diameter Δ1 with which the contact CC_SGD is to come into contact on the upper surface of the conductor layer 24 as the lowermost layer are removed by lithography to form a mask pattern. Next, anisotropic etching is performed on the insulator layer 59 and the sacrificial material 57 based on the obtained mask pattern. As a result, the end portion of the sacrificial material 57 as the uppermost layer is shortened along the X-axis by δ1. In addition, a hole H1 including the through via hole having the diameter Δ1 is formed in the sacrificial material 57 as the uppermost layer. In this step, anisotropic etching is, for example, RIE (Reactive Ion Etching).

Next, as illustrated in FIG. 15, by slimming the mask pattern on the insulator layer 59, in the mask pattern, a portion corresponding to a region within Δ2 from the end portion of the sacrificial material 57 as the uppermost layer along the X-axis and a portion corresponding to a region that is isotropically widened from an outer edge of the hole H1 by 42 are removed. Next, anisotropic etching is performed on the insulator layer 59 and the sacrificial material 57 based on the obtained mask pattern. As a result, the end portion of the sacrificial material 57 as the uppermost layer is further shortened along the X-axis by Δ2, and the end portion of the sacrificial material 57 as the second layer from the bottom is further shortened along the X-axis by δ1. In addition, a hole H2 including the through via hole having the diameter Δ1+2Δ2 that is formed in the sacrificial material 57 as the uppermost layer and the through via hole having the diameter Δ1 that is formed in the sacrificial material 57 as the second layer from the bottom is formed. In this step, anisotropic etching is, for example, RIE (Reactive Ion Etching).

Next, as illustrated in FIG. 16, an insulator layer 60 is filled in the portion of the sacrificial material 57 and the insulator layers 58 and 59 removed in the steps described with reference to FIGS. 14 and 15.

Figure 17:
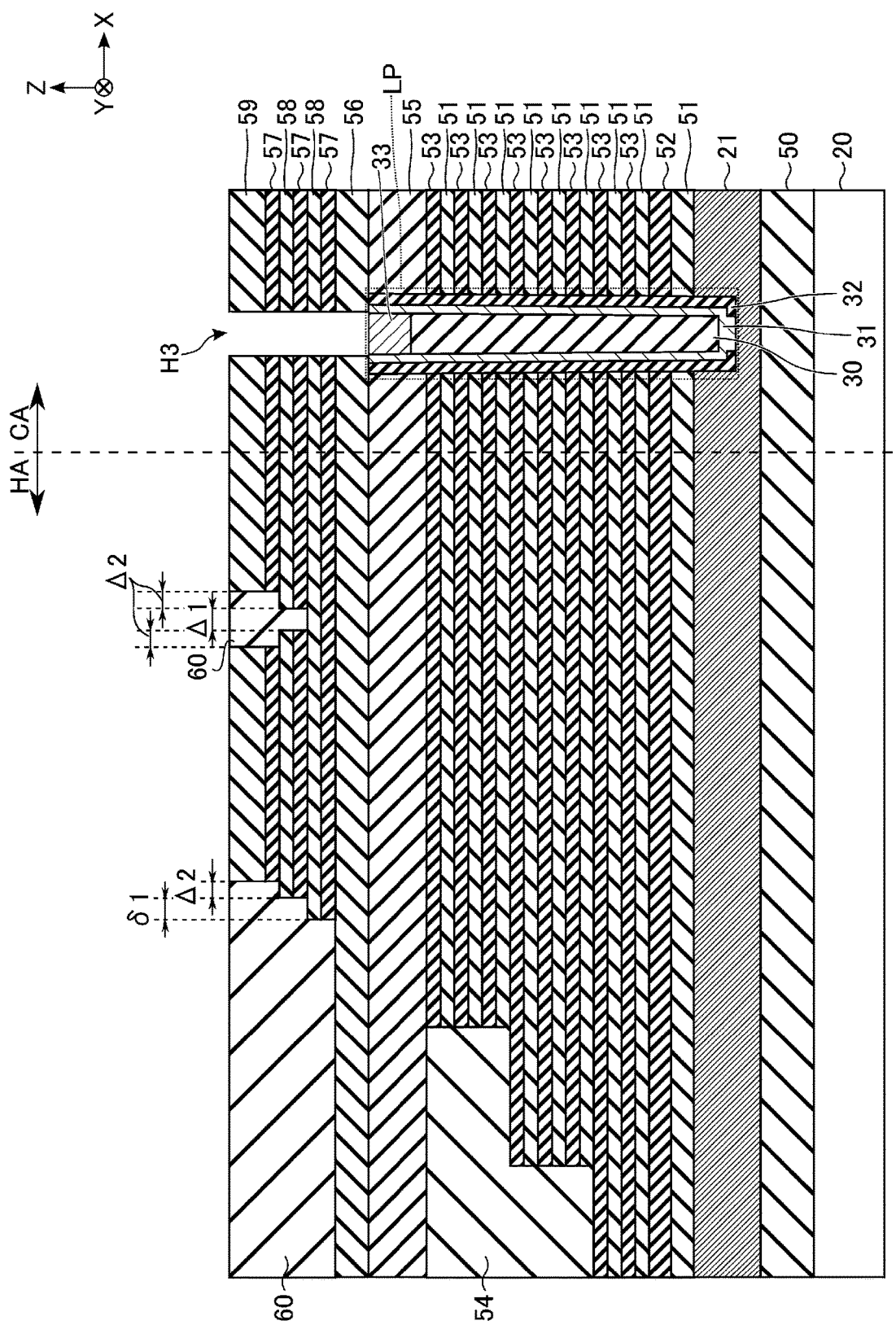
FIG. 17 is a cross-sectional view of the memory cell array illustrating a manufacturing step of the semiconductor storage device according to the first embodiment.

Next, as illustrated in FIG. 17, a SGD hole H3 corresponding to the upper pillar UP is formed. Specifically, first, a mask in which a region corresponding to the SGD hole H3 is open is formed by lithography. Next, the SGD hole H3 is formed by anisotropic etching using the formed mask.

The SGD hole H3 penetrates the insulator layers 59, 58, and 56 and the sacrificial material 57 and reaches the semiconductor portion 33 of the lower pillar LP. In this step, anisotropic etching is, for example, RIE (Reactive Ion Etching).

Figure 18:
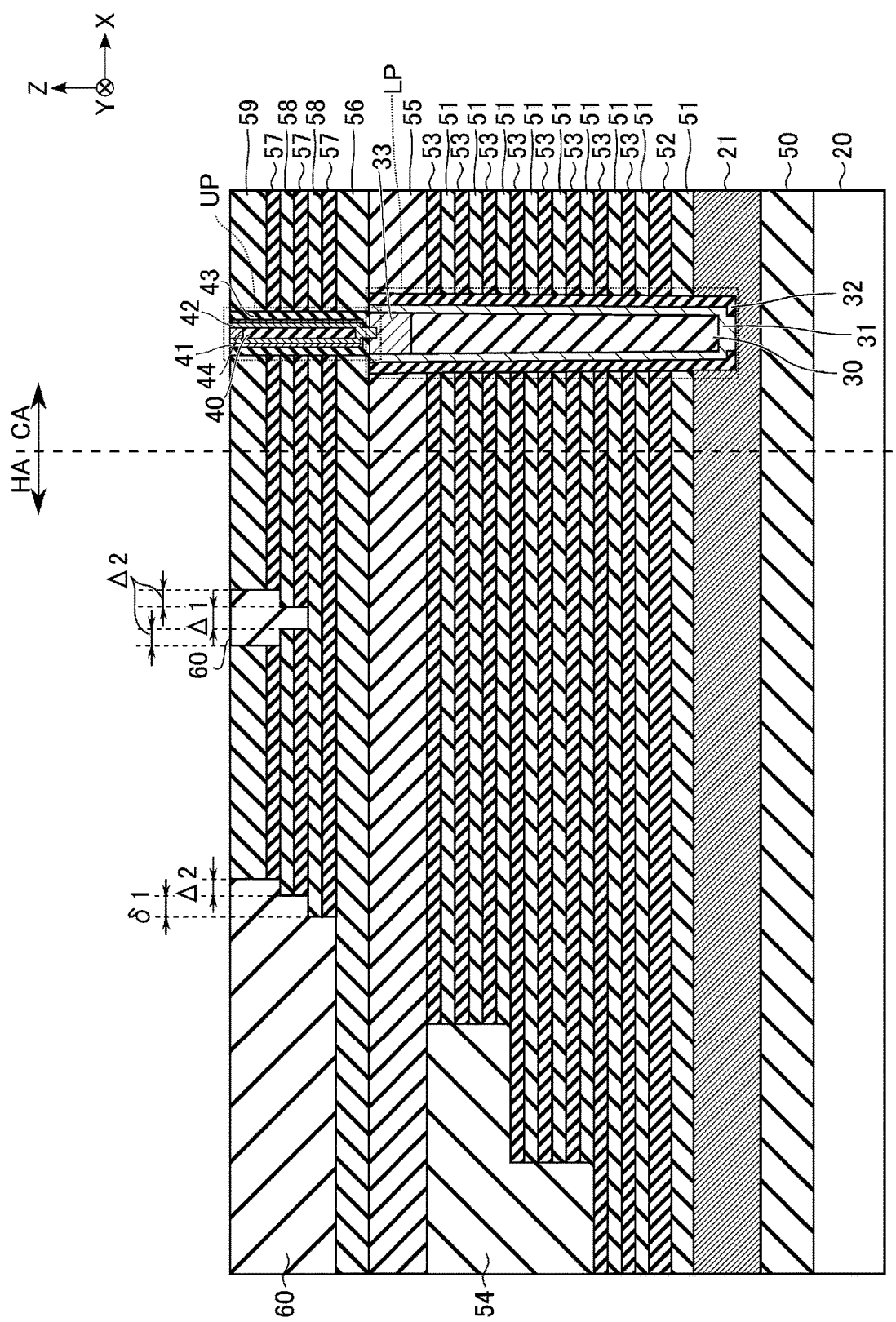
FIG. 18 is a cross-sectional view of the memory cell array illustrating a manufacturing step of the semiconductor storage device according to the first embodiment.

Next, as illustrated in FIG. 18, a stacked structure in the SGD hole H3 is formed. Specifically, the block insulating film 47, the insulating film 46, and the tunnel insulating film 45 are sequentially formed to form the stacked film 43, and then the semiconductor layer 42 is formed. The semiconductor layer 42 and the stacked film 43 in the bottom portion of the SGD hole H3 are removed by anisotropic etching (for example, RIE), and the upper surface of the semiconductor portion 33 is exposed.

Next, in the SGD hole H3, the semiconductor layer 41 is formed to be in contact with the semiconductor portion 33 (e.g., to protrude into the semiconductor portion 33). As a result, the semiconductor layer 31 and the semiconductor layer 41 form a current path (channel path) of a cell current flowing through the inside of the memory pillar MP via the semiconductor portion 33.

Next, the core member 40 is formed on the semiconductor layer 41 in the SGD hole H3. Next, a part of the core member 40 in an upper portion of the SGD hole H3 is removed, and this space is filled with the semiconductor portion 44. The stacked film 43, the semiconductor layer 42, the semiconductor layer 41, the core member 40, and the semiconductor portion 44 that are higher than the insulator layer 59 are removed, for example, by CMP. As a result, the upper pillar UP is formed in the SGD hole H3.

Figure 19:
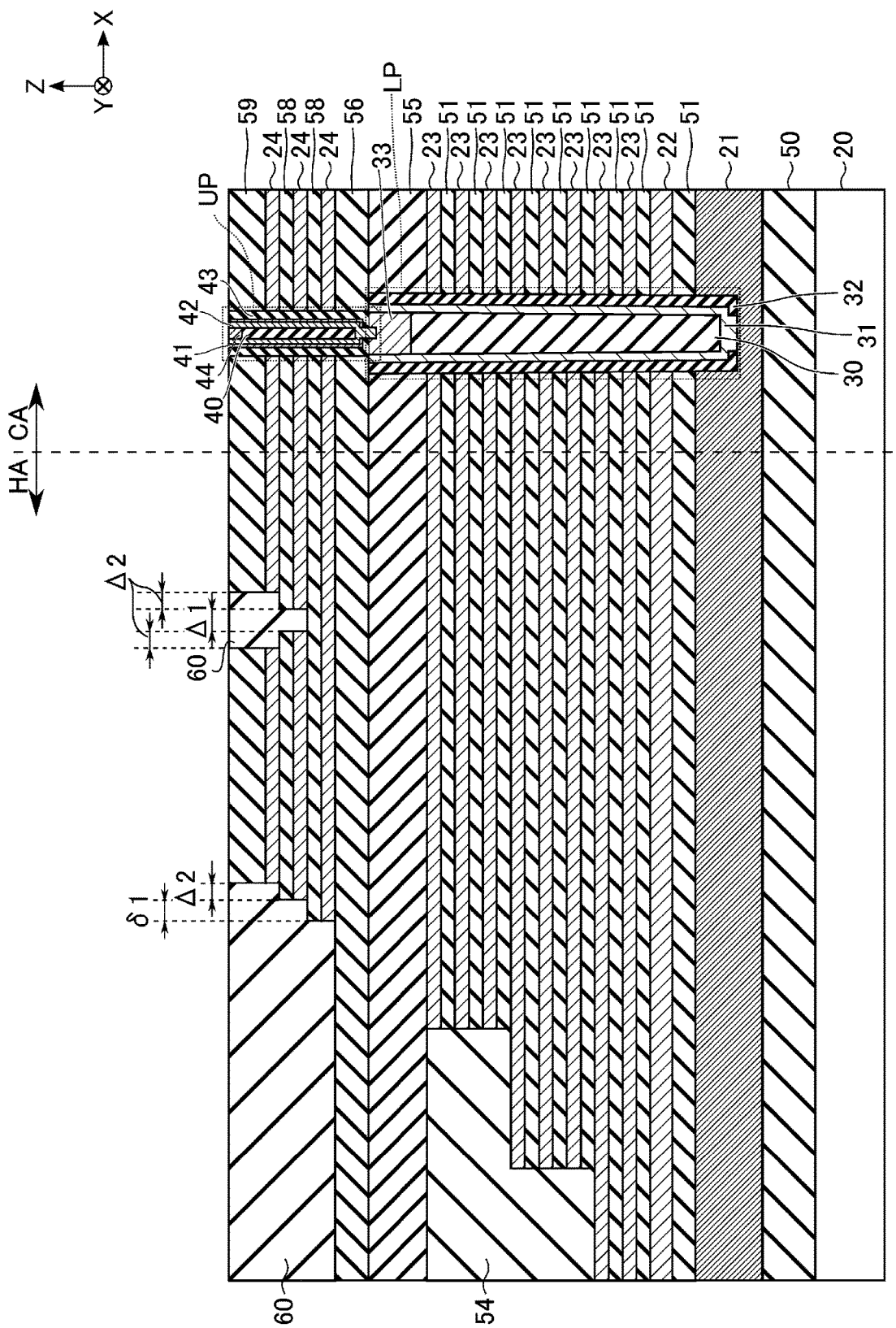
FIG. 19 is a cross-sectional view of the memory cell array illustrating a manufacturing step of the semiconductor storage device according to the first embodiment.

Next, as illustrated in FIG. 19, the sacrificial materials 52, 53, and 57 are replaced with the conductor layers 22 to 24, respectively.

Specifically, first, a hole (not illustrated) corresponding to the slit SLT is formed. The hole formed in this step divides the insulator layers 51, the sacrificial materials 52 and 53, the insulator layers 55 and 56, the sacrificial materials 57, and the insulator layers 58 and 59. Next, a surface of the conductor layer 21 exposed in the hole is oxidized, and a protective oxide film (not illustrated) is formed. Next, the sacrificial materials 52, 53, and 57 are selectively removed, for example, by wet etching using hot phosphoric acid. The structure from which the sacrificial materials 52, 53, and 57 are removed is maintained as a three-dimensional structure by a plurality of memory pillars MP and the like.

Next, the space formed by removing the sacrificial materials 52, 53, and 56 is filled with a conductor via the hole, and an insulator layer corresponding to the slit SLT is formed in the hole. In this step, for example, CVD is used. A portion of the conductor that is formed in the hole and on the upper surface of the insulator layer 59 is removed by an etch-back process. As a result, a conductor formed between adjacent wiring layers is separated, and the conductor layer 22, the conductor layers 23, and the conductor layers 24 are formed. The conductor layers 22, 23, and 24 formed in this step may include a barrier metal. In this case, during the formation of the conductor after the removal of the sacrificial materials 52, 53, and 57, for example, titanium nitride (TiN) is deposited as the barrier metal, and tungsten is formed.

Figure 20:
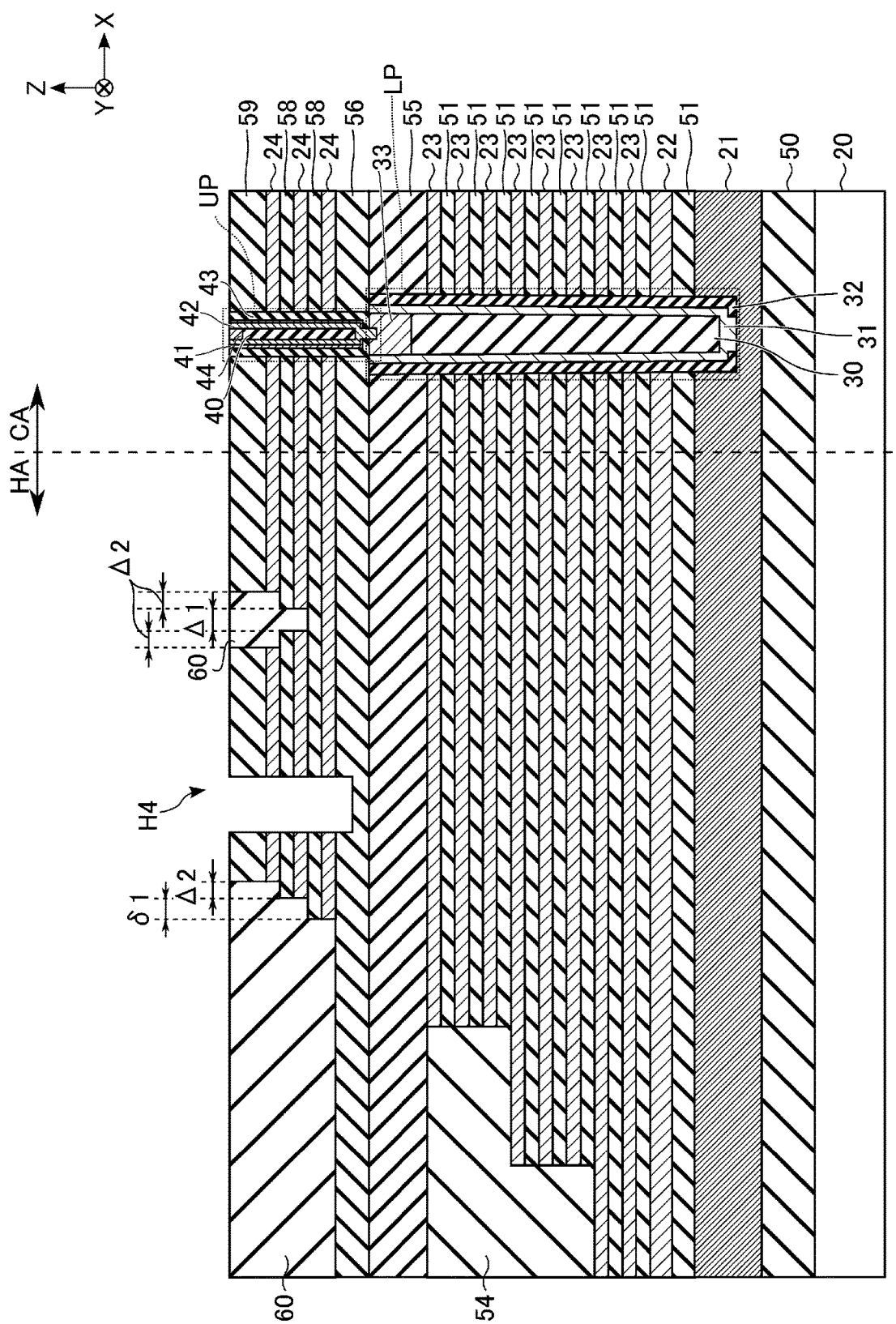
FIG. 20 is a cross-sectional view of the memory cell array illustrating a manufacturing step of the semiconductor storage device according to the first embodiment.

Next, as illustrated in FIG. 20, a hole H4 corresponding to the slits SHE_X and SHE_Y is formed. FIG. 20 illustrates a portion of the hole H4 corresponding to the slit SHE_Y. Specifically, first, a mask in which a region corresponding to the slits SHE_X and SHE_Y is open is formed by lithography. Next, the hole H4 is formed by anisotropic etching (for example, RIE) using the formed mask. The hole H4 formed in this step divides the insulator layers 59 and 58 and the conductor layers 24 and reaches the insulator layer 56 (e.g. extends into the insulator layer 56).

Figure 21:
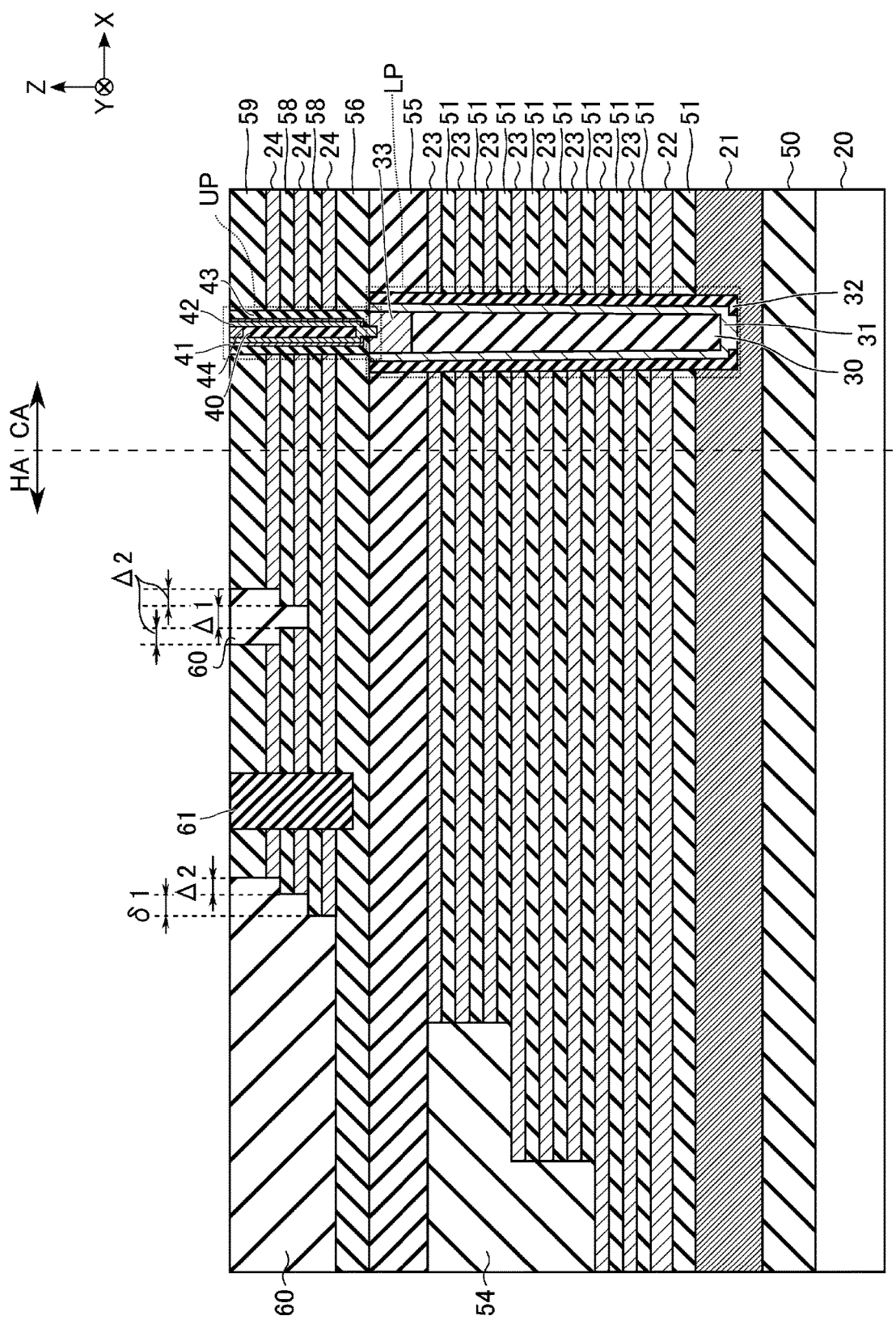
FIG. 21 is a cross-sectional view of the memory cell array illustrating a manufacturing step of the semiconductor storage device according to the first embodiment.

Next, as illustrated in FIG. 21, an insulator layer 61 corresponding to the slits SHE_X and SHE_Y is formed on the insulator layers 59 and 60 to fill the hole H4. The insulator layer 61 formed to be higher than the insulator layers 59 and 60 is removed, for example, by an etch-back process. The insulator layer 61 includes, for example, silicon oxide.

Figure 22:
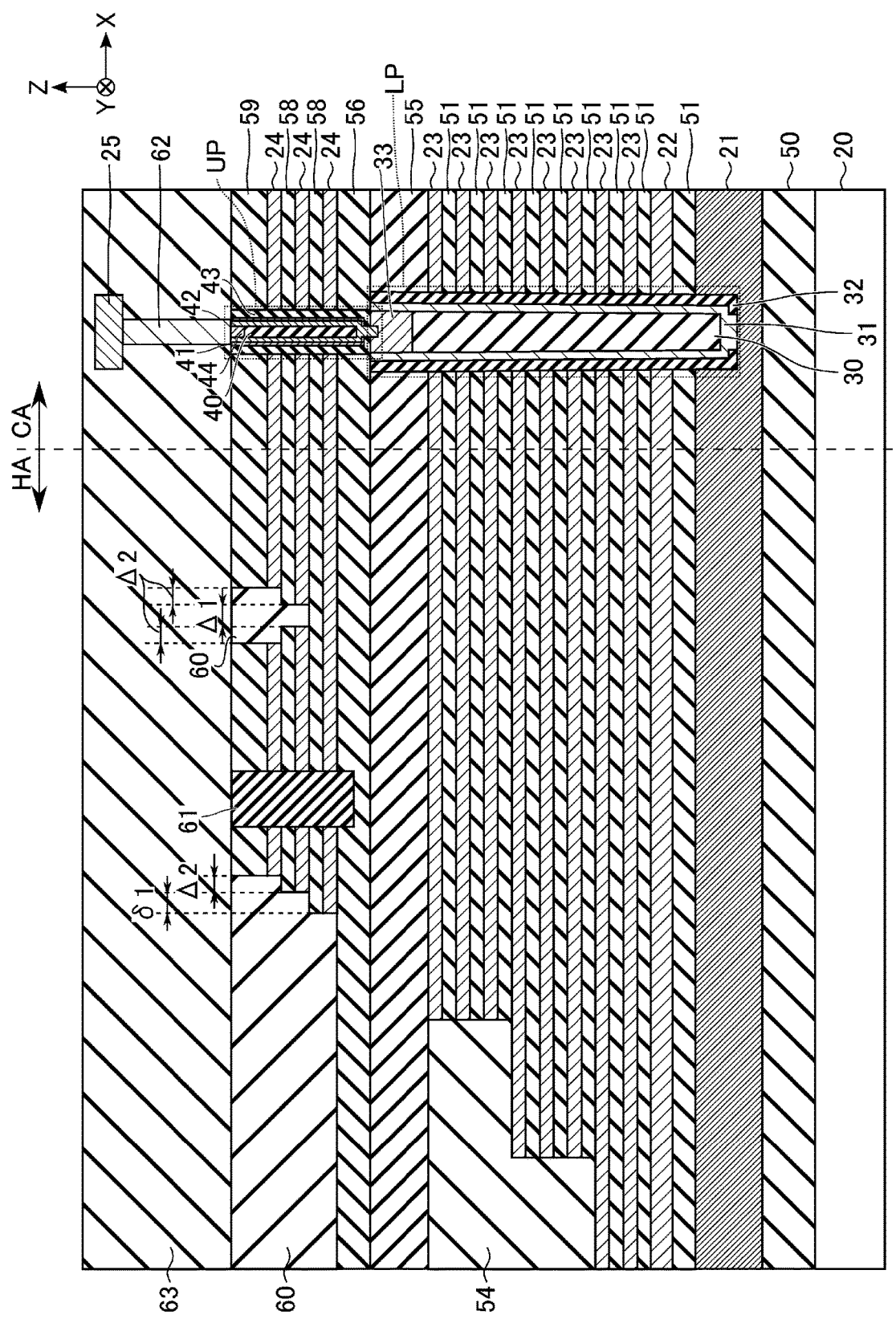
FIG. 22 is a cross-sectional view of the memory cell array illustrating a manufacturing step of the semiconductor storage device according to the first embodiment.

Next, as illustrated in FIG. 22, a conductor layer 62 is formed on an upper surface of the semiconductor portion 44 of the memory pillar MP. While forming the conductor layer 25 on an upper surface of the conductor layer 62, an insulator layer 63 is formed to bury the conductor layer 62 and the conductor layer 25 over the surface.

Figure 23:
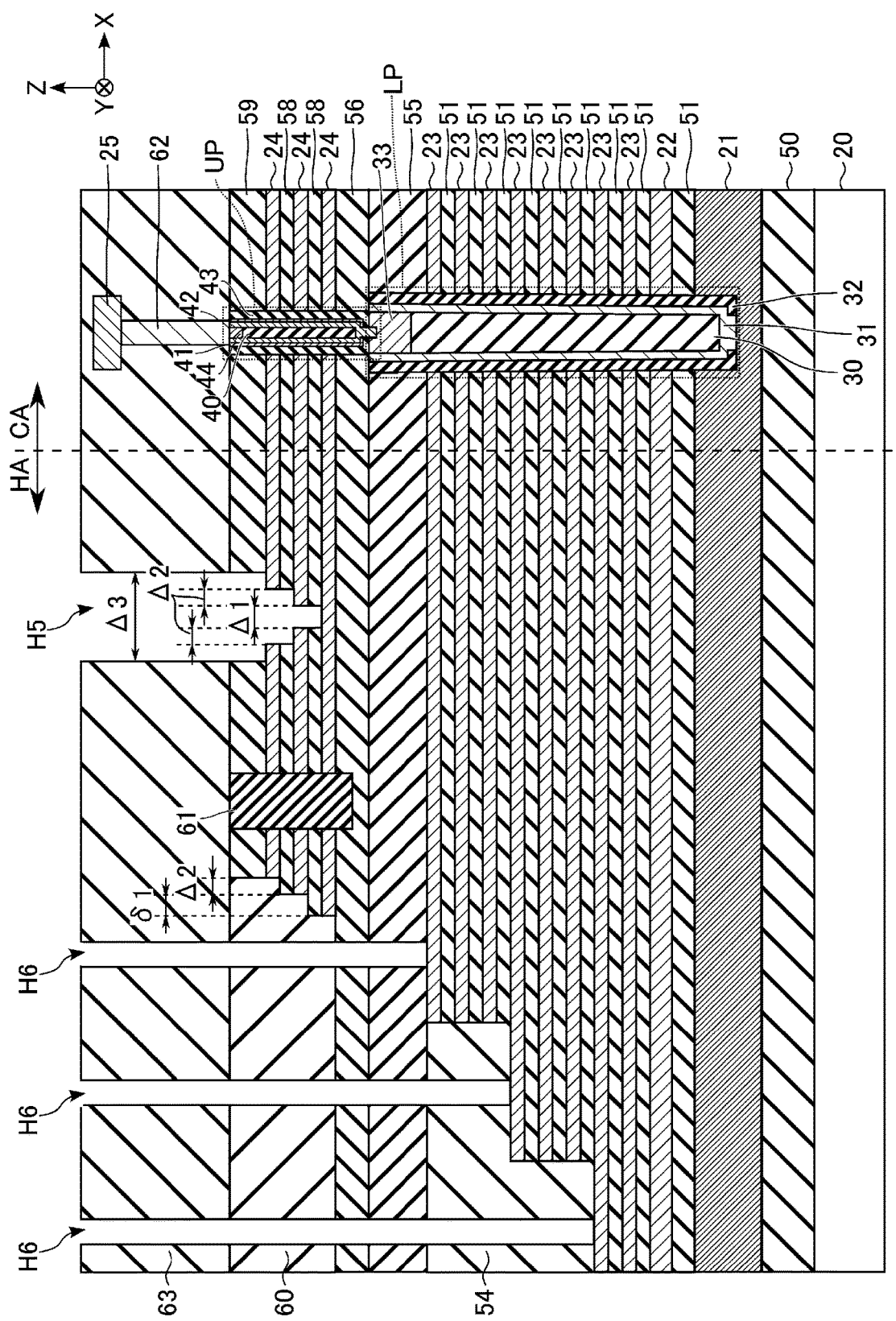
FIG. 23 is a cross-sectional view of the memory cell array illustrating a manufacturing step of the semiconductor storage device according to the first embodiment.

Next, as illustrated in FIG. 23, a plurality of holes H5 corresponding to the contacts CC_SGD0 to CC_SGD3, respectively, and a plurality of holes H6 corresponding to the contacts CC_SGS and CC_WL0 to CC_WL7, respectively, are formed. Among the holes H5 and the holes H6, FIG. 23 illustrates one hole H5 corresponding to the contact CC_SGD0 and three holes H6 corresponding to the contacts CC_WL1, CC_WL4, and CC_WL7.

Specifically, first, a mask in which a region corresponding to the holes H5 and H6 is open is formed by lithography. Next, the holes H5 and H6 are formed by anisotropic etching using the formed mask. An opening corresponding to the hole H6 is formed to include the through via hole having the diameter $\Delta 1+2\Delta 2$ that is formed on the conductor layer 24 as the uppermost layer.

In this step, anisotropic etching is, for example, RIE (Reactive Ion Etching), and a condition where substantially no conductor layers 22 to 24 are etched while selectively removing oxides and nitrides is implemented. As a result, the hole H5 reaches an upper surface of each of the conductor layer 24 as the uppermost layer, the conductor layer 24 as the second layer, and the conductor layer 24 as the lowermost layer. The hole H5 has a diameter $\Delta 3$ on the upper surface of the conductor layer 24 as the uppermost layer, has the diameter $\Delta 1+2\Delta 2$ on the upper surface of the conductor layer 24 as the second layer from the bottom, and has the diameter $\Delta 1$ on the upper surface of the conductor layer 24 as the lowermost layer. The hole H6 penetrates the insulator layers 63, 60, 56, and 55, reaches the conductor layer 23 as the uppermost layer, further penetrates the insulator layer 54, and reaches another conductor layer 23 and the conductor layer 22.

Figure 24:
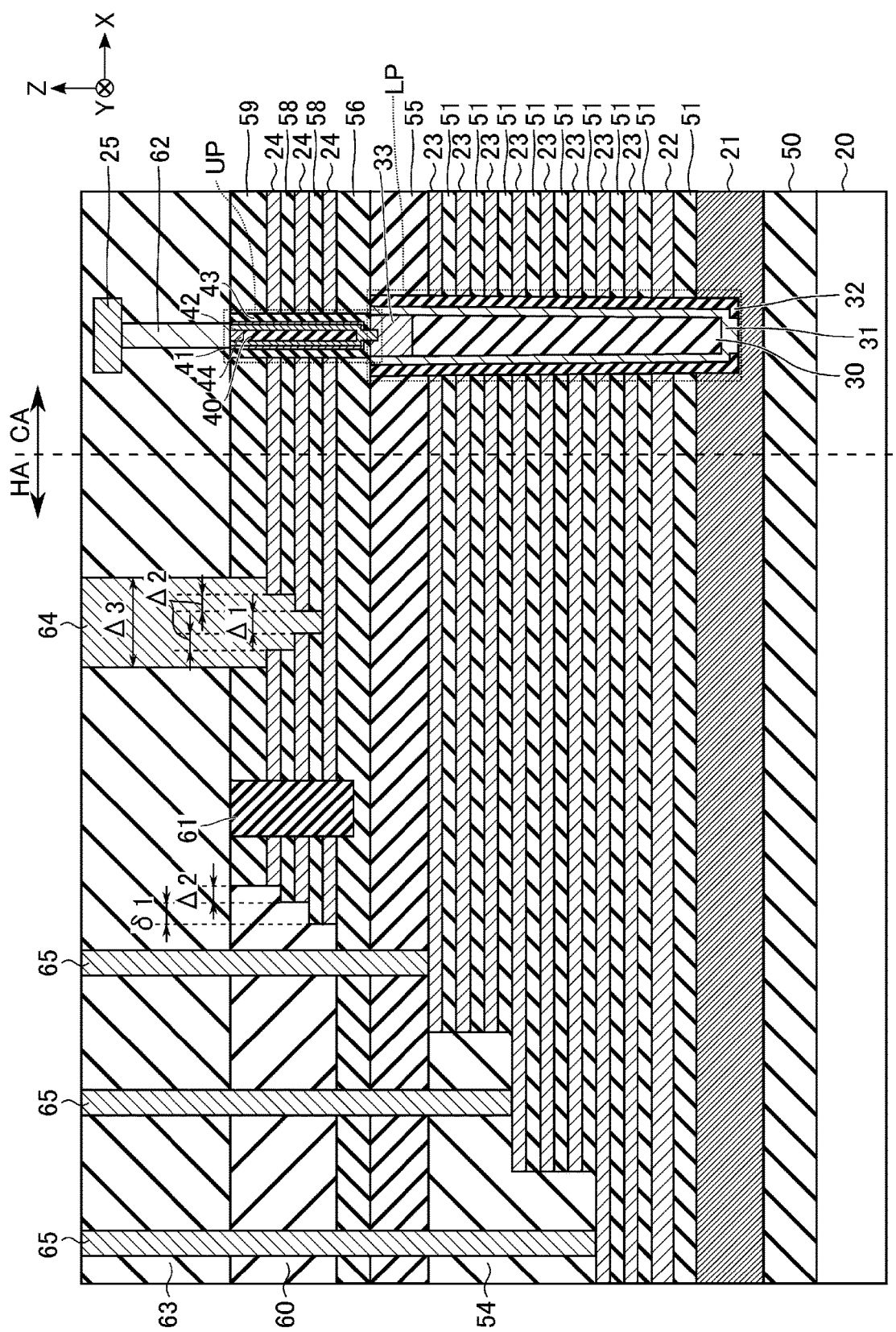
FIG. 24 is a cross-sectional view of the memory cell array illustrating a manufacturing step of the semiconductor storage device according to the first embodiment.

Next, as illustrated in FIG. 24, conductor layers 64 and 65 are formed to fill the inside of the holes H5 and H6. Next, the conductor layers 64 and 65 that are higher than the insulator layer 63 are removed.

In the manufacturing steps of the semiconductor storage device according to the first embodiment described above, the memory pillar MP, the source line SL, the word lines WL, and the select gate lines SGS and SGD connected to the memory pillar MP, and the contacts CC_SGS, CC_WL0 to CC_WL7, and CC_SGD0 to CC_SGD3 are formed. The manufacturing steps described above are merely exemplary. Another process may be inserted between the manufacturing steps, and the order of the manufacturing steps may be switched within a range where no problems arise.

1.3 Effect of Embodiment

With the configuration of the first embodiment, the select gate lines SGD and the contact CC_SGD can be connected to each other in an improved manner. More specifically, the contact CC_SGD is in contact with the upper surfaces of the conductor layers 24 that function as the select gate lines SGD, respectively. Therefore, a sufficient contact area with the conductor layers 24 can be sufficiently secured. Therefore, the resistance of the connection portions can be reduced.

In addition, all the conductor layers 24 can be electrically connected by one contact CC_SGD. Therefore, a terrace region for forming the contact CC_SGD can be omitted from the conductor layers 24. Therefore, the lengths of the select gate lines SGD along the X-axis can be shortened.

In addition, in order to form the above-described contact CC_SGD, the step of performing etching based on the mask pattern formed by slimming is appropriately repeated according to the number of the select gate lines SGD stacked. As a result, in the sacrificial materials 57, the through via hole of which the diameter decreases stepwise toward the lower layer is formed, and a staircase shape having a terrace width corresponding to the diameter of the through via hole is formed. The difference $\Delta 2$ between the diameter of the through via hole of the sacrificial material 57 as the second layer from the bottom and the diameter of the through via hole of the sacrificial material 57 as the uppermost layer matches the difference $\Delta 2$ between the length of the sacrificial material 57 as the second layer from the bottom and the length of the sacrificial material 57 as the uppermost layer along the X-axis.

In addition, with the configuration of the first embodiment, the slit SHE includes the slit SHE_X that extends along the X-axis and the slit SHE_Y that extends along the Y-axis. As a result, the select gate lines SGD are divided into the select gate lines SGD0 to SGD3 that correspond to the string units SU0 to SU3, respectively, and the select gate line SGDX that does not correspond to any string unit SU and is located at the end portion of the select gate lines SGD along the X-axis. Therefore, the slit SHE_X can insulate and divide the select gate lines SGD for each of the string units SU without dividing all the select gate lines SGD along the X-axis (without dividing all the select gate lines SGD up to the slit SHE_Y).

Figure 25:
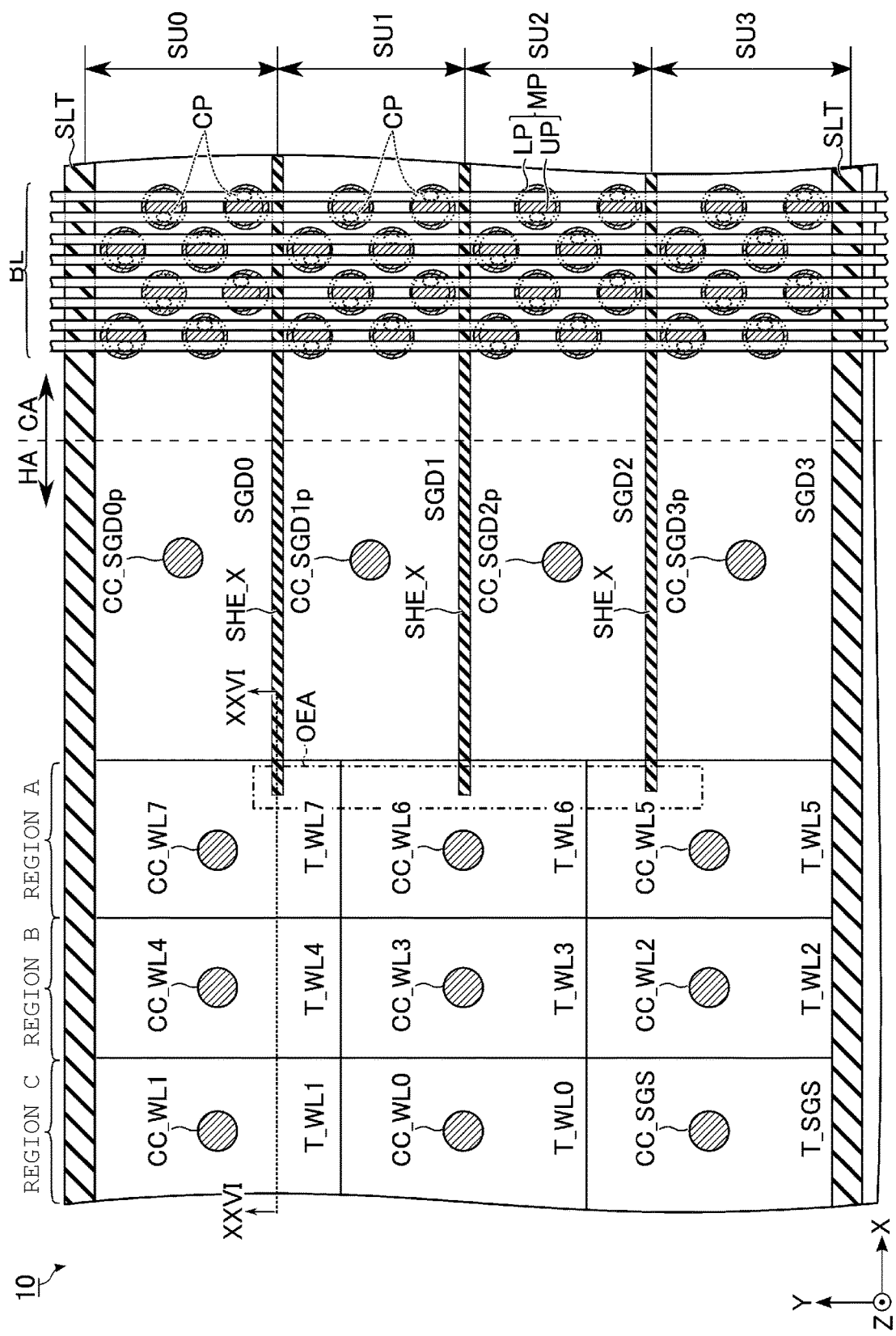
FIG. 25 is a plan view illustrating a memory cell array according to a comparative example when seen from the top to describe the effects of the semiconductor storage device according to the first embodiment.
Figure 26:
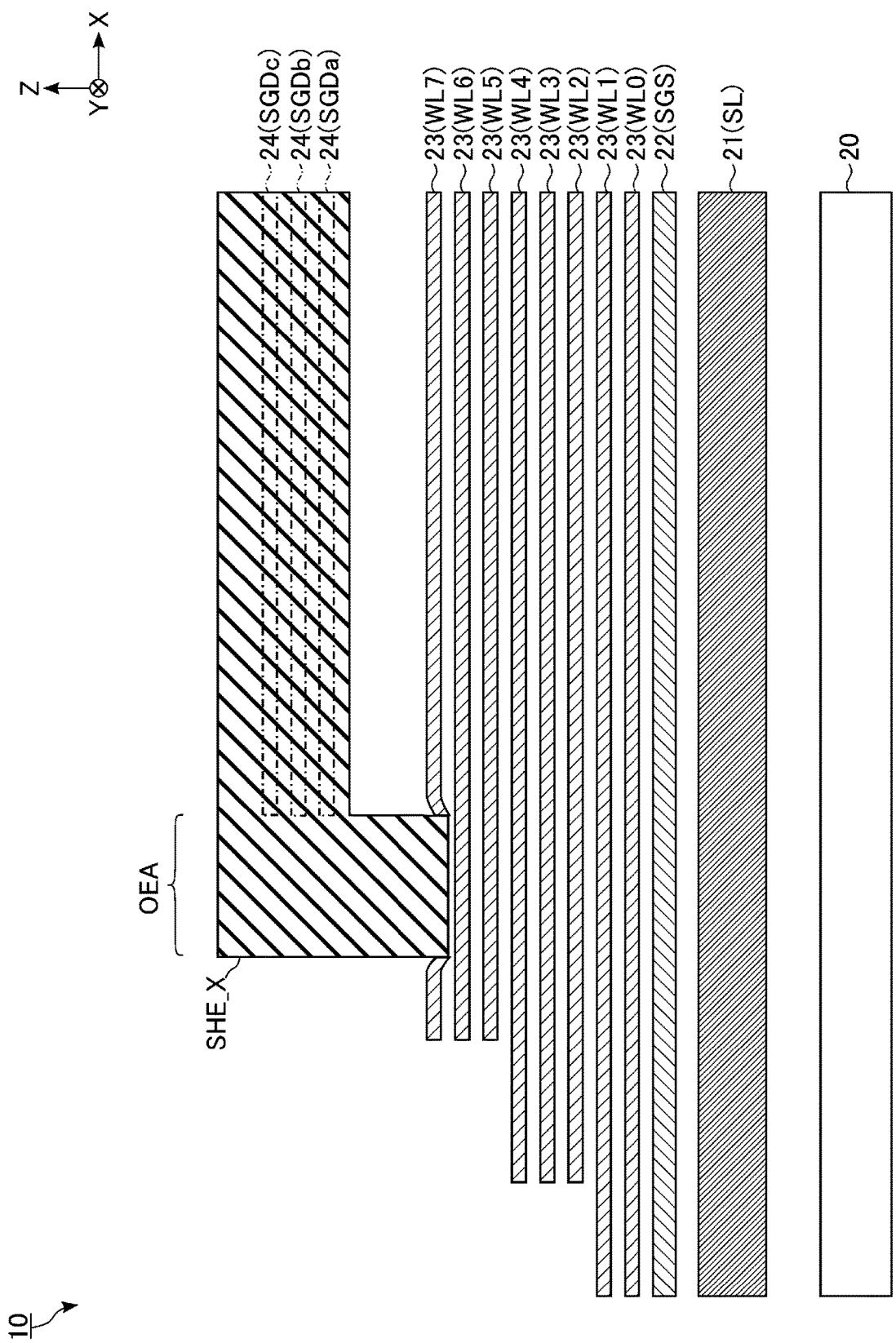
FIG. 26 is a cross-sectional view illustrating a hookup region of the memory cell array taken along line XXVI-XXVI of FIG. 25.

The effects of the configuration will be further described using FIGS. 25 and 26. FIG. 25 illustrates a comparative example to describe the effects of the semiconductor storage device according to the first embodiment and corresponds to FIG. 3 of the first embodiment. FIG. 26 is a cross-sectional view taken along line XXVI-XXVI of FIG. 25. In the comparative examples of FIGS. 25 and 26, each of a plurality of slits SHE_X extends along the X-axis to be longer than a plurality of conductor layers 24. As a result, the slits SHE_X divide the wiring layers corresponding to the select gate lines SGD into the select gate lines SGD0 to SGD3 without forming the select gate lines SGDX such that the select gate lines SGD0 to SGD3 are insulated and separated from each other. Accordingly, the insulator layer corresponding to the slit SHE_Y that divides the three layers of conductor layers 24 in the hookup region HA along the Y direction is not present. In the comparative example of FIGS. 25 and 26, a contact CC_SGDp extends upward from the upper surface of the conductor layer 24 as the lowermost layer and is in contact with a side surface of another conductor layer 24.

As can be seen from FIG. 25, when the slit SHE_Y is not formed, the slit SHE_X reaches a region OEA not including the three layers of conductor layers 24 in a plan view. In addition, as can be seen from FIG. 26, in the region OEA, a stacked structure is formed with an oxide or a nitride and a metal layer is not provided up to a depth of the conductor layers 23.

Under an etching condition that is applied to the formation of the hole H4 corresponding to the slit SHE_X, etching rapidly progresses in the stacked structure formed of an oxide or a nitride, but etching is not likely to progress in the metal layer. Therefore, during the formation of the hole H4, the region OEA may be over-etched up to a depth of the conductor layers 23. In this case, the conductor layers 23 have a distorted shape after etching such that an unintended leakage current or the like may be generated.

According to the first embodiment, by forming the slit SHE_Y, the slit SHE_X does not reach the region OEA. As a result, the layer structure that is etched during the formation of the hole H4 is limited to a region including the three layers of conductor layers 24 in a plan view. Therefore, the etching of the hole H4 up to the conductor layers 23 can be avoided from progressing up to the conductor layers 23. Accordingly, the slit SHE_X and the conductor layers 23 can be prevented from having a distorted shape, and the generation of an unintended leakage current in the conductor layers 23 can be prevented.

1.4 Modification Example

The above-described first embodiment may be modified in various ways.

1.4.1 First Modification Example

In the description of the first embodiment, the structure in which the contact CC_SGD is in contact with the upper surface of each of the conductor layers 24 is provided, but the present disclosure is not limited thereto. For example, a via having a sufficient contact area with a side surface of each of the conductor layers 24 may be formed, and a contact may be formed on an upper surface of the via. In the following description, the same configuration and manufacturing method as those of the first embodiment will not described, and different points from those of the first embodiment will be mainly described.

Figure 27:
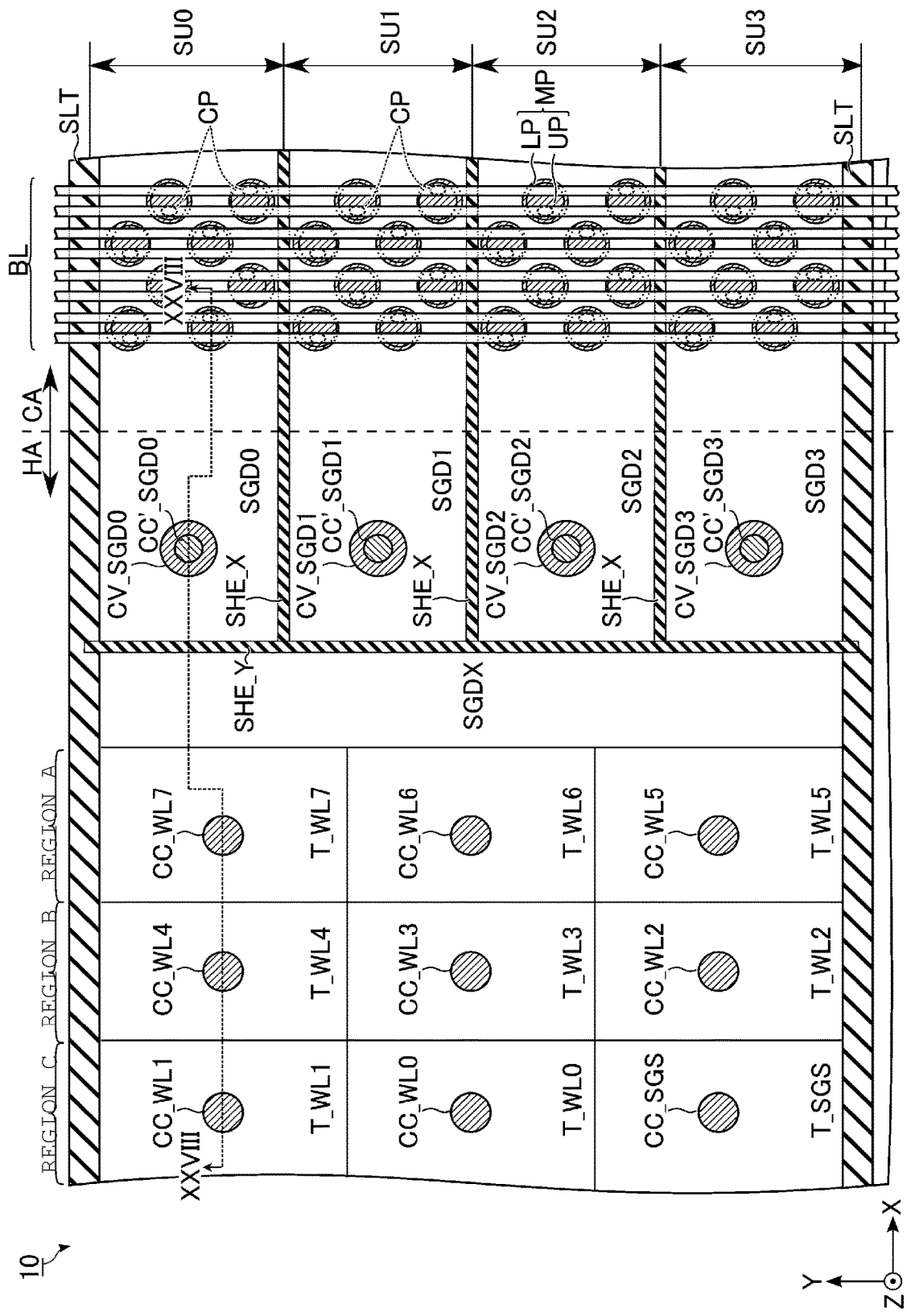
FIG. 27 is a plan view illustrating a memory cell array of a semiconductor storage device according to a first modification example of the first embodiment when seen from the top.

FIG. 27 is a plan view illustrating a planar layout of a memory cell array of a semiconductor storage device according to a first modification example of the first embodiment and corresponds to FIG. 3 of the first embodiment.

As illustrated in FIG. 27, vias CV_SGD0 to CV_SGD3 are in contact with the select gate lines SGD0 to SGD3, respectively. Contacts CC'_SGD0 to CC'_SGD3 are provided on upper surfaces of the vias CV_SGD0 to CV_SGD3. The diameter of the via CV_SGD is more than that of the contact CC'_SGD.

Figure 28:
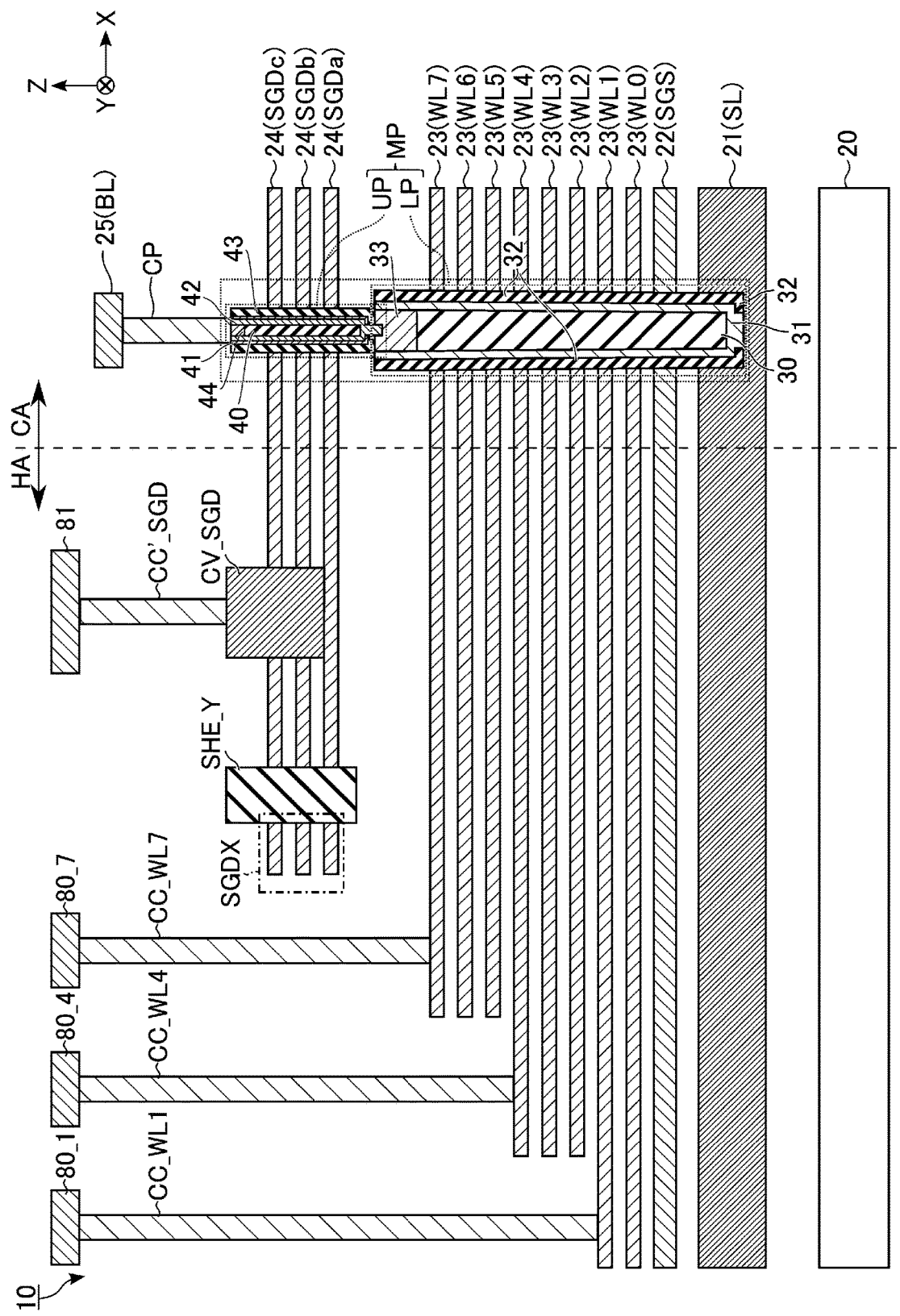
FIG. 28 is a cross-sectional view illustrating a hookup region of the memory cell array taken along line XXVIII-XXVIII of FIG. 27.

FIG. 28 illustrates an example of a cross-sectional structure of the memory cell array 10 of FIG. 27 taken along line XXVIII-XXVIII and corresponds to FIG. 7 of the first embodiment. As illustrated in FIG. 28, the via CV_SGD is provided on the upper surface of the conductor layer 24 as the lowermost layer and extends in the other conductor layers 24 (in the example of FIG. 28, the conductor layer 24 as the second layer from the bottom and the conductor layer 24 as the uppermost layer) excluding the conductor layer 24 as the lowermost layer along the Z-axis. That is, the via CV_SGD is in contact with the upper surface of the conductor layer 24 as the lowermost layer and is in contact with side surfaces of the other conductor layers 24.

As described above, the diameter of the via CV_SGD is more than that of the contact CC'_SGD. Therefore, a sufficient contact area with the conductor layers 24 in contact with the via on the side surfaces can be secured. As a result, the contact resistance between the select gate lines SGD and the contact CC'_SGD can be reduced.

In addition, the conductor layers 24 are electrically connected to the contact CC'_SGD using one via CV_SGD. Therefore, it is not necessary to form the conductor layers 24 stepwise in order to form a plurality of contacts corresponding to the conductor layers 24, respectively. As a result, the area of a region for forming the contact CC'_SGD can be further reduced as compared to a case where the contact CC'_SGD is formed for each of the conductor layers 24. Accordingly, as in the first embodiment, the configuration in which the conductor layers 24 are divided into the portion corresponding to the select gate lines SGD0 to SGD3 and the portion corresponding to the select gate line SGDX by the slits SHE_X and SHE_Y can be applied. Accordingly, during the formation of the slit SHE_X, the occurrence of shape abnormality in the conductor layer 23 caused by over-etching can be prevented.

In the first modification example, the via CV_SGD does not adopt the structure in contact with the upper surface of each of the conductor layers 24. Therefore, in the first modification example, it is not necessary that the step of performing etching using the mask pattern formed by slimming is repeatedly performed on the plural layers of sacrificial materials 57. Therefore, end portions of the conductor layers 24 along the −X direction can have a shape having the same length without forming a staircase shape.

1.4.2 Second Modification Example

In addition, in the description of the first modification example, the select gate lines SGD and the contact CC_SGD are shunted from each other using the via CV_SGD, but the present disclosure is not limited thereto. In the following description, the same configuration and manufacturing method as those of the first modification example of the first embodiment will not described, and different points from those of the first modification example of the first embodiment will be mainly described.

Figure 29:
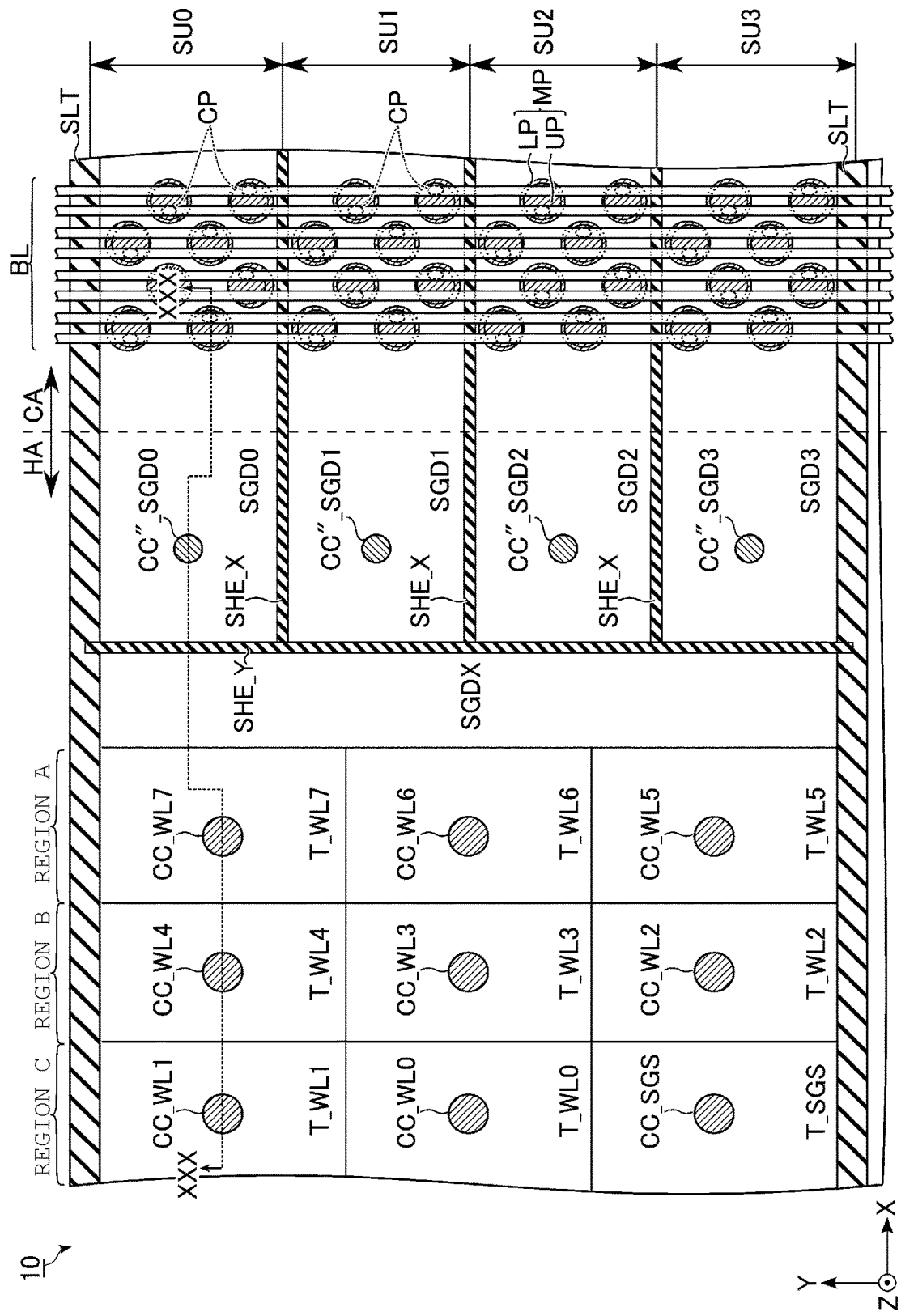
FIG. 29 is a plan view illustrating a memory cell array of a semiconductor storage device according to a second modification example of the first embodiment when seen from the top.

FIG. 29 is a plan view illustrating a planar layout of a memory cell array of a semiconductor storage device according to a second modification example of the first embodiment and corresponds to FIG. 27 of the first modification example of the first embodiment.

As illustrated in FIG. 29, contacts CC"_SGD0 to CC"_SGD3 are in contact with the select gate lines SGD0 to SGD3, respectively.

Figure 30:
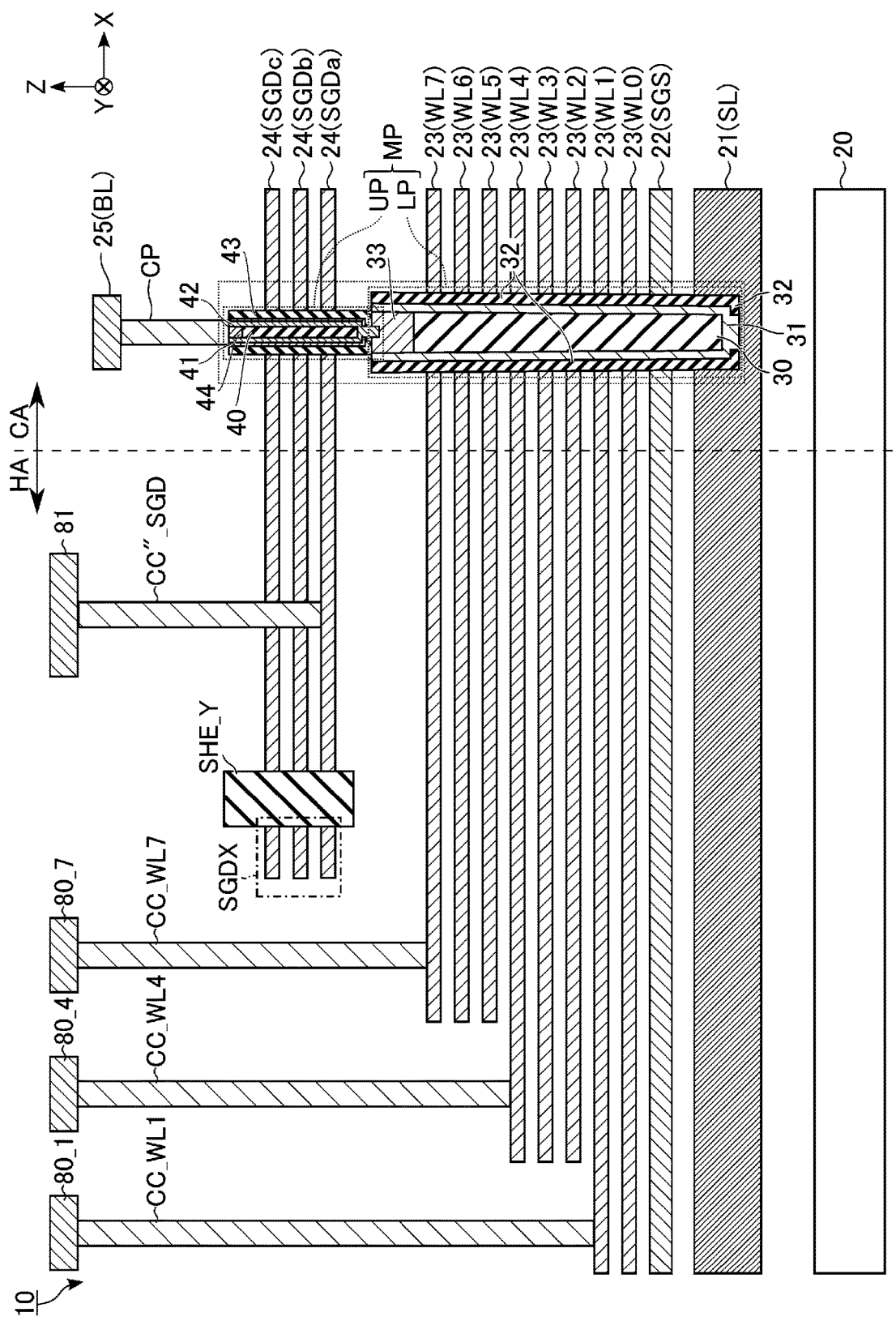
FIG. 30 is a cross-sectional view illustrating a hookup region of the memory cell array taken along line XXX-XXX of FIG. 29.

FIG. 30 illustrates an example of a cross-sectional structure of the memory cell array 10 of FIG. 29 taken along line XXX-XXX and corresponds to FIG. 28 of the first modification example of the first embodiment. As illustrated in FIG. 30, the contact CC"_SGD is provided on the upper surface of the conductor layer 24 as the lowermost layer and extends in the other conductor layers 24 (in the example of FIG. 30, the conductor layer 24 as the second layer from the bottom and the conductor layer 24 as the uppermost layer) excluding the conductor layer 24 as the lowermost layer along the Z-axis. That is, the contact CC"_SGD is in contact with the upper surface of the conductor layer 24 as the lowermost layer and is in contact with side surfaces of the other conductor layers 24. For example, the diameter of the contact CC"_SGD is substantially the same as that of the contact CC_WL.

As described above, certain effects similar to those of the first embodiment and the first modification example of the first embodiment can be exhibited with the configuration where the side surfaces of the select gate lines SGD and the contact CC_SGD are in direct contact with each other.

2. Second Embodiment

Next, a semiconductor storage device according to a second embodiment will be described. The second embodiment is different from the second modification example of the first embodiment, in that both of a hole for forming the contact CC_SGD connected to the select gate lines SGD and a hole for forming the slit SHE are formed. In the following description, the same configuration and manufacturing method as those of the second modification example of the first embodiment will not be described, and different points from those of the second modification example of the first embodiment will be mainly described.

2.1 Configuration of Semiconductor Storage Device

Figure 31:
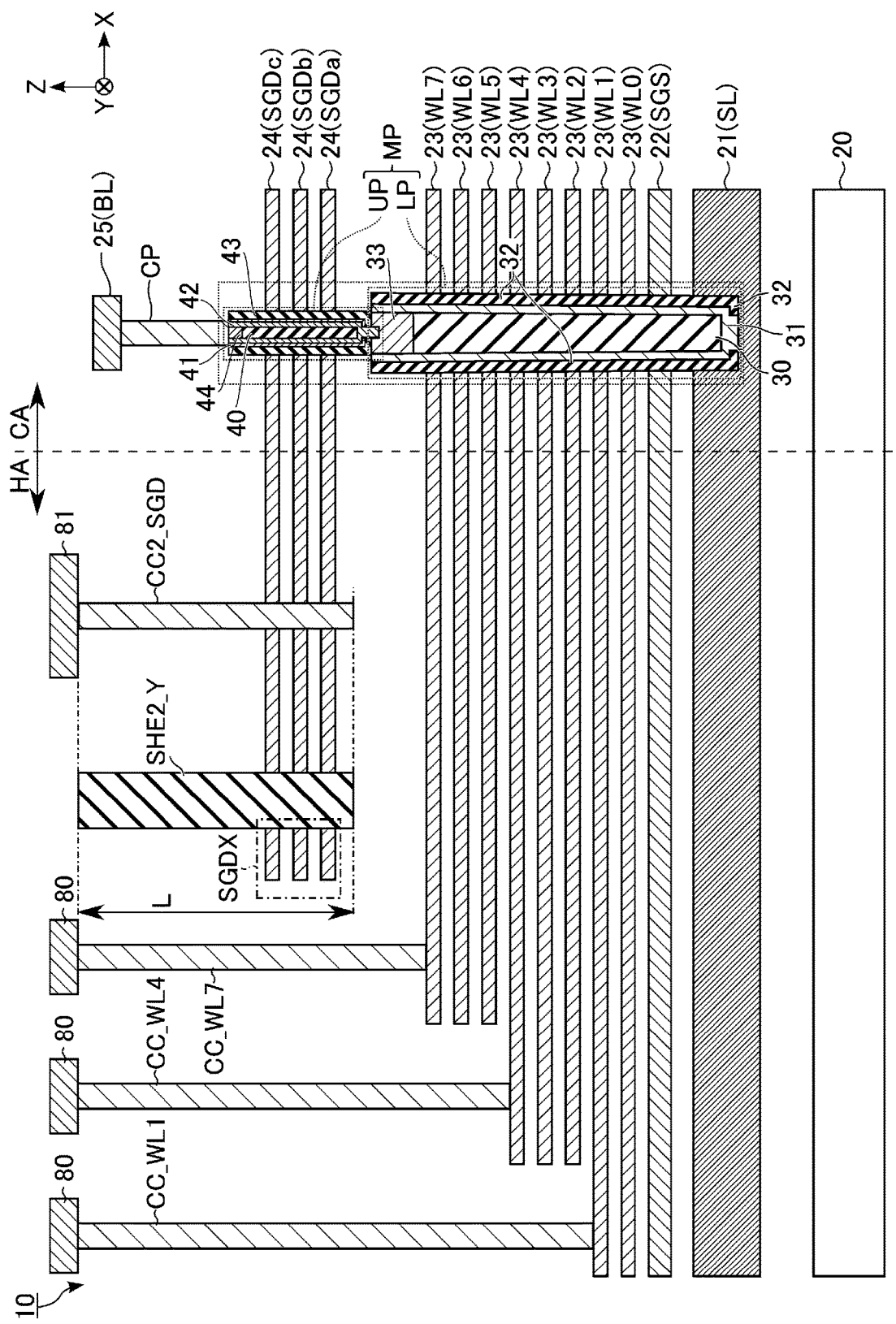
FIG. 31 is a cross-sectional view illustrating a hookup region of a memory cell array of a semiconductor storage device according to a second embodiment.
Figure 32:
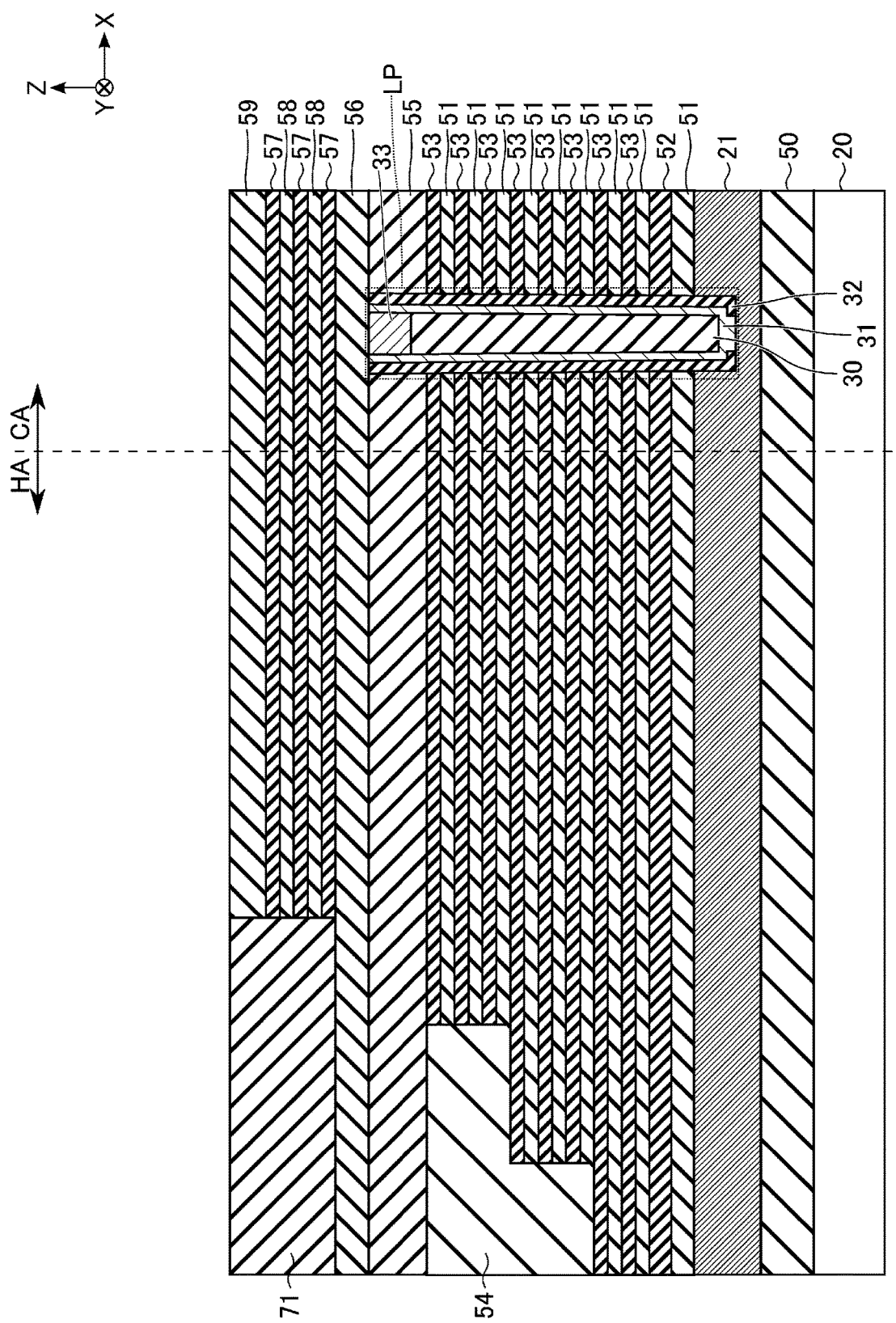
FIG. 32 is a cross-sectional view of the memory cell array illustrating a manufacturing step of the semiconductor storage device according to the second embodiment.

FIG. 31 is a cross-sectional view illustrating a hookup region of a memory cell array of the semiconductor storage device according to the second embodiment and corresponds to FIG. 30 of the second modification example of the first embodiment.

As illustrated in FIG. 31, a contact CC2_SGD extends in the conductor layers 24 along the Z-axis, and a lower end thereof is located to be lower than the lower surface of the conductor layer 24 as the lowermost layer. Lower ends and upper ends of a slit SHE2_Y (and a slit SHE2_X (not illustrated)) and the contact CC2_SGD are located substantially at the same heights along the Z direction, respectively. That is, the length L from the lower ends of the slits SHE2_X and SHE2_Y to the upper ends thereof substantially matches the length L from the lower end of the contact CC2_SGD to the upper end thereof.

2.2 Method of Manufacturing Semiconductor Storage Device

Hereinafter, an example of a series of manufacturing steps of the semiconductor storage device according to the second embodiment from the formation of a stacked structure corresponding to the word lines WL to a step of the formation of the contact CC_SGD corresponding to the select gate lines SGD will be described. Each of FIGS. 32 to 43 illustrates an example of a cross-sectional structure that includes a structure corresponding to the memory cell array in a manufacturing step of the semiconductor storage device according to the second embodiment.

First, in the same steps as those described above with reference to FIGS. 9 to 12 in the first embodiment, the insulator layer 50 and the conductor layer 21 are sequentially stacked on the semiconductor substrate 20. The insulator layer 51 and the sacrificial material 52 are stacked on the conductor layer 21, and the insulator layer 51 and the sacrificial material 53 are alternately stacked on the sacrificial material 52 multiple times. After forming a staircase structure in the hookup region HA of the stacked structure, the lower pillar LP is formed in the cell region. Next, the insulator layer 56 is formed on the stacked structure. Further, the sacrificial materials 57 corresponding to the select gate lines SGD and the insulator layers 58 are alternately stacked. The insulator layer 59 is formed on the sacrificial material 57 as the uppermost layer.

Figure 33:
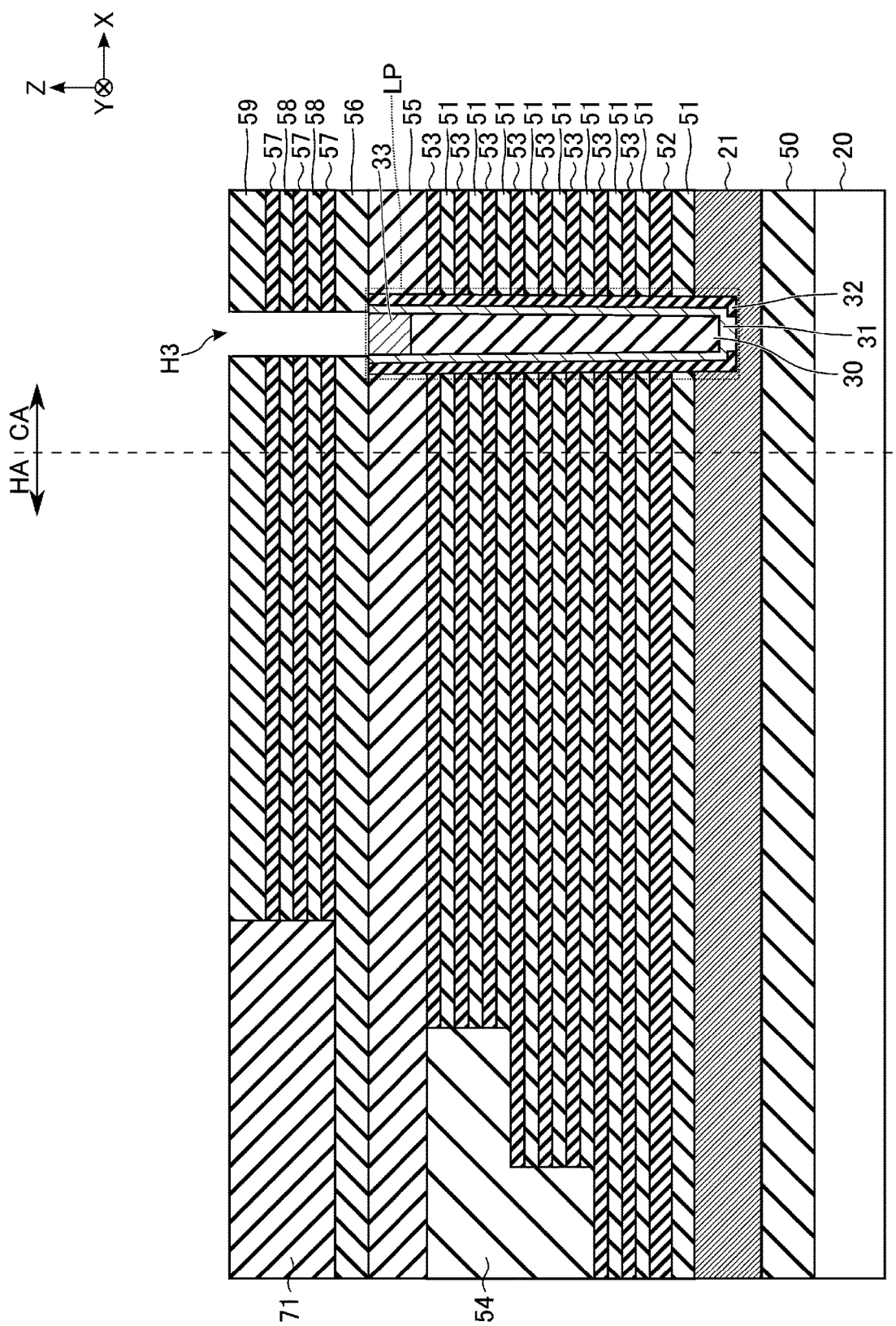
FIG. 33 is a cross-sectional view of the memory cell array illustrating a manufacturing step of the semiconductor storage device according to the second embodiment.
Figure 34:
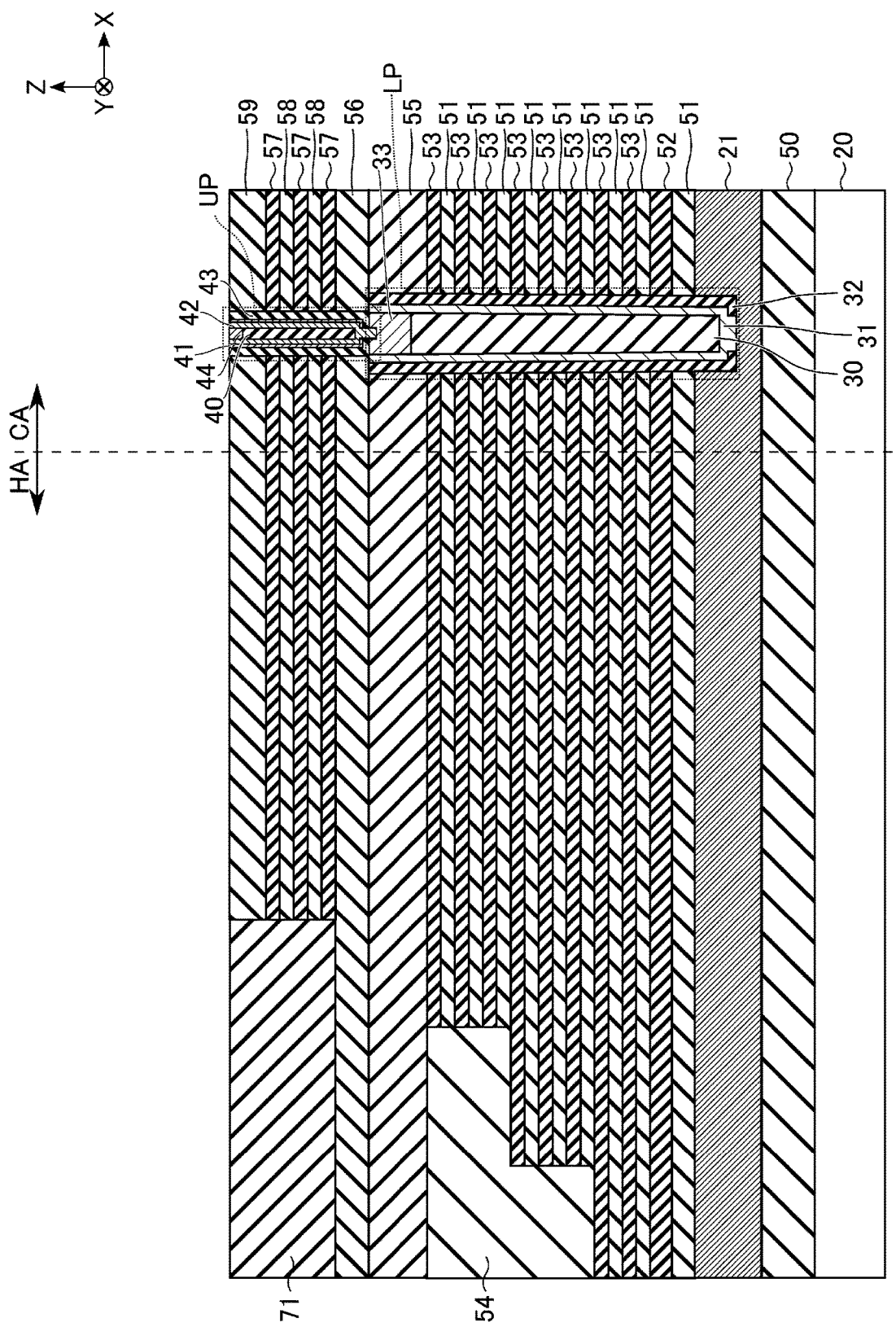
FIG. 34 is a cross-sectional view of the memory cell array illustrating a manufacturing step of the semiconductor storage device according to the second embodiment.

Next, as illustrated in FIGS. 33 and 34, the SGD hole H3 corresponding to the upper pillar UP is formed, and the stacked structure corresponding to the upper pillar UP is formed in the SGD hole H3.

Figure 35:
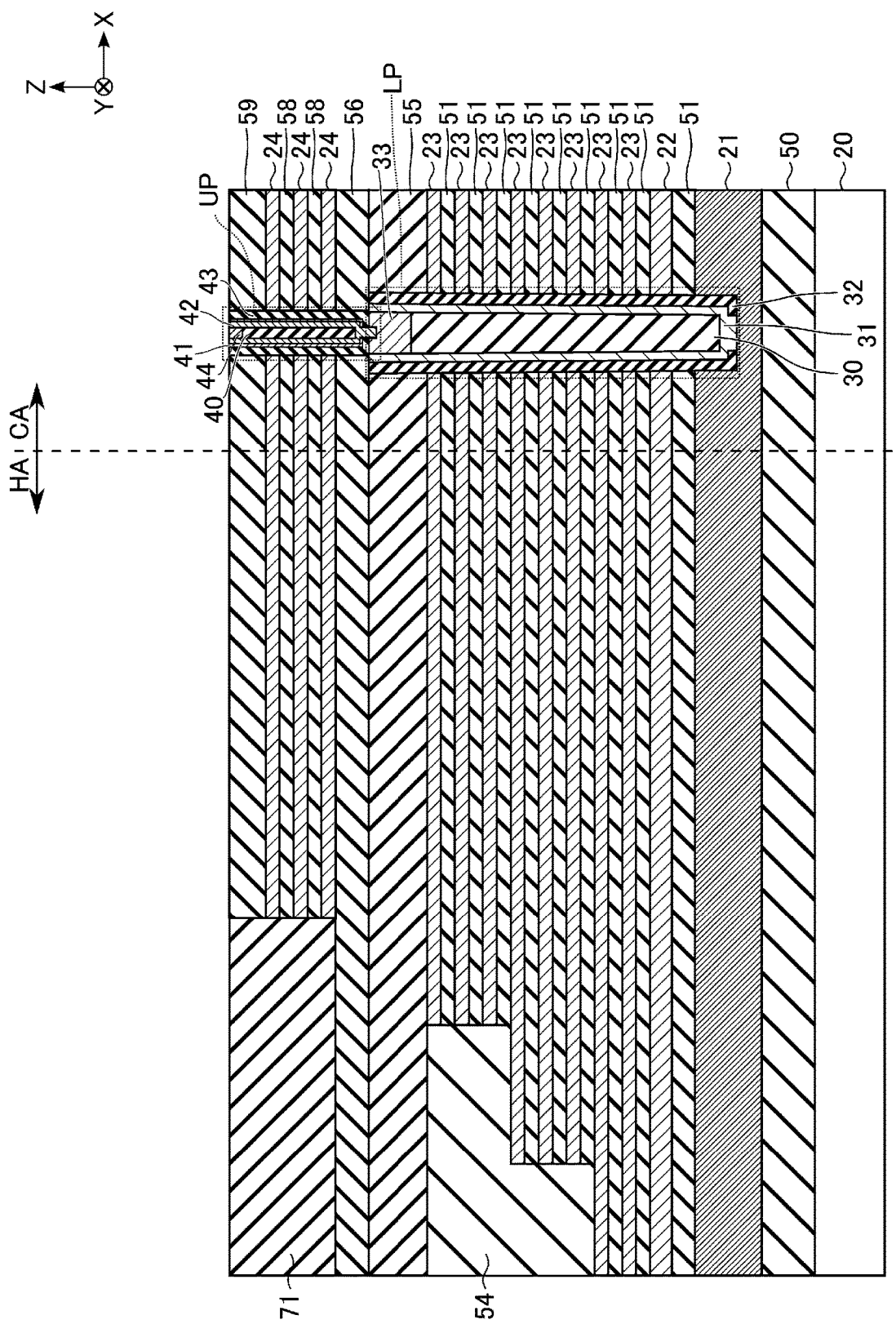
FIG. 35 is a cross-sectional view of the memory cell array illustrating a manufacturing step of the semiconductor storage device according to the second embodiment.

Next, a hole (not illustrated) corresponding to the slit SLT is formed. Next, as illustrated in FIG. 35, the sacrificial materials 52, 53, and 56 are replaced with the conductor layers 22 to 24 via the hole, respectively. The above-described hole used in the replacement step is filled with an insulator layer (not illustrated), and the slit SLT is formed.

Figure 36:
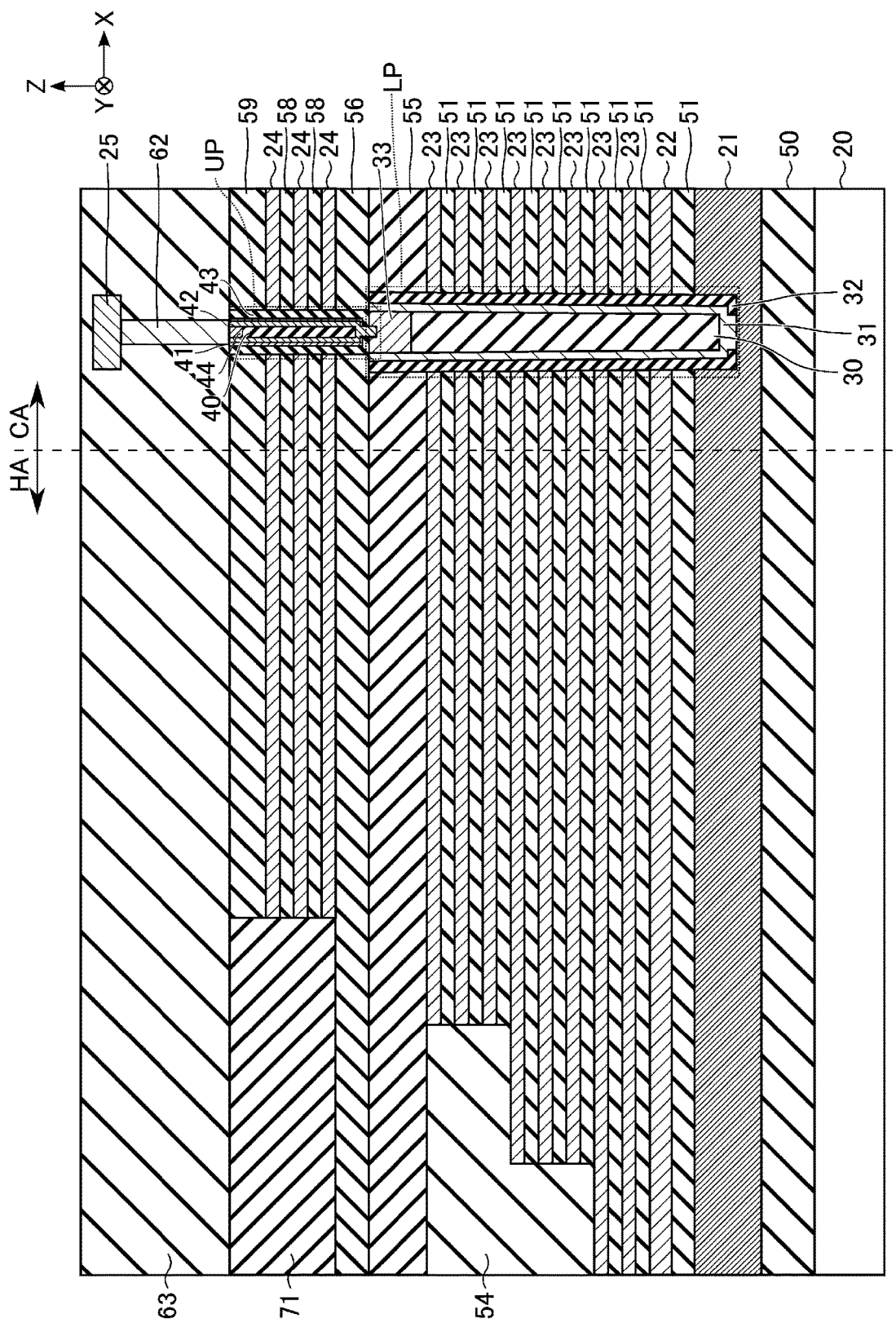
FIG. 36 is a cross-sectional view of the memory cell array illustrating a manufacturing step of the semiconductor storage device according to the second embodiment.

Next, as illustrated in FIG. 36, the conductor layer 62 is formed on an upper surface of the semiconductor portion 44 of the memory pillar MP. While forming the conductor layer 25 on an upper surface of the conductor layer 62, the insulator layer 63 is formed to bury the conductor layer 62 and the conductor layer 25 over the surface.

Figure 37:
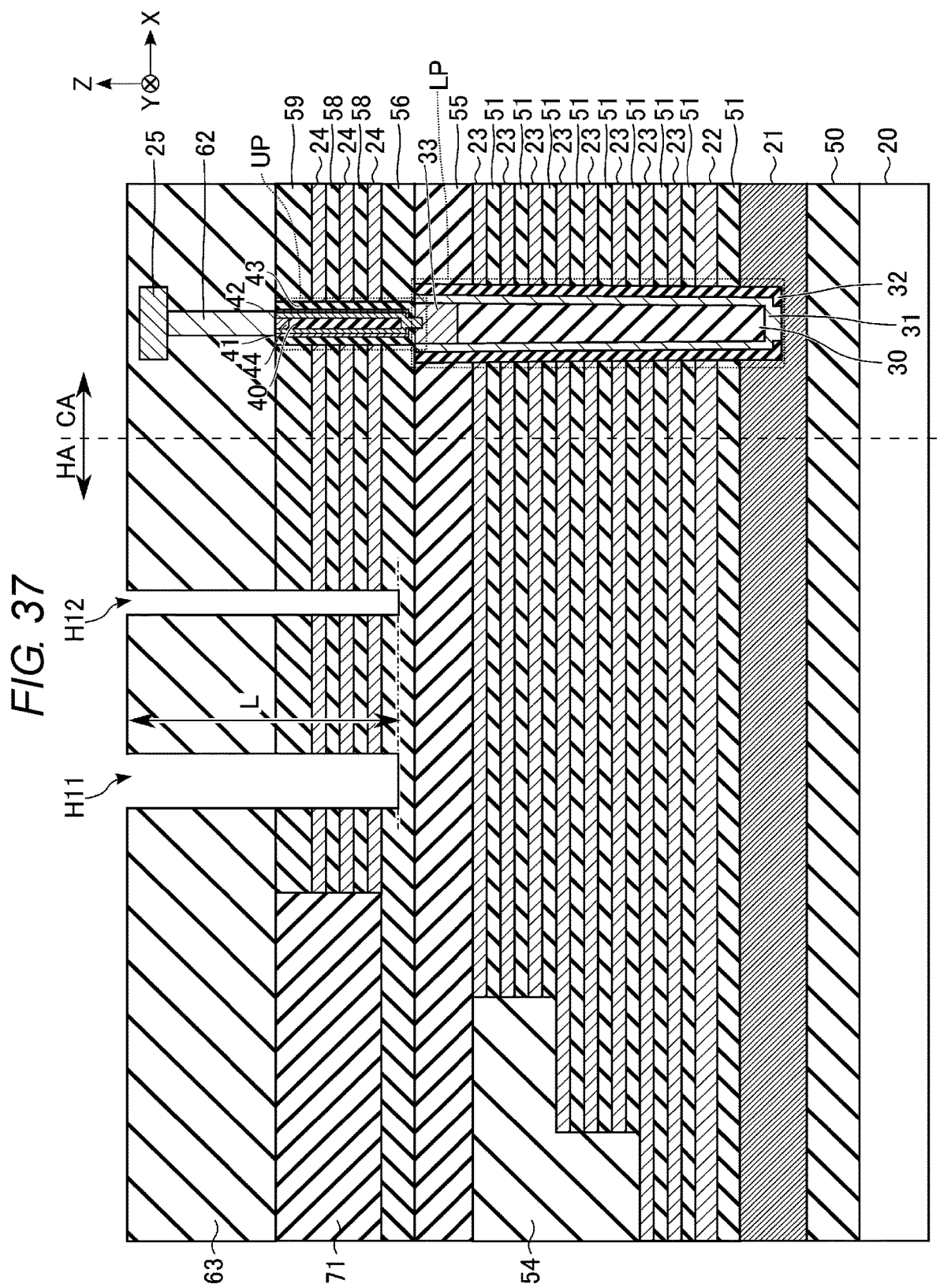
FIG. 37 is a cross-sectional view of the memory cell array illustrating a manufacturing step of the semiconductor storage device according to the second embodiment.

Next, as illustrated in FIG. 37, a hole H11 corresponding to the slits SHE2_X and SHE2_Y and a hole H12 corresponding to the contact CC2_SGD are formed. FIG. 37 illustrates a portion of the hole H11 corresponding to the slit SHE2_Y. Specifically, first, a mask in which a region corresponding to the slits SHE2_X and SHE2_Y and the contact CC2_SGD is open is formed by lithography. Next, the holes H11 and H12 are formed by anisotropic etching (for example, RIE) using the formed mask.

The holes H11 and H12 formed in this step divide the insulator layers 63, 59, and 58 and the conductor layers 24 and reach the insulator layer 56 (e.g. extend into the insulator layer 56). The depths of the holes H11 and H12 are substantially equal to each other and substantially match the length L in FIG. 31.

Figure 38:
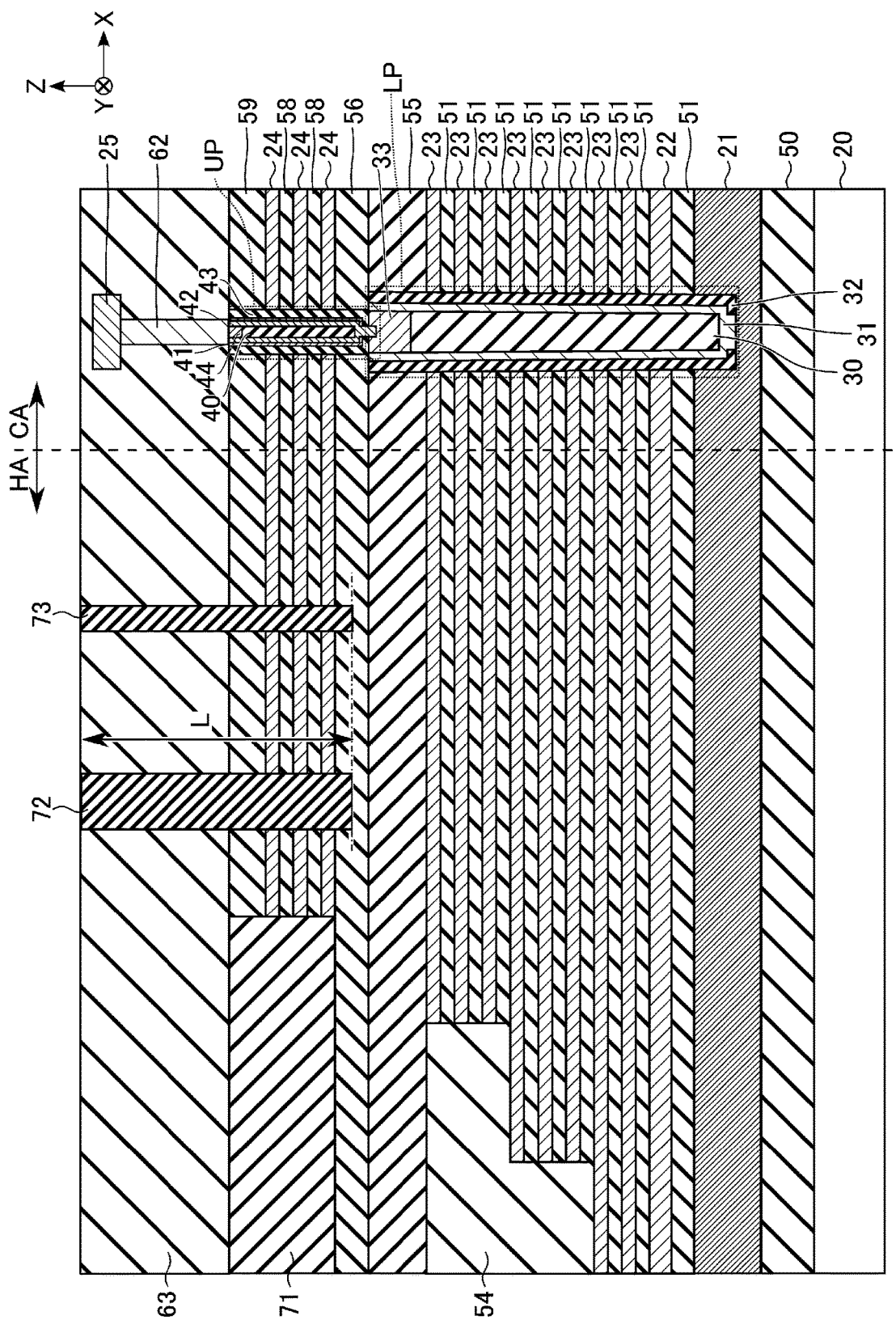
FIG. 38 is a cross-sectional view of the memory cell array illustrating a manufacturing step of the semiconductor storage device according to the second embodiment.

Next, as illustrated in FIG. 38, insulator layers 72 and 73 are formed to fill the inside of the holes H11 and H12. Next, the insulator layers 72 and 73 that are higher than the insulator layer 63 are removed. The insulator layers 72 and 73 include, for example, silicon nitride.

Figure 39:
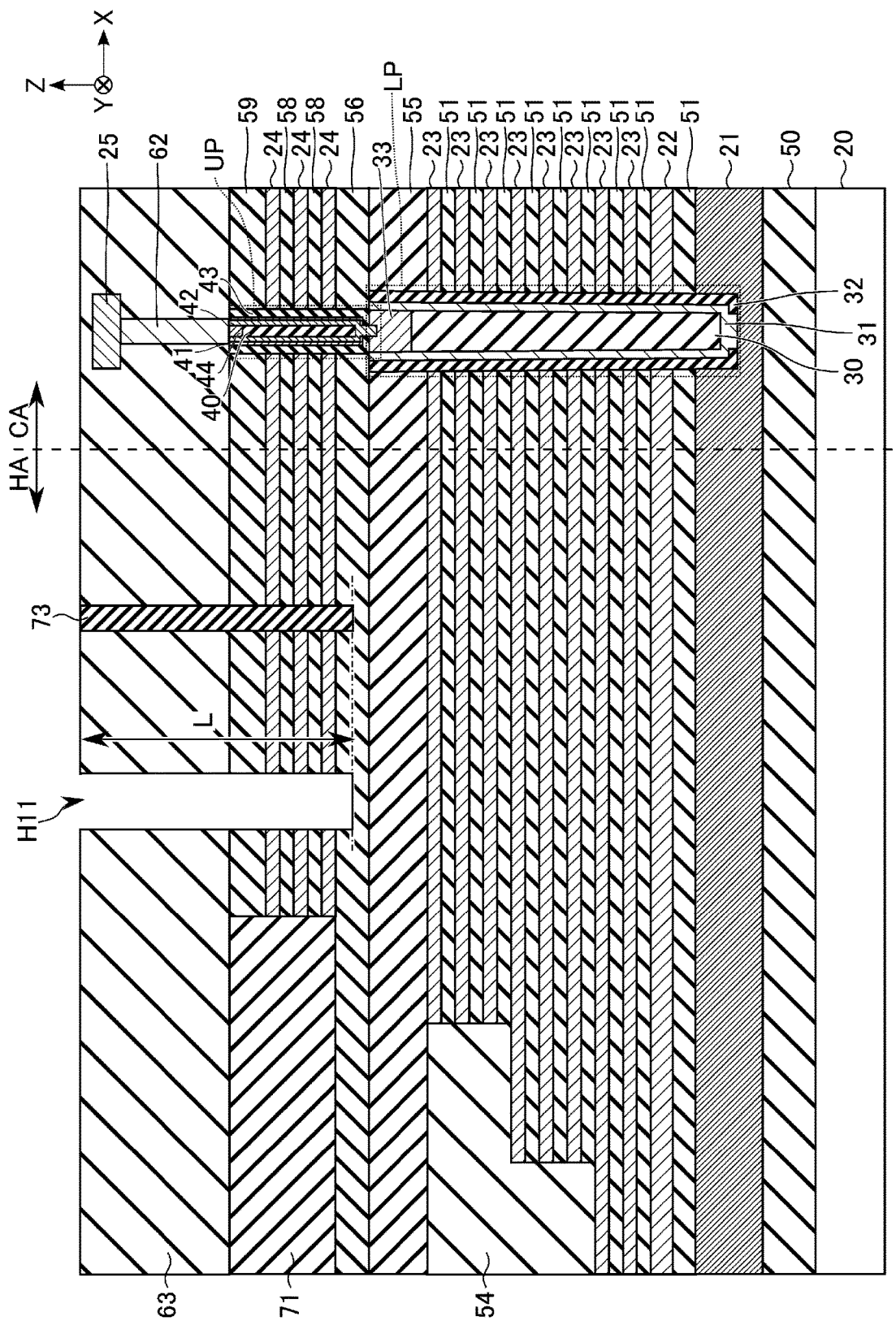
FIG. 39 is a cross-sectional view of the memory cell array illustrating a manufacturing step of the semiconductor storage device according to the second embodiment.

Next, as illustrated in FIG. 39, the insulator layer 72 is selectively removed, and the hole H11 is formed again. Specifically, for example, after forming a resist (not illustrated) on the insulator layer 73 to protect the insulator layer 73, the insulator layer 72 is removed by wet etching or the like for selectively removing silicon nitride.

Figure 40:
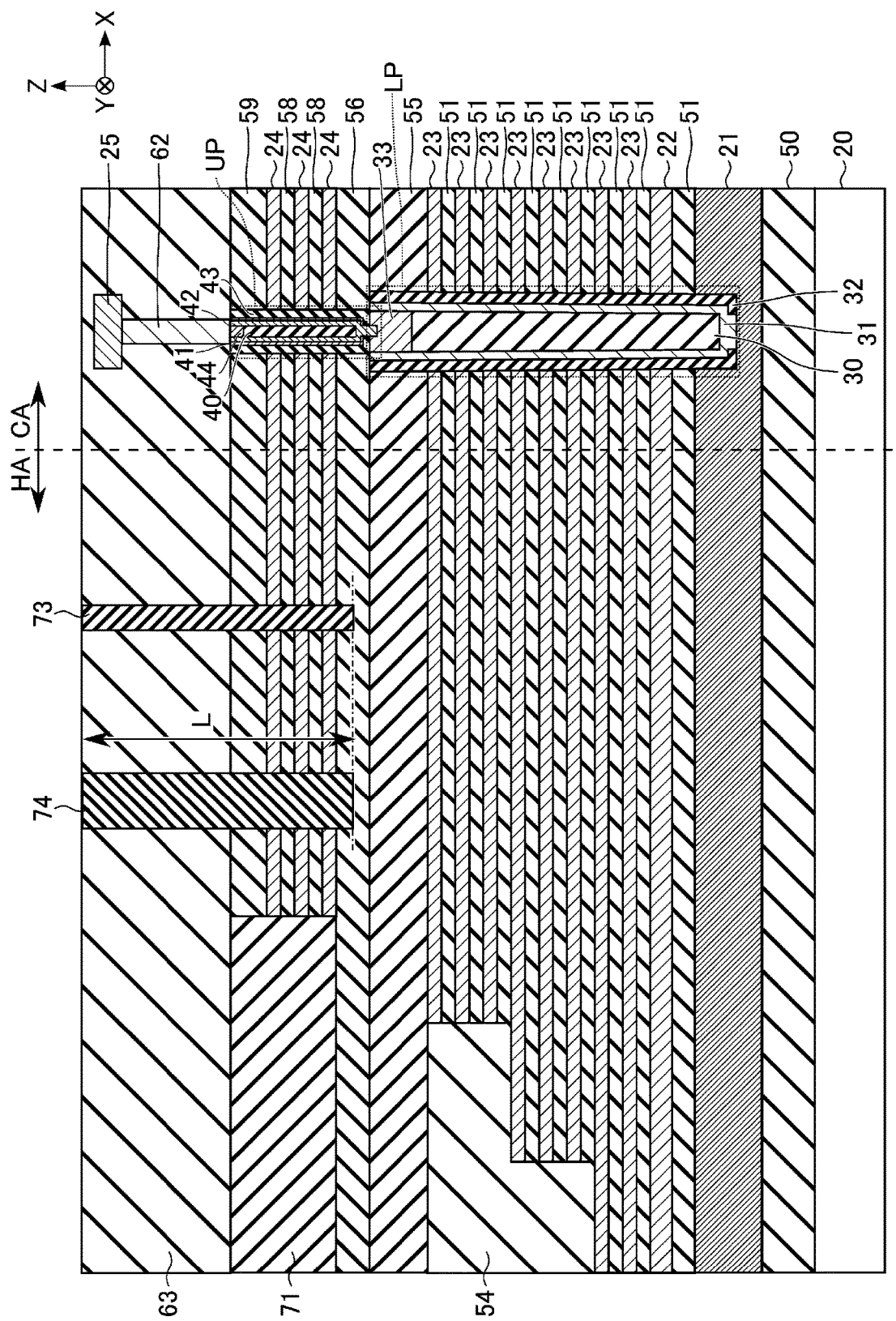
FIG. 40 is a cross-sectional view of the memory cell array illustrating a manufacturing step of the semiconductor storage device according to the second embodiment.

Next, as illustrated in FIG. 40, an insulator layer 74 is formed to fill the hole H11 again. Next, the insulator layer 74 that is higher than the insulator layer 63 is removed. The insulator layer 74 includes, for example, silicon oxide.

Figure 41:
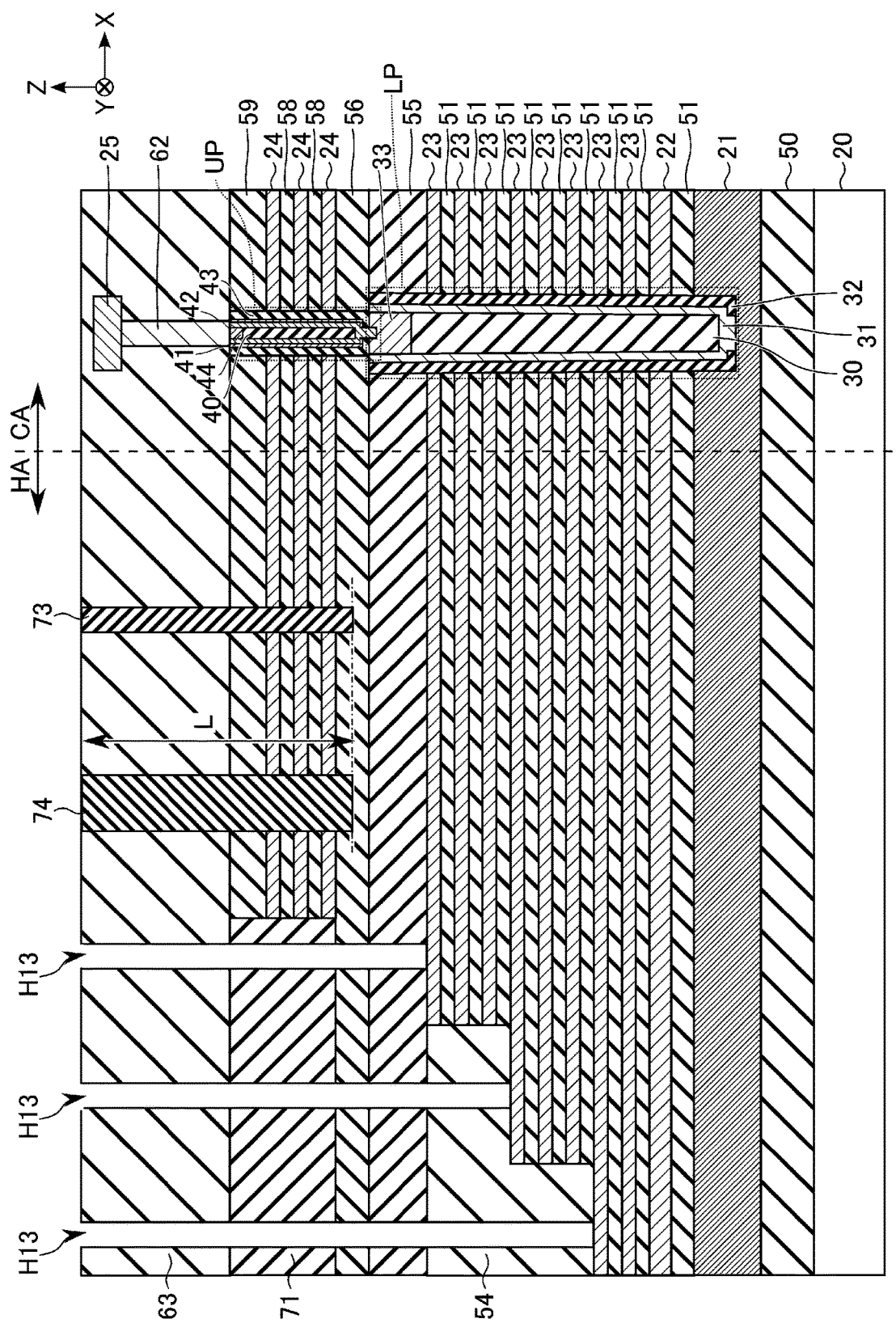
FIG. 41 is a cross-sectional view of the memory cell array illustrating a manufacturing step of the semiconductor storage device according to the second embodiment.

Next, as illustrated in FIG. 41, a plurality of holes H13 corresponding to the contacts CC_SGS and CC_WL0 to CC_WL7, respectively, are formed. Specifically, first, a mask in which a region corresponding to the holes H13 is open is formed by lithography. Next, the holes H13 are formed by anisotropic etching using the formed mask.

Figure 42:
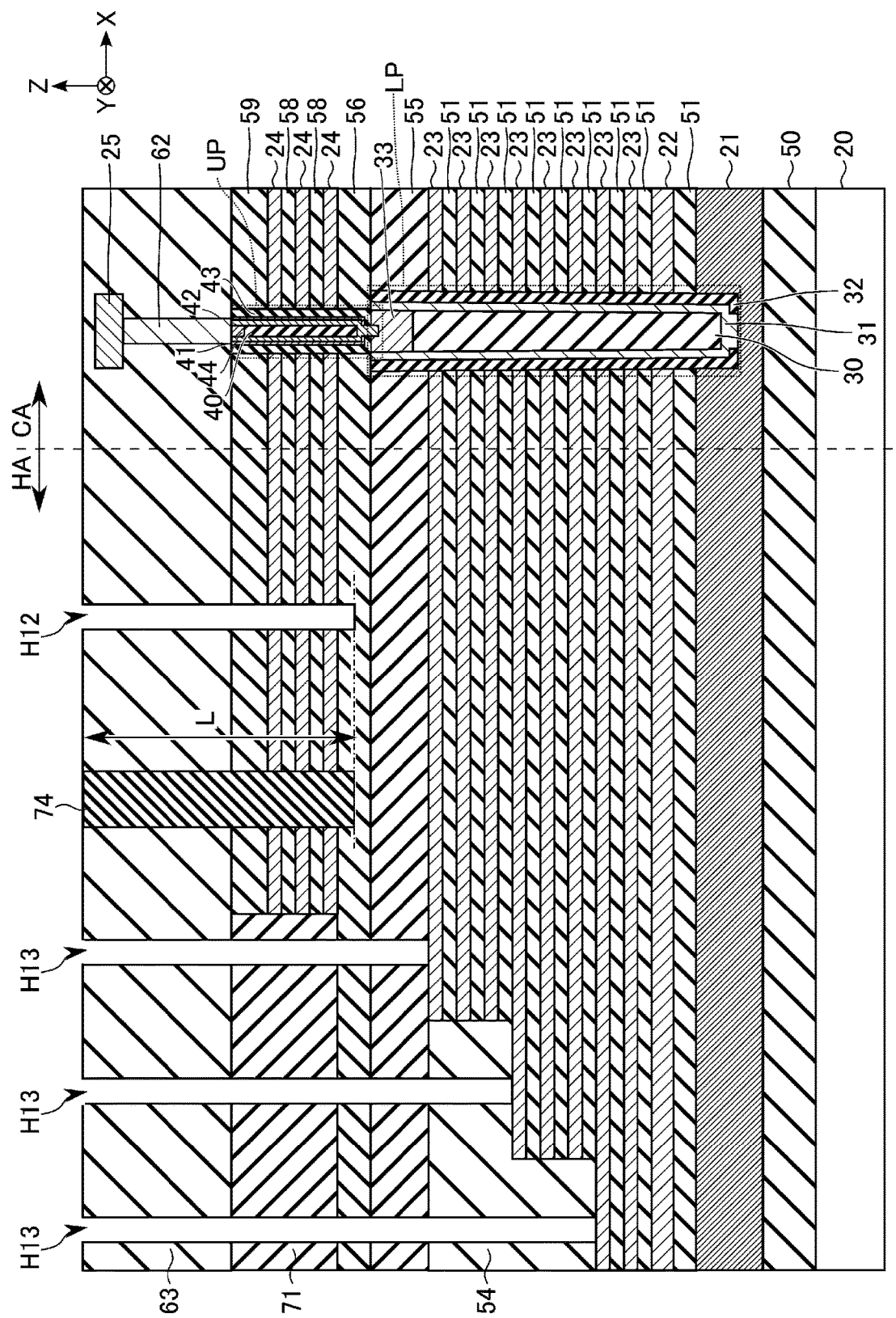
FIG. 42 is a cross-sectional view of the memory cell array illustrating a manufacturing step of the semiconductor storage device according to the second embodiment.

Next, as illustrated in FIG. 42, the insulator layer 73 is selectively removed by wet etching or the like for selectively removing silicon nitride, and the hole H12 is formed again.

Figure 43:
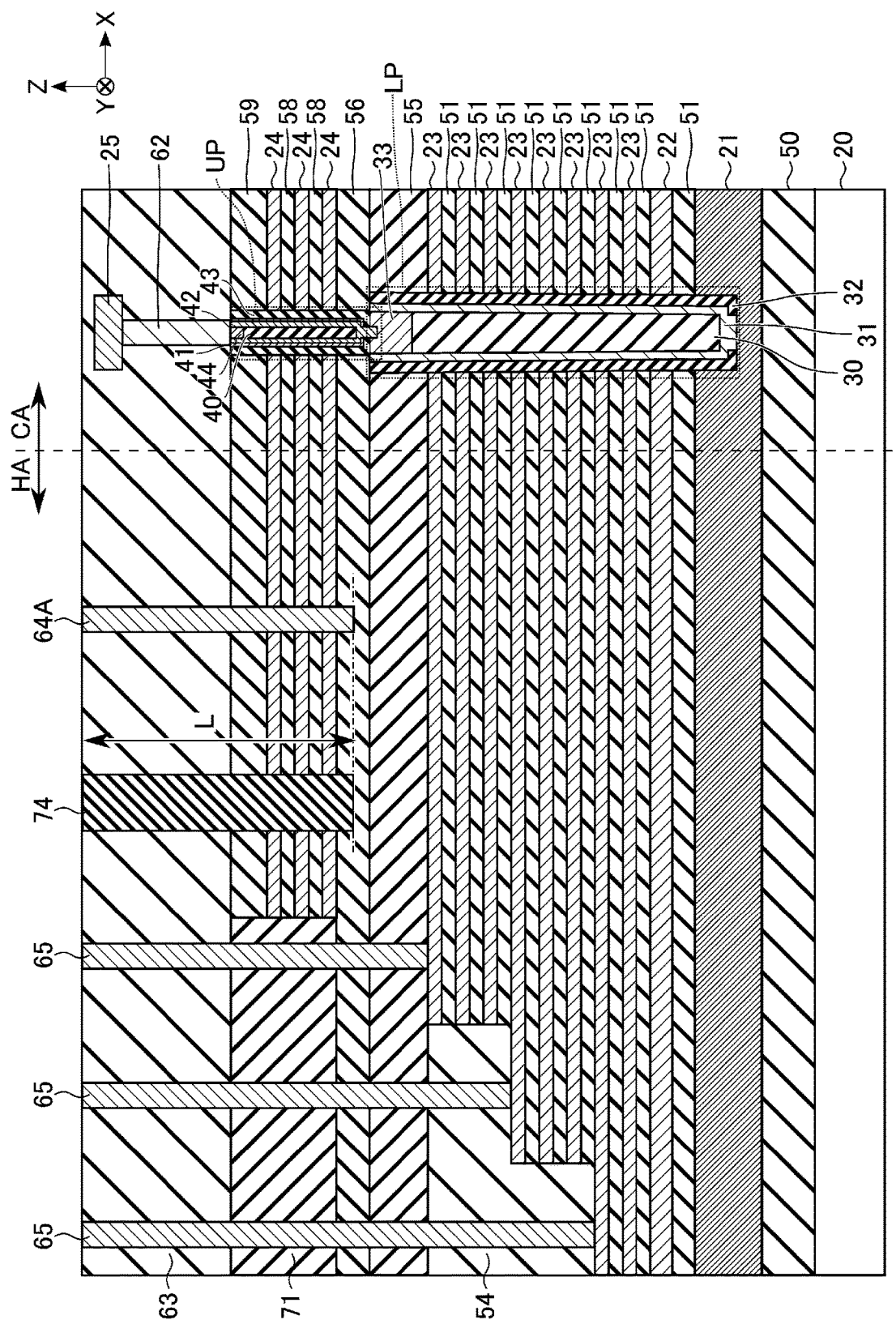
FIG. 43 is a cross-sectional view of the memory cell array illustrating a manufacturing step of the semiconductor storage device according to the second embodiment.

Next, as illustrated in FIG. 43, conductor layers 64A and 65 are formed to fill the inside of the holes H12 and H13. Next, the conductor layers 64A and 65 that remain to be higher than the insulator layer 63 are removed.

In the manufacturing steps of the semiconductor storage device according to the second embodiment described above, the slits SHE2_X and SHE2_Y and the contacts CC2_SGD0 to CC2_SGD3 of which the lower ends and the upper ends substantially match each other are formed. The manufacturing steps described above are merely exemplary. Another process may be inserted between the manufacturing steps, and the order of the manufacturing steps may be switched within a range where no problems arise.

2.3 Effect of Embodiment

According to the second embodiment, the contact CC2_SGD is in contact with the side surface of each of the conductor layers 24. As a result, it is not necessary to form a contact for each of the conductor layers 24. Accordingly, it is not necessary to form a terrace region for contacts for each of the conductor layers 24. Therefore, for the conductor layers 24, the staircase shape along the −X direction can be omitted, and the chip area can be reduced.

In addition, the hole H13 corresponding to the contact CC_WL is formed in the different step from that of the hole H12 corresponding to the contact CC2_SGD. As a result, a difference between the etching depths of holes formed in the same etching step can be reduced.

To supplement, when the holes H12 and H13 are formed in the same step, among the formed holes, the deepest hole is the hole H13 that reaches the conductor layer 22, and the shallowest hole is the hole H12 that reaches the conductor layer 24 as the uppermost layer. On the other hand, when the holes H12 and H13 are formed in different steps, among the formed holes, the deepest hole is the hole H13 that reaches the conductor layer 22 as the lowermost layer, whereas the shallowest hole is the hole H13 that reaches the conductor layer 23 as the uppermost layer. Therefore, a difference between the etching depths of the deepest hole and the shallowest hole can be reduced, the risk of over-etching the conductor layer 24 corresponding to the shallowest hole can be reduced, and the generation of an unintended leakage current can be prevented.

The hole H12 that is formed in a different step from that of the hole H13 is formed in the same step as that of the hole H11 corresponding to the slits SHE2_X and SHE2_Y. As a result, an increase in the number of manufacturing steps can be reduced. Accordingly, the upper ends and the lower ends of the contact CC2_SGD and the slits SHE2_X and SHE2_Y are located substantially at the same heights along the Z direction.

3. Other Modifications

The first embodiment and the second embodiment may be modified in various ways.

For example, in the description of the first embodiment and the second embodiment, the memory pillar MP is constituted by the upper pillar UP and the lower pillar LP, but the present disclosure is not limited thereto. For example, the memory pillar MP may have an integrally formed structure including: a semiconductor layer that extends in the conductor layers 22 to 24 along the Z-axis; and a charge storage layer that is arranged between the conductor layers 22 to 24 and the semiconductor layer.

In addition, in the description of the examples of the first embodiment and the second embodiment, the stacked film 43 includes the tunnel insulating film 45, the insulating film 46, and the block insulating film 47 such that the threshold voltage of the select transistor ST2 can be adjusted, but the present disclosure is not limited thereto. For example, the stacked film 43 may not include the tunnel insulating film 45 and the insulating film 46.

In addition, in the description of the examples of the first embodiment and the second embodiment, the semiconductor storage device 1 has the structure in which the circuit such as the sense amplifier module 16 is provided below the memory cell array 10, but the present disclosure is not limited thereto. For example, the semiconductor storage device 1 may have a structure in which the memory cell array and the sense amplifier module 16 are formed on the semiconductor substrate 20. In addition, the semiconductor storage device 1 may have a structure in which a chip where the sense amplifier module 16 and the like are provided and a chip where the memory cell array 10 is provided are bonded to each other.

In the description of the first embodiment and the second embodiment, the structure where the word lines WL and the select gate line SGS are adjacent to each other and the word lines WL and the select gate lines SGD are adjacent to each other is provided, but the present disclosure is not limited thereto. For example, a dummy word line may be provided between the word line WL as the uppermost layer and the select gate line SGD. Likewise, a dummy word line may be provided between the word line WL as the lowermost layer and the select gate line SGS. In addition, when a structure in which a plurality of pillars is linked is present, a conductor layer in the vicinity of the linked portion may be used as a dummy word line.

In the description of the examples of the first embodiment and the second embodiment, the semiconductor layer 31 and the conductor layer 21 are electrically connected to each other via a bottom portion of the memory pillar MP, but the present disclosure is not limited thereto. The semiconductor layer 31 and the conductor layer 21 may be electrically connected to each other via a side surface of the memory pillar MP. In this case, a part of the stacked film 32 formed on the side surface of the memory pillar MP is removed, and a structure in which the semiconductor layer 31 and the conductor layer 21 are in contact with each other via the portion is formed.

As used herein, the terms "approximately" and "substantially" are used to describe and account for small variations. When used in conjunction with an event or circumstance, the terms "approximately" and "substantially" can refer to instances in which the event or circumstance occurs precisely as well as instances in which the event or circumstance occurs to a close approximation. For example, when used in conjunction with a numerical value, the terms "approximately" and "substantially" can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

While certain embodiments have been described, these embodiments have been presented by way of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure. The different embodiments or features described herein, or portions thereof, may be combined. The accompanying claims and their equivalents are intended to cover such forms or modifications as would fall within the scope and spirit of the present disclosure.

What is claimed is:

1. A semiconductor memory device comprising:
   a plurality of first conductor layers that are stacked in a first direction;
   a first pillar including a first semiconductor layer and extending through the first conductor layers in the first direction;
   a first charge storage layer that is provided between the first conductor layers and the first semiconductor layer;
   a plurality of second conductor layers that are stacked in the first direction above an uppermost conductor layer of the first conductor layers;
   a second pillar including a second semiconductor layer and extending through the second conductor layers in the first direction, the second semiconductor layer electrically connected to the first semiconductor layer; and
   a conductor pillar or film extending in the first direction through the second conductor layers other than a lowermost layer of the second conductor layers and being in contact with a respective upper surface of each of the second conductor layers.

2. The semiconductor memory device according to claim 1, wherein
   an area of a first cross-section of the conductor pillar or film taken along a lower surface of an upper one of two of the one or more second conductor layers that are adjacent to each other in the first direction is different than an area of a second cross-section of the conductor pillar or film taken along a lower surface of a lower one of the two adjacent second conductor layers.

3. The semiconductor memory device according to claim 2, wherein
   a difference between a diameter of the first cross-section and a diameter of the second cross-section corresponds to a difference between respective lengths of the two adjacent second conductor layers in a second direction intersecting the first direction.

4. The semiconductor memory device according to claim 2, wherein
   an outer edge of the first cross-section has a substantially equal distance from an outer edge of the second cross-section when seen from the first direction along the outer edge of the first cross-section.

5. The semiconductor memory device according to claim 1, further comprising:
   a first insulator layer, wherein the first insulator layer includes:
      a first portion that extends in a second direction intersecting the first direction and divides the second conductor layers into a first region and a second region aligned along a third direction intersecting the first direction and the second direction, and
      a second portion that extends in the third direction and divides the first region into a third region and a fourth region aligned along the second direction.

6. The semiconductor memory device according to claim 5, wherein the conductor pillar or film is provided in the third region or the fourth region of the second conductor layers.

7. A semiconductor memory device comprising:
   a plurality of first conductor layers that are stacked in a first direction;
   a first semiconductor layer that extends through the first conductor layers in the first direction;
   a first charge storage layer that is provided between the first conductor layers and the first semiconductor layer;
   a plurality of second conductor layers that are stacked in the first direction above an uppermost conductor layer among the first conductor layers; and
   a first insulator layer, wherein the first insulator layer includes:
      a first portion that extends in a second direction intersecting the first direction and divides the second conductor layers into a first region and a second region arrayed along a third direction intersecting the first direction and the second direction, and
      a second portion that extends in the third direction and divides the first region into a third region and a fourth region arrayed along the second direction.

8. The semiconductor memory device according to claim 7, further comprising:
   a third conductor layer that is provided in the third region or the fourth region of the second conductor layers, extends in the first direction, and electrically connects the second conductor layers to each other.

9. The semiconductor memory device according to claim 8, wherein
   the third conductor layer extends in the first direction through one or more conductor layers of the second conductor layers other than a lowermost layer of the second conductor layers, and extends to an upper surface of the lowermost conductor layer of the second conductor layers.

10. The semiconductor memory device according to claim 9, wherein
    the third conductor layer is in contact with a respective upper surface of each of the one or more second conductor layers.

11. The semiconductor memory device according to claim 9, further comprising:
    a fourth conductor layer that extends from an upper end of the third conductor layer in the first direction and has a smaller diameter than the third conductor layer, wherein
    the upper end of the third conductor layer is disposed at a position higher than an upper surface of an uppermost conductor layer of the second conductor layers.

12. The semiconductor memory device according to claim 9, wherein
    the third conductor layer extends through the second conductor layers in the first direction,
    a lower end of the third conductor layer is located in a same layer as that of a lower end of the first insulator layer, and
    an upper end of the third conductor layer is located in a same layer as that of an upper end of the first insulator layer.

13. The semiconductor memory device according to claim 7, wherein
the first portion of the first insulator layer and the second portion of the first insulator layer are perpendicular to each other.

14. A semiconductor memory device comprising:
a plurality of first conductor layers that are stacked in a first direction;
a first pillar including a first semiconductor layer and extending through the first conductor layers in the first direction;
a first charge storage layer that is provided between the first conductor layers and the first semiconductor layer;
a plurality of second conductor layers that are stacked in the first direction above an uppermost layer among the first conductor layers;
a second pillar including a second semiconductor layer and extending through the second conductor layers in the first direction, the second semiconductor layer electrically connected to the first semiconductor layer;
a conductor pillar or film extending through the second conductor layers in the first direction, and being in contact with each of the second conductor layers;
a plurality of first insulator layers that divides the second conductor layers along a second direction intersecting the first direction,
a second insulator layer that divides the second conductor layers along a third direction intersecting the first direction and the second direction and is connected to the first insulator layers.

15. The semiconductor memory device according to claim 14, wherein
the first semiconductor layer further extends through the second conductor layers in the first direction, and
the first charge storage layer is further provided between the second conductor layers and the first semiconductor layer.

16. The semiconductor memory device according to claim 14, further comprising a stacked film that is provided between the second conductor layers and the second semiconductor layer.

17. The semiconductor memory device according to claim 16, wherein
the stacked film includes a second charge storage layer.

18. The semiconductor memory device according to claim 16, wherein a lower end of the second semiconductor layer comprises a protrusion portion.

19. The semiconductor memory device according to claim 18, wherein an upper end of the first semiconductor layer surrounds a semiconductor portion, and the protrusion portion protrudes into the semiconductor portion.

20. The semiconductor memory device according to claim 19, further comprising a source line, wherein protrusion portion is electrically connected to source line via the first semiconductor layer.

* * * * *